(12) United States Patent
Imai et al.

(10) Patent No.: US 8,039,403 B2
(45) Date of Patent: Oct. 18, 2011

(54) THIN FILM TRANSISTOR, METHOD OF MANUFACTURING SAME, DISPLAY DEVICE, METHOD OF MODIFYING AN OXIDE FILM, METHOD OF FORMING AN OXIDE FILM, SEMICONDUCTOR DEVICE, METHOD OF MANUFACTURING SEMICONDUCTOR DEVICE, AND APPARATUS FOR MANUFACTURING SEMICONDUCTOR DEVICE

(75) Inventors: Shigeki Imai, Nara (JP); Kazuhiko Inoguchi, Nara (JP); Hikaru Kobayashi, Kyoto (JP)

(73) Assignees: Sharp Kabushiki Kaisha, Osaka (JP); Hikaru Kobayashi, Kyoto (JP)

( * ) Notice: Subject to any disclaimer, the term of this patent is extended or adjusted under 35 U.S.C. 154(b) by 45 days.

(21) Appl. No.: 12/336,761

(22) Filed: Dec. 17, 2008

(65) Prior Publication Data

US 2009/0137131 A1    May 28, 2009

Related U.S. Application Data

(62) Division of application No. 10/589,390, filed as application No. PCT/JP2005/002352 on Feb. 16, 2005, now Pat. No. 7,595,230.

(30) Foreign Application Priority Data

Feb. 16, 2004  (JP) ................................ 2004-038888
Mar. 26, 2004  (JP) ................................ 2004-093695
Mar. 26, 2004  (JP) ................................ 2004-093703

(51) Int. Cl.
*H01L 21/31*    (2006.01)

(52) U.S. Cl. .... 438/770; 438/197; 438/773; 257/E21.09
(58) Field of Classification Search .................. 438/770, 438/773, 197
See application file for complete search history.

(56) References Cited

U.S. PATENT DOCUMENTS 3,765,970 A * 10/1973 Athanas et al. ............... 438/586
4,064,221 A * 12/1977 Rodrigo et al. ............... 423/393

(Continued)

FOREIGN PATENT DOCUMENTS

JP    52-78374    1/1977

(Continued)

OTHER PUBLICATIONS

JP 58-33873 A, published Feb. 28, 1983.

(Continued)

*Primary Examiner* — Alexander Ghyka
(74) *Attorney, Agent, or Firm* — Nixon & Vanderhye P.C.

(57) ABSTRACT

In a manufacturing method of a thin film transistor (1), the oxide film forming step is performed whereby: a process-target substrate (2) having a surface on which a gate oxide film (4) should be formed is immersed in an oxidizing solution containing an active oxidizing species; and a gate oxide film (4) is formed through direct oxidation of polycrystalline silicon (51) on the process-target substrate (2). With this step, a silicon dioxide film (42) is formed while growing a silicon dioxide film (41) on the process-target substrate 2. Accordingly, the interface between the polycrystalline silicon (51) and the gate oxide film (4) is kept clean. The gate oxide film (4) is uniformly formed with excellent quality in insulation tolerance and other properties. Therefore, the thin film transistor (1) contains a high quality oxide film with excellent insulation tolerance and other properties which can be formed at low temperature.

12 Claims, 26 Drawing Sheets

U.S. PATENT DOCUMENTS

| | | | |
|---|---|---|---|
| 4,502,204 | A | 3/1985 | Togashi et al. |
| 6,221,788 | B1 * | 4/2001 | Kobayashi et al. ........... 438/762 |
| 6,265,327 | B1 | 7/2001 | Kobayashi et al. |
| 6,468,663 | B1 | 10/2002 | Sato et al. |
| 6,896,927 | B2 | 5/2005 | Muraoka |
| 7,112,264 | B2 | 9/2006 | Tsuzuki et al. |
| 7,156,962 | B2 | 1/2007 | Koizumi et al. |
| 2003/0102793 | A1 | 6/2003 | Komoda et al. |
| 2003/0114018 | A1 | 6/2003 | Gutsche et al. |
| 2004/0011655 | A1 | 1/2004 | Tsuzuki et al. |
| 2004/0011665 | A1 | 1/2004 | Koizumi et al. |
| 2004/0053516 | A1 | 3/2004 | Nakada et al. |
| 2004/0224866 | A1 | 11/2004 | Matsunaga et al. |
| 2005/0036382 | A1 | 2/2005 | Kato |
| 2005/0136658 | A1 | 6/2005 | Yamaguchi |
| 2005/0215070 | A1 | 9/2005 | Kobayashi |
| 2007/0117284 | A1 | 5/2007 | Imai et al. |

FOREIGN PATENT DOCUMENTS

| | | |
|---|---|---|
| JP | 55-121653 A | 9/1980 |
| JP | 3-6826 A | 1/1991 |
| JP | 5-251432 A | 9/1993 |
| JP | 9-129886 A | 5/1997 |
| JP | 10-223629 A | 8/1998 |
| JP | 11-016900 | 1/1999 |
| JP | 2002-57154 A | 2/2002 |
| JP | 2002-64093 A | 2/2002 |
| WO | 03/100844 | 12/2003 |

OTHER PUBLICATIONS

Sakamoto et al, "Formation of Anodic Reaction Film on n-type Si", Applied Physics, vol. 44, Issue No. 5, 1975, pp. 497-506.

Tokuyama, "Comprehensive Treatise on Electronics Technology", vol. 3, MOS Device, Kogyochosakai, 1976, pp. 124-126.

Asusha et al, "Ultrathin Silicon Dioxide Layers with a Low Leakage Current Density Formed by Chemical Oxidation of Si", Applied Physics Letters, vol. 81, No. 18, Oct. 28, 2002, pp. 3410-3412.

Kobayashi et al, "Nitric Acid Oxidation of Si to Form Ultrathin Silicon Dioxide Layers with a Low Leakage Current Density", Journal of Applied Physics, vol. 94, No. 11, American Institute of Physics, 2003, pp. 7328-7335.

Asuha et al, "Low Temperature Formation of Sio2/Si Structure by Chemical Method and Spectroscopic Observation", Meeting Abstracts of the Physical Society of Japan, vol. 58, Issue 2, Part 4, Meeting Abstracts, 2003, pp. 771-.

International Search Report for PCT/JP2005/002352 dated Jun. 7, 2005 (English and Japanese).

* cited by examiner

THIN FILM TRANSISTOR, METHOD OF MANUFACTURING SAME, DISPLAY DEVICE, METHOD OF MODIFYING AN OXIDE FILM, METHOD OF FORMING AN OXIDE FILM, SEMICONDUCTOR DEVICE, METHOD OF MANUFACTURING SEMICONDUCTOR DEVICE, AND APPARATUS FOR MANUFACTURING SEMICONDUCTOR DEVICE

This application is a divisional of application Ser. No. 10/589,390 (U.S. Patent Application Publication No. US 2007-0117284 A1), filed Aug. 15, 2006 (allowed) now U.S. Pat. No. 7,595,230, which is a U.S. national phase of international application PCT/JP2005/002352, filed 16 Feb. 2005, which designated the U.S. and claims priority to JP 2004-093703, filed 26 Mar. 2004, JP 2004-093695, filed 26 Mar. 2004, and JP 2004-038888, filed 16 Feb. 2004, the entire contents of each of which are hereby incorporated by reference.

TECHNICAL FIELD

The present invention relates to a method of manufacturing a thin film transistor (TFT) which involves a suitable oxide film forming step for forming oxide film which needs to have particularly high quality and reliability, such as a gate oxide film (especially, silicon dioxide film). The invention also relates to its uses.

The invention relates further to a method of forming an oxide film, a method of manufacturing a semiconductor device, and an apparatus for manufacturing a semiconductor device. To describe it in more detail, the invention relates to a method of forming a semiconductor oxide film, a method of manufacturing a semiconductor device, and an apparatus for manufacturing a semiconductor device which are suitable for forming, for example, a thin insulating film (silicon dioxide film) on a semiconductor surface, in particular, on a silicon substrate surface, at low temperature.

BACKGROUND ART

A gate oxide film, or gate insulating film, is an important, thin insulating film which is part of a TFT. In TFTs, relatively high voltage is generally applied to the gate electrode, which requires the gate oxide film to be completely insulating. The gate oxide film is formed up to a thickness sufficient for this requirement (about a few tens to 100 nm) so that no leak current occurs. If an increase in leak current density is allowed, that will cause additional power consumption in the device, rise in operating temperature, instability, and other numerous problems. Furthermore, if the leak current has increased roughly equal to the drain current, the device is put at risk of being inoperable.

The gate oxide film makes direct impacts, in this manner, on the performance (reliability and characteristics) of various devices containing the TFT. High quality and high reliability is particularly needed with the gate oxide film.

The gate oxide film (for example, silicon dioxide film) in the TFT is typically formed by CVD (chemical vapor deposition). In CVD, an organic silane, for example, tetra-ethoxy-silane (TEOS), is thermally decomposed at a few hundred degrees Celsius so that it deposits on a substrate to form an oxide film (gate oxide film).

There are other known methods, including sputter vapor deposition whereby the oxide is formed by sputter vapor deposition and plasma oxidation whereby the substrate surface is oxidized in plasma.

Another method is anodization whereby the substrate surface is oxidized, forming oxide film thereon, by anodization. Well-known specific examples are found in Japanese Unexamined Patent Publication 3-6826/1991 (Tokukaihei 3-6826; published on Jan. 14, 1991); Japanese Unexamined Patent Publication 52-78374/1977 (Tokukaisho 52-78374; published on Jul. 1, 1977); Japanese Unexamined Patent Publication 2003-133309 (Tokukai 2003-133309; published on May 9, 2003); Applied Physics, vol. 44, issue 5, p.p. 497 to 506, 1975; and Encyclopedia of Electronics Technology, MOS device (1$^{st}$ print in 1973), p.p. 124 to 125, Takashi TOKUYAMA. According to the method, voltage is applied to a silicon substrate in an aqueous solution of hydrofluoric acid (electrolyte) to form a porous anode-reaction silicon film. The porous anode-reaction film is subjected to anodization in an electrolyte in which silicon is anodized, for example, thick phosphoric acid.

In anodization, the voltage application moves silicon ions to the surface of the silicon substrate so that they form a silicon dioxide film on the surface. After the formation of the silicon dioxide film, to promote oxidation reaction at the interface between the formed silicon dioxide film and the electrolysis solution (surface of the silicon dioxide film), silicon ions are generated from the silicon substrate. Typically, a voltage as high as 100 V or more needs to be applied so that the silicon ions can pass through the silicon dioxide film to reach the interface between the silicon dioxide film and the electrolysis solution (surface of the silicon dioxide film). See Encyclopedia of Electronics Technology, MOS device (1$^{st}$ print in 1973), p.p. 124 to 125, Takashi TOKUYAMA.

These are all electrical methods based on voltage application. In contrast, the inventor has suggested chemical methods of forming an oxide film in various literatures including: Japanese Unexamined Patent Publication 2004-47935 (Tokukai 2004-47935; published on Feb. 12, 2004); Japanese Unexamined Patent Publication 9-45679/1997 (Tokukaihei 9-45679; published on Feb. 14, 1997); Japanese Unexamined Patent Publication 2002-57154 (Tokukai 2002-57154; published on Feb. 22, 2002); Japanese Unexamined Patent Publication 2002-64093 (Tokukai 2002-64093; published on Feb. 28, 2002); J. Applied Physics Letters, 81, 18, p.p. 3410-3412 (2002); and J. Applied Physics Letters, 94, 11, p.p. 7328-7335 (2003). For example, in Tokukai 2004-47935, the inventor suggests to form an oxide film as thin as about 1 nm on a surface of a silicon or other semiconductor substrate using thick nitric acid or a similar highly oxidizing chemical solution.

To manufacture a flexible liquid crystal display, the thickness of TFTs and the device containing them needs to be cut down. The gate oxide film too needs to be thin for the same reasons, whilst maintaining insulation, through the formation of uniform film of high quality.

Also to manufacture a flexible liquid crystal display, the TFTs need to be formed on an organic substrate such as PET (polyethylene terephthalate). To this end, the TFTs must be fabricated at 200° C. or lower temperatures.

The high temperature oxidation methods and CVD described above however require conditions of at least 800° C. and 400° C. respectively to fabricate the gate oxide film. The methods are not suitable for TFT fabrication in the manufacture of the flexible liquid crystal display. In the high temperature thermal oxidation methods, the dopant diffuses due to heating at high temperatures, wiping out junctions close to the surface.

In CVD, an oxide film is deposited on the substrate. A uniform gate oxide film cannot be formed on a substrate with an irregular or curved surface. Furthermore, the obtained film is of inferior quality to the oxide film fabricated by direct oxidation, for example, in a thermal oxidizing solution. Therefore, CVD does not produce a highly reliable, completely insulating gate oxide film. The gate oxide film needs to be formed up to a sufficient thickness to prevent insulation breakdown as described above. This requirement arises from the non-uniformity of the gate oxide film.

CVD has other disadvantages too. The method uses dangerous $SiH_4$, which ignites when released into the air. Many other gases used in the method need careful handling. CVD therefore requires large-scale facilities from gas introduction to venting. Hence, there is demand for a simple method to fabricate a high quality gate oxide film.

Therefore, if a high quality gate oxide film is formed uniformly, the gate oxide film can be further thinned down.

In conventional anodization, high voltage (typically, 100 V or higher) is needed to move silicon ions in the silicon substrate from the silicon substrate to the gate oxide film (silicon dioxide film). Specifically, in anodization, the silicon dioxide film (oxide film) on the surface of the silicon substrate in electrolyte grows when silicon ions ($Si^+$) in the silicon substrate from the interface between the silicon substrate and the silicon dioxide film through the silicon dioxide film to the surface of the silicon dioxide film (interface between the silicon dioxide film and the electrolyte) and oxidized on the surface of the silicon dioxide film. As the silicon dioxide film forms and grows thicker, an increasingly large voltage needs to be applied across the silicon substrate. Nevertheless, excess voltage will cause insulation breakdown. It is therefore difficult to form a relatively thick, high quality silicon dioxide film.

In addition, in anodization, ions in the electrolysis solution contaminate the oxide film. It is rather difficult to obtain a high quality oxide film. For example, electrical properties are not sufficiently stable. Therefore, to ensure that the oxide film formed by anodization provides target quality, the oxide film needs to be thick, which means that anodization is also short of producing a high quality oxide film. If the oxide film has such a shape that the stress arising from volume expansion of the oxide film acts on the Si substrate, the stress retards the growth of the oxide film in some cases. Where the stress is concentrated, the oxide film in those parts is thinner than in other parts. The phenomenon leads to failure to form a uniform oxide film, degrades film quality, and allows leak current to occur.

TFTs in driver LSIs and related switching elements for the liquid crystal display are based on CG silicon (continuous grain silicon). CG silicon is fabricated by thermal annealing in which crystals collide to form angular projections. Therefore, the surface of CG silicon has a complex, irregular geometry. Technology is being demanded which is able to form uniform oxide film on such a complex surface.

Manufacture processes at low temperatures generally lead to poor reliability. For example, if TEOS oxidation (CVD), a popular approach in oxide film fabrication, is carried out at low temperature, film quality falls drastically, causing leak current. In short, low temperature leads to poor oxide film quality. Also, as mentioned above, it is difficult to form a uniform oxide film on a complex surface.

These examples demonstrate that the prevention of the deterioration of oxide film performance and reliability in low temperature manufacturing processes is the biggest issue in the development of flexible liquid crystal displays and like apparatus.

Meanwhile, improving insulating film performance is important in semiconductor devices, particularly in semiconductor integrated circuits based on MOS transistors, in which circuit elements are progressively scaled down for a higher degree of integration and higher density.

In these semiconductor integrated circuits, the gate insulating films in MOS transistors are usually fabricated with a "high temperature thermal oxidation method"; which involves heating at or above 800° C. in dry oxygen, water vapor, or another oxidizing gas.

Well known methods for oxide film fabrication other than the high temperature thermal oxidation method include chemical vapor deposition (CVD), sputter vapor deposition, and plasma oxidation. In CVD, an organic silane, for example, tetra-ethoxy-silane (TEOS), is thermally decomposed at a few hundred degrees Celsius so that it deposits on a substrate to form an oxide film. In sputter vapor deposition, an oxide is formed by sputter vapor deposition. In plasma oxidation, the substrate surface is oxidized in plasma.

Tokukaihei 3-6826 discloses examples of anodization with which the substrate surface is oxidized to form an oxide film. Voltage is applied to a silicon substrate in an aqueous solution of hydrofluoric acid (electrolyte) to form a porous anode-reaction silicon film. The porous anode-reaction film is then subjected to anodization in an electrolyte in which silicon is anodized, for example, thick phosphoric acid.

In contrast, the inventor has suggested the formation of a thin oxide film on the surface of a silicon or other semiconductor substrate using an oxidizing chemical solution, such as thick nitric acid in Tokukai 2002-64093.

Ultrathin oxide films on the order of nanometers (nm) or even less is indeed fabricable after removing a natural oxide film from the silicon surface. It is however rather difficult to control the quality of the film so that it can be used as an insulating film in a semiconductor device, especially, to obtain one with low leak current density. To ensure voltage tolerance, the gate insulating film (oxide film) in the thin film transistor (TFT) and other applications needs to be relatively thick: a few nanometers (nm) or even thicker.

To form thin film transistors (TFTs) on a flexible substrate, for example, a polyethylene terephthalate (PET) substrate, for liquid crystal displays and other applications, the substrate needs to be kept not above 200° C. A low temperature manufacturing method is hence needed which still endows an insulating film with such high quality that it can be applied to TFT gate insulating films and like semiconductor devices.

DISCLOSURE OF INVENTION

The present invention is conceived in view of these problems and has a primary objective to provide a method of manufacturing a thin film transistor including a high quality gate insulating film with excellent insulation tolerance and other properties and to provide a method of utilizing the transistor. It is also an objective of the present invention to provide a method of manufacturing a thin film transistor at low temperature whereby an oxide film can be formed on a PET or like organic substrate and to provide a method of utilizing the transistor.

The present invention has another objective to provide a method of forming, on a semiconductor surface at low temperature, an oxide film of high quality (e.g., low leak current density) with controlled thickness which can be used as a gate insulating film in thin film transistors (TFTs) on the PET or like substrate or in MOS transistors or a large scale integrated circuit (LSI) containing MOS transistors, and also to provide a method of manufacturing a semiconductor device including the oxide film and an apparatus for manufacturing the semiconductor device.

A method of manufacturing a thin film transistor in accordance with the present invention ("the present manufacturing method") is characterized in that it is a method of manufacturing a thin film transistor including an oxide film, the method including the oxide film forming step of immersing a substrate in an oxidizing solution containing an active oxidizing species for direct oxidation of the substrate to form a chemical oxide film, the substrate having a surface on which a chemical oxide film is to be formed.

In the present manufacturing method, the oxide film forming step is characterized in that the active oxidizing species is formed by heating the oxidizing solution or electrolyzing the oxidizing solution.

The present manufacturing method is characterized in that in the oxide film forming step, the substrate is immersed in the oxidizing solution of different concentrations, and the concentration of the oxidizing solution is altered from a low-concentration oxidizing solution to a high-concentration oxidizing solution.

The present manufacturing method is characterized in that: the low-concentration oxidizing solution has a lower concentration than an azeotropic concentration; and the high-concentration oxidizing solution has the azeotropic concentration.

The present manufacturing method is characterized in that in the oxide film forming step, the low-concentration oxidizing solution is concentrated to prepare the high-concentration oxidizing solution.

The present manufacturing method is characterized in that in the oxide film forming step, the low-concentration oxidizing solution is heated to prepare the high-concentration oxidizing solution.

The present manufacturing method is characterized in that in the oxide film forming step, the oxide film is grown on the substrate surface by applying voltage to the substrate on which the oxide film is to be formed.

The present manufacturing method is characterized in that the substrate on which the oxide film is to be formed contains, on the surface, at least one component selected from the group consisting of monocrystal silicon, polycrystalline silicon, amorphous silicon, continuous grain silicon, silicon carbide, and silicon germanium.

The present manufacturing method is characterized in that the oxidizing solution contains: at least one solution selected from the group consisting of nitric acid, perchloric acid, sulfuric acid, ozone-dissolving water, aqueous hydrogen peroxide, a mixed solution of hydrochloric acid and aqueous hydrogen peroxide, a mixed solution of sulfuric acid and aqueous hydrogen peroxide, a mixed solution of aqueous ammonia and aqueous hydrogen peroxide, a mixed solution of sulfuric acid and nitric acid, aqua regia, and boiling water; a gas thereof; or a mixed solution thereof.

The present manufacturing method is characterized in that the oxidizing solution is an azeotropic mixture.

The present manufacturing method is characterized in that the oxidizing solution contains at least one solution selected from the group consisting of azeotropic nitric acid which is an azeotropic mixture with water (azeotropic concentration: 68%), azeotropic sulfuric acid which is an azeotropic mixture with water, and azeotropic perchloric acid which is an azeotropic mixture with water (azeotropic concentration: 71%).

The present manufacturing method is characterized in that the oxide film forming step is carried out at 200° C. or lower temperatures.

The present manufacturing method is characterized in that the method further includes after forming the chemical oxide film, the step of forming an insulating film on the chemical oxide film.

The present manufacturing method is characterized in that the oxide film forming step comprises the steps of: immersing the substrate in an oxidizing solution below azeotropic concentration to form a first oxide film; and concentrating the oxidizing solution below azeotropic concentration up to an azeotropic concentration (heating the solution until azeotropy is reached and maintaining the azeotropic concentration) with the substrate being immersed in that oxidizing solution to form a second oxide film on the first oxide film.

The present manufacturing method is characterized in that the substrate on which the chemical oxide film is to be formed contains silicon carbide on the surface. In a case like this, the substrate on which the chemical oxide film is to be formed may contain silicon carbide.

The present manufacturing method is characterized in that the oxidizing solution is nitric acid.

The present manufacturing method is characterized in that the method further includes after the oxide film forming step, the step of subjecting the chemical oxide film(s) to nitriding.

With these arrangements, the substrate on which an oxide film is to be formed is immersed in an oxidizing solution containing an active oxidizing species. The active oxidizing species has strong oxidation effect. When immersed in the solution of the species, the surface region of the substrate where a chemical oxide film is to be formed is directly oxidized by the active oxidizing species. Accordingly, a chemical oxide film is formed in the region. In the arrangement, a chemical oxide film is formed by immersing a substrate in an oxidizing solution in this manner. Even if the substrate surface is irregular or curved, the oxidizing solution acts uniformly on the substrate surface. The chemical oxide film formed is hence uniform in thickness across the entire region where a chemical oxide film should be formed.

Further, with the arrangement, a chemical oxide film grows in a substrate direction in which the chemical oxide film should be formed. Therefore, the chemical oxide film is formed while the interface between the chemical oxide film and the substrate is constantly changing. The interface is thus cleaned.

Therefore, high performance thin film transistors with a high reliability and high quality chemical oxide film can be manufactured.

In a thin film transistor, the quality of the gate oxide film plays an important role which determines the electrical properties and reliability of the thin film transistor. In other words, in a thin film transistor, the gate oxide film, which needs to be completely insulating, directly impacts the performance (reliability and properties) of various apparatuses containing the TFT. The film needs to have extra high quality and reliability. Therefore, the oxide film forming step forms a high reliability and high quality gate oxide film which has excellent insulation tolerance and associated properties. The step thus allows reductions in thickness of the gate oxide film. The thin film transistor can be made thinner accordingly.

Further, with the arrangement, the chemical oxide film is formed in an oxidizing solution containing an active oxidizing species with strong oxidation effect. Therefore, the chemical oxide film can be formed at, for example, 200° C. or below. Therefore, thin film transistors can be manufactured which are applicable to the manufacture of a liquid crystal display built on a flexible substrate (for example, polyethylene terephthalate (PET) or another plastic). Accordingly, for example, a thin film plastic transistor with low threshold can be manufactured even on a plastic substrate.

A thin film transistor in accordance with the present invention is characterized in that it is a thin film transistor manufactured by any one of the methods of manufacturing a thin film transistor and includes the chemical oxide film formed by oxidation in an oxidizing solution. Accordingly. The thin film transistor includes a high quality oxide film (especially, gate oxide film). The thin film transistor exhibits high performance.

The thin film transistor in accordance with the present invention is characterized in that the chemical oxide film has a relatively high atomic density near the substrate.

The thin film transistor in accordance with the present invention is characterized in that the chemical oxide film is a gate oxide film.

A display in accordance with the present invention (the present display) is characterized in that it contains the thin film transistor mentioned above. Accordingly, for example, the display contains the thin film transistor as a switching element. The display thus shows improved switching properties.

Further, it is preferable if: the present display contains a drive circuit driving switching elements, uses the thin film transistors in the drive circuit; and the switching elements and the thin film transistors are formed simultaneously.

The display can be manufactured in less steps by using the thin film transistors in the drive circuit.

It is preferable if the display is a matrix display. The "display" refers to liquid crystal displays, organic EL displays, flat panel displays, and various other displays which display images.

A method of modifying an oxide film in accordance with the present invention, which is one of an application of the present manufacturing method, is characterized in that the method includes the step of performing any one of the oxide film forming steps on an oxide film having a non-uniform thickness to improve quality of the oxide film (to make uniform the thickness of the oxide film having a non-uniform thickness).

The method of modifying an oxide film may perform the oxide film forming step of any one of the claims above on an oxide film having non-uniform quality to improve quality of the oxide film (to make uniform the quality of the oxide film having non-uniform quality).

With these arrangements, an oxide film with non-uniform thickness (or quality) is processed by the oxide film forming step of the present manufacturing method. Accordingly, the non-uniform oxide film can be oxidized in a solution containing an active oxidizing species to form a uniform chemical oxide film. Therefore, A high reliability and high quality chemical oxide film can be formed.

It is preferable if the method of modifying an oxide film is performed on, for example, an oxide film formed by a conventional method (especially, CVD). In addition, since CVD forms the oxide film through deposition, the thickness and quality of the oxide film formed is not uniform. Accordingly, performing the oxide film forming step on such a non-uniform oxide film produces an uniform chemical oxide film. Accordingly, insulation breakdown, increases in leak current density, and various other properties caused by the non-uniformity of film thickness and quality can be improved. A high reliability and high quality chemical oxide film with excellent such properties can be formed.

For example, CG silicon is formed by thermal annealing. In the formation, crystals collide to form angular projections. Therefore, the surface of CG silicon is highly irregular. Performing the method of modifying an oxide film on such a complex surface with irregular geometry (projections) produces an oxide film with uniform thickness and quality.

Performing the method of modifying an oxide film as a pre-process (pre-oxidation) to modify the oxide film, followed by an ordinary oxide film forming step (publicly known or the oxide film forming step of the present invention) improves the thickness and quality of the chemical oxide film and produces a high reliability and high quality chemical oxide film.

For example, a uniform chemical oxide film can be formed by performing the method on a nonuniform layer containing an impurity such as carbon.

A method of forming an oxide film in accordance with the present invention (the present forming method), to address the problems, is characterized in that it includes the steps of: bringing a semiconductor in contact with an oxidizing solution below azeotropic concentration or a gas thereof to form a first chemical oxide film on a surface of the semiconductor; and bringing the semiconductor on which the first chemical oxide film is formed in contact with an oxidizing solution above azeotropic concentration or a gas thereof to form a second chemical oxide film.

The present forming method may be described as being characterized in that it includes the steps of: reacting an oxidizing solution of a low concentration or a gas thereof with a surface of a semiconductor to form a first chemical oxide film on the surface of the semiconductor; and reacting an oxidizing solution of a high concentration or a gas thereof to form a second chemical oxide film on the first chemical oxide film.

"Form a second chemical oxide film on the first chemical oxide film" does not indicate that the first and second chemical oxide films have a layered structure. The terminology indicates that the films have the same compositions, but different atomic densities.

In the present forming method, the second chemical oxide film may be thicker than the first chemical oxide film.

It is preferable in the present forming method if the step of forming the first chemical oxide film and the step of forming the second chemical oxide film are carried out with the semiconductor being immersed in the oxidizing solution.

It is preferable in the present forming method if: the semiconductor contains at least one component selected from the group consisting of monocrystal silicon, polycrystalline silicon, amorphous silicon, silicon carbide, and silicon germanium; and the first chemical oxide film and the second chemical oxide film are silicon oxide films.

It is preferable in the present forming method if the oxidizing solution of a high concentration or a gas thereof is an oxidizing solution of azeotropic concentration or a gas thereof.

It is preferable in the present forming method if the oxidizing solution or the gas thereof contains: at least one solution selected from the group consisting of nitric acid, perchloric acid, sulfuric acid, ozone-dissolving water, aqueous hydrogen peroxide, a mixed solution of hydrochloric acid and aqueous hydrogen peroxide, a mixed solution of sulfuric acid and aqueous hydrogen peroxide, a mixed solution of aqueous ammonia and aqueous hydrogen peroxide, a mixed solution of sulfuric acid and nitric acid, aqua regia, and boiling water; a gas thereof, or a mixture thereof.

It is preferable in the present forming method if the oxidizing solution of a low concentration or the gas thereof contains: at least one solution below azeotropic concentration selected from the group consisting of an aqueous solution of nitric acid, an aqueous solution of sulfuric acid, and an aqueous solution of perchloric acid; or a gas thereof, and if the oxidizing solution of a high concentration or the gas thereof contains: at least one solution of azeotropic concentration selected from the group; or a gas thereof.

It is preferable if the present forming method further includes after forming the chemical oxide films on the surface of the semiconductor, the step of subjecting the chemical oxide films to nitriding.

A method of manufacturing a semiconductor device in accordance with the present invention ("the present manufacturing method"), to address the problems, is characterized in that it includes the oxide film forming step of forming a chemical oxide film by one of the aforementioned methods of forming an oxide film.

In other words, for example, the present manufacturing method is characterized in that it includes the steps of: reacting an oxidizing solution of a low concentration or a gas thereof with a surface of a semiconductor to form a first chemical oxide film on the surface of the semiconductor; and reacting an oxidizing solution of a high concentration or a gas thereof to form a second chemical oxide film on the first chemical oxide film.

It is preferable in the present manufacturing method if: the oxidizing solution of a low concentration or the gas thereof contains a mixture below azeotropic concentration selected from the group consisting of mixtures of water and at least one of nitric acid, perchloric acid, and sulfuric acid; and the oxidizing solution of a high concentration or the gas thereof contains a mixture above the low concentration selected from the group.

It is preferable in the present manufacturing method if the oxidizing solution of a high concentration or the gas thereof contains: at least one solution or selected from the group consisting of azeotropic nitric acid which is an azeotropic mixture with water, azeotropic sulfuric acid which is an azeotropic mixture with water, and azeotropic perchloric acid which is an azeotropic mixture with water; or a gas thereof.

It is preferable in the present manufacturing method if the semiconductor contains at least one component selected from the group consisting of monocrystal silicon, polycrystalline silicon, amorphous silicon, silicon carbide, and silicon germanium.

It is preferable if the present manufacturing method further includes after forming the chemical oxide films on the surface of the semiconductor, the step of subjecting the chemical oxide films to nitriding.

It is preferable if the present manufacturing method further includes after forming the chemical oxide films on the surface of the semiconductor or after subjecting the chemical oxide films to nitriding, the step of forming, as a coating film, at least one of an oxide film made by chemical vapor deposition (CVD), a silicon nitride film, a high dielectric film, and a ferroelectric film.

A semiconductor device in accordance with the present invention is characterized in that it is manufactured by any one of the methods of manufacturing a semiconductor device above and includes the chemical oxide film formed by oxidation of the semiconductor in the oxidizing solution.

An apparatus for manufacturing a semiconductor device in accordance with the present invention, to address the problems, is characterized in that it has: a function of reacting an oxidizing solution of a low concentration or a gas thereof with a surface of a semiconductor to form a first chemical oxide film on the surface of the semiconductor; and a function of reacting an oxidizing solution of a high concentration or a gas thereof to form a second chemical oxide film on the first chemical oxide film.

In other words, the present manufacturing apparatus is an apparatus for manufacturing a semiconductor device characterized in that it has an oxide film forming section for forming a chemical oxide film on a surface of a semiconductor, wherein the oxide film forming section has a function of forming the chemical oxide film on the surface of the semiconductor by any one of the methods of forming an oxide film above (the present forming methods) or any one of the methods of manufacturing a semiconductor device above (the present manufacturing methods).

According to any one of the methods and arrangements above, a first chemical oxide film is formed on a semiconductor surface using an oxidizing solution of a low concentration (preferably, below azeotropic concentration) or a gas thereof. Thereafter, a second chemical oxide film is formed using an oxidizing solution of a higher concentration (preferably, of azeotropic concentration) or a gas thereof. The density of the first chemical oxide film is low. This presumably acts like oxidation catalyst, enabling the formation of the second chemical oxide film. The oxidation using the high concentration oxidizing solution or a gas thereof increases the density of the oxide film. Accordingly, the ultimately resultant the oxide film made up of the first chemical oxide film and the second chemical oxide film is a high quality oxide film with low leak current density and other properties. In addition, it is possible to form an oxide film at low temperature (for example, 200° C. or below). Adjusting the concentration of the oxidizing solution of a high concentration or a gas thereof facilitates thickness control for the second chemical oxide film too.

As described above, by forming the first chemical oxide film and the second chemical oxide film one by one, lowering the atomic density of the first chemical oxide film, and making the second chemical oxide film thicker than the first chemical oxide film, a high quality chemical oxide film with a desired thickness can be formed at low temperature and uniformly across the semiconductor surface. In other words, the film quality of the chemical oxide film is improved. A high quality chemical oxide film can be formed with low leak current density. Further, a high performance semiconductor device can be provided which contains such a high quality chemical oxide film.

As described in the foregoing, according to a method of forming an oxide film in accordance with the present invention, the second chemical oxide film is formed after the first chemical oxide film is formed on the semiconductor. Therefore, the above-mentioned high quality chemical oxide film can be formed as a coating film up to a desired large thickness at low temperature, by the inclusion of the step of reacting an oxidizing solution of a low concentration or a gas thereof with the surface of the semiconductor to form the first chemical oxide film on the semiconductor surface and the step of reacting an oxidizing solution of a high concentration or a gas thereof to form the second chemical oxide film on the first chemical oxide film.

According to a method of manufacturing a semiconductor device in accordance with the present invention, the second chemical oxide film is formed after the first chemical oxide film is formed on the semiconductor. Therefore, a semiconductor device can be manufactured which includes a coating film with a predetermined large thickness containing the first chemical oxide film, by inclusion of the step of reacting an oxidizing solution of a low concentration or a gas thereof on the surface of the semiconductor to form the first chemical oxide film on the semiconductor surface and the step of reacting an oxidizing solution of a high concentration or a gas thereof on the first chemical oxide film to form the second chemical oxide film.

According to an apparatus for manufacturing a semiconductor device in accordance with the present invention, the second chemical oxide film is formed after the first chemical oxide film is formed on the semiconductor. Therefore, an insulating film which is a coating film with a predetermined large thickness containing the first chemical oxide film can be formed on a base including the semiconductor, and a high performance semiconductor device with stable properties can be manufactured, by the inclusion of a function of reacting an oxidizing solution of a low concentration or a gas thereof on the surface of the semiconductor to form the first chemical oxide film on the semiconductor surface and a function of reacting an oxidizing solution of a high concentration or a gas thereof to form the second chemical oxide film on the first chemical oxide film.

Incidentally, the present invention may be depicted as follows:

[1] A method of forming an oxide film in accordance with the present invention is characterized in that it includes the steps of: reacting an oxidizing solution of a low concentration or a gas thereof (oxidizing gas) on a surface of a semiconductor to form a first chemical oxide film on the surface of the semiconductor; and reacting an oxidizing solution of a high concentration or a gas thereof to form a second chemical oxide film on the first chemical oxide film.

[2] The method of forming an oxide film in accordance with the present invention, in the method of forming an oxide film described in [1], is characterized in that the semiconductor contains at least one component selected from the group consisting of monocrystal silicon, polycrystalline silicon, amorphous silicon, silicon carbide, and silicon germanium and that the chemical oxide films are primarily made of silicon oxide films.

[3] The method of forming an oxide film in accordance with the present invention, in the method of forming an oxide film described in [1], is characterized in that: the oxidizing solution of a low concentration or the gas thereof contains: at least one solution below azeotropic concentration selected from the group consisting of an aqueous solution of nitric acid, an aqueous solution of sulfuric acid, and an aqueous solution of perchloric acid; or a gas thereof; and the oxidizing solution of a high concentration or the gas thereof contains: at least one solution of azeotropic concentration selected from the group; or a gas thereof.

[4] The method of forming an oxide film in accordance with the present invention, in the method of forming an oxide film described in any one of [1] to [4], is characterized in that the method includes after forming the chemical oxide films on the surface of the semiconductor, the step of subjecting the chemical oxide films to nitriding.

[5] A method of manufacturing a semiconductor device in accordance with the present invention is characterized in that it includes the steps of: reacting an oxidizing solution of a low concentration or a gas thereof on a surface of a semiconductor to form a first chemical oxide film on the surface of the semiconductor; and reacting an oxidizing solution of a high concentration or a gas thereof to form a second chemical oxide film on the first chemical oxide film.

[6] The method of manufacturing a semiconductor device in accordance with the present invention, in the method of manufacturing a semiconductor device described in [5], is characterized in that: the oxidizing solution of a low concentration or the gas thereof contains a mixture below azeotropic concentration selected from the group consisting of mixtures of water and at least one of nitric acid, perchloric acid, and sulfuric acid; and the oxidizing solution of a high concentration or the gas thereof contains a mixture above the low concentration selected from the group.

[7] The method of manufacturing a semiconductor device in accordance with the present invention, in the method of manufacturing a semiconductor device in any one of [5] and [6], is characterized in that the oxidizing solution of a high concentration or the oxidizing gas contains at least one solution selected from the group consisting of azeotropic nitric acid which is an azeotropic mixture with water, azeotropic sulfuric acid which is an azeotropic mixture with water, and azeotropic perchloric acid which is an azeotropic mixture with water; or a gas thereof.

[8] The method of manufacturing a semiconductor device in accordance with the present invention, in the method of manufacturing a semiconductor device described in any one of [5] to [7], is characterized in that the semiconductor contains at least one component selected from the group consisting of monocrystal silicon, polycrystalline silicon, amorphous silicon, silicon carbide, and silicon germanium.

[9] The method of manufacturing a semiconductor device in accordance with the present invention, in the method of manufacturing a semiconductor device described in any one of [5] to [8], is characterized in that the method further includes after forming the chemical oxide films on the surface of the semiconductor, the step of subjecting the chemical oxide films to nitriding.

[10] The method of manufacturing a semiconductor device in accordance with the present invention, in the method of manufacturing a semiconductor device described any one of [5] to [9], is characterized in that after forming the chemical oxide films on the surface of the semiconductor or after subjecting the chemical oxide films to nitriding, the step of forming, as a coating film, at least one of an oxide film made by chemical vapor deposition (CVD), a silicon nitride film, a high dielectric film, and a ferroelectric film.

[11] An apparatus for manufacturing a semiconductor device in accordance with the present invention is characterized in that it has: a function of reacting an oxidizing solution of a low concentration or a gas thereof on a surface of a semiconductor to form a first chemical oxide film on a surface of a semiconductor; and a function of reacting an oxidizing solution of a high concentration or a gas thereof to form a second chemical oxide film on the first chemical oxide film.

According to the above-mentioned method of forming an oxide film in accordance with the present invention, the high quality chemical oxide film can be formed as a coating film up to a desired large thickness at low temperature, by the inclusion of the step of reacting an oxidizing solution of a low concentration or a gas thereof on a surface of a semiconductor to form a first chemical oxide film on the surface of the semiconductor; and the step of reacting an oxidizing solution of a high concentration or a gas thereof to form a second chemical oxide film on the first chemical oxide film.

Accordingly to the method of manufacturing a semiconductor device in accordance with the present invention, a semiconductor device can be manufactured which includes a coating film with a predetermined large thickness containing the first chemical oxide film, by the inclusion of the step of reacting an oxidizing solution of a low concentration or a gas thereof on a surface of a semiconductor to form a first chemical oxide film on the surface of the semiconductor and the step of reacting an oxidizing solution of a high concentration or a gas thereof to form a second chemical oxide film on the first chemical oxide film.

According to the apparatus for manufacturing a semiconductor device in accordance with the present invention, an insulating film which is a coating film with a predetermined large thickness containing the first chemical oxide film can be formed on a base including the semiconductor, and a high performance semiconductor device with stable properties can be manufactured, by the inclusion of a function of reacting an oxidizing solution of a low concentration or a gas thereof on a surface of a semiconductor to form a first chemical oxide film on the surface of the semiconductor; and a function of reacting an oxidizing solution of a high concentration or a gas thereof to form a second chemical oxide film on the first chemical oxide film.

Additional objects, advantages and novel features of the invention will be set forth in part in the description which follows, and in part will become apparent to those skilled in the art upon examination of the following or may be learned by practice of the invention.

BEST MODE FOR CARRYING OUT INVENTION

Figure 1:
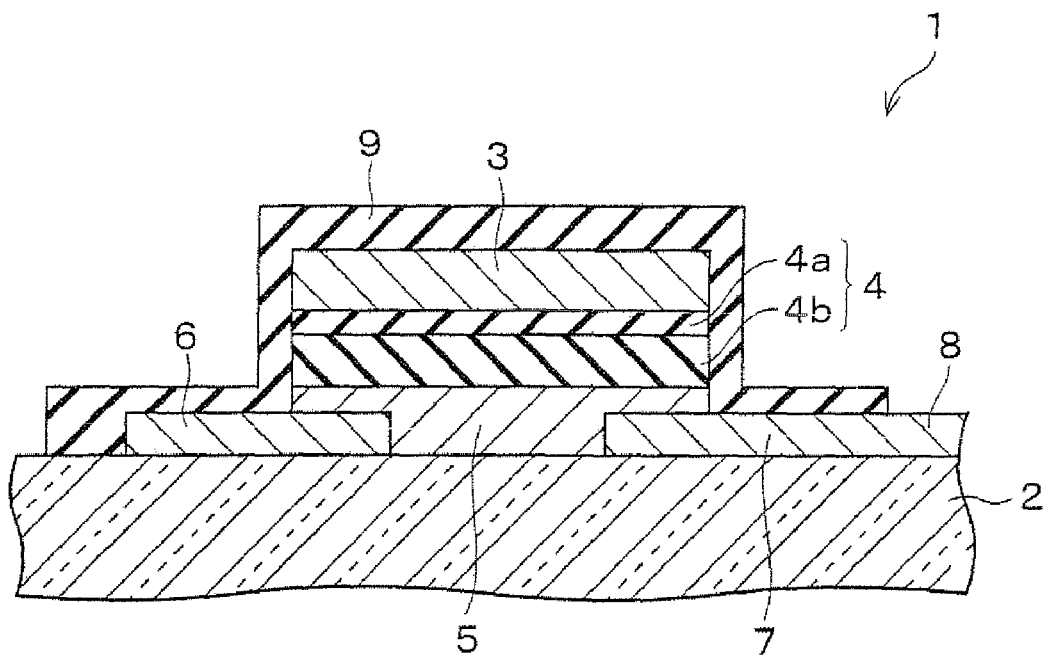
FIG. 1 is a cross-sectional view of a thin film transistor in accordance with an embodiment of the present invention.

The following will describe in detail the present invention by way of embodiments in reference to figures.

Embodiment 1

The following will describe an embodiment of the present invention in reference to FIG. 1 to FIG. 20. This is by no means limiting the present invention.

The following will describes as an example, thin film transistors (TFTs) for use in flexible liquid crystal displays and integrated circuits as an embodiment of the present invention. The method of manufacturing a thin film transistor in accordance with the present invention ("the present manufacturing method") is a method of forming a high quality, uniform oxide film whereby a substrate on which a gate oxide film (chemical oxide film) is to be formed is immersed in a solution containing an active oxidizing species to directly oxidize the substrate surface.

First, problems in the manufacture of TFTs for use in flexible liquid crystal displays and ICs will be described.

To manufacture a flexible liquid crystal display, etc., TFTs need to be formed on an organic (e.g., PET) substrate. The melting points of these organic substrates are low, no higher than 200° C. Therefore, to manufacture a flexible liquid crystal display, etc., the TFTs must be formed at low temperature (200° C. or lower).

The gate oxide film is important in TFTs: its impact on the performance of various devices built around the TFTs is great. Conventionally, the gate oxide film was formed by deposition (CVD). In addition, attempts have been made to lower the temperature required in CVD. Currently, the lowest temperature CVD is to add ozone to tetra-ethoxy-silane (TEOS). In this method, an oxide film can be formed at 300° C. to 400° C. Therefore, CVD cannot form a TFT at a temperature as low as 200° C. or even lower.

In addition, in the TFT, a relatively high voltage is applied to the gate electrode. Therefore, the gate oxide film needs to be completely insulating. The substrate surface on which the gate oxide film is formed is irregular (not planar) because it has various fine patterns formed thereon, As described above, in CVD, the gate oxide film is formed by deposition. Therefore, if a gate oxide film is formed on an irregular substrate by CVD, the deposited oxide film is also irregular. As a result, the resultant gate oxide film is non-uniform. Therefore, the gate oxide film formed may not be completely insulating, which could increase leak current density. In other words, the gate oxide film formed by CVD has poor quality and reliability.

This requires the gate oxide film in a TFT made by conventional CVD to have a sufficient thickness so as to prevent insulation breakdown and secure complete insulation. To manufacture, for example, a sheet-like liquid crystal display as a flexible liquid crystal display, the TFT needs to be thinned down. To achieve this, the gate oxide film needs to be thinned down.

If the current gate oxide film formed by CVD is thinned down, however, complete insulation cannot be secured. Therefore, it is impossible to thin down the gate oxide film formed by CVD.

As described above, CVD cannot form a gate oxide film at a temperature as low as 200° C. or lower, let alone a high quality gate oxide film.

Therefore, what matters in the manufacture of a flexible liquid crystal display, etc. is the development of a method in which a uniform, high quality gate oxide film can be formed at low temperature.

To manufacture such TFTs, the method of manufacturing a thin film transistor in accordance with the present invention ("the present manufacturing method") form a high quality oxide film uniformly at temperatures as low as 200° C. or even lower, by immersing a substrate on which a gate oxide film (chemical oxide film) is to be formed in an oxidizing solution containing an active oxidizing species so as to directly oxidize the substrate. In other words, the thin film transistor in accordance with the present invention contains a high quality oxide film and exhibits high performance.

Next, the TFT in accordance with the present invention will be described in terms of its structure.

As shown in FIG. 1, a thin film transistor 1 of the present embodiment has a staggered structure. In the transistor 1, a source electrode 6, a drain electrode 7, and a semiconductor layer 5 connected to the electrodes 6, 7 are formed on a process-target substrate 2. A gate electrode 3 is formed on the layer 5 with a gate oxide film 4 intervening therebetween. When the thin film transistor 1 is used in a display, for example, the gate electrode 3 is formed on the gate oxide film 4 so that the electrode 3 connects to the drain electrode 7. The thin film transistor 1 has the semiconductor layer 5, the source electrode 6, and a protection film 9 covering the layer 5 and the electrode 6.

In the thin film transistor 1, the semiconductor layer 5 connects the source electrode 6 to the drain electrode 7 so that current can flow between the electrodes 6, 7. Therefore, it is important to make the interface between the semiconductor layer 5 and the gate oxide film 4 clean.

The thin film transistor 1 is characterized in that the gate oxide film 4 is made of chemical oxide films which are formed from the semiconductor layer 5 through direct oxidation thereof. A chemical oxide film is formed on the gate oxide film 4, for example, in the direction of the semiconductor layer 5 as in the example manufacturing (detailed later). Therefore, the interface between the semiconductor layer 5 and the gate oxide film 4 is always clean. The gate oxide film 4 is uniformly formed irrespective of the surface state of the semiconductor layer 5, and as such possesses high reliability and high quality.

The gate oxide film 4 is composed of a first oxide film (first chemical oxide film) 4a and a second oxide film (second chemical oxide film) 4b. The formation of the gate oxide film 4 will be detailed later. The gate oxide film 4 is made of an oxide which is the material of the semiconductor layer 5 having been oxidized. In other words, normally, the first oxide film 4a and the second oxide film 4b have an identical composition; no distinction can be made between the insulating films. Here, for convenience in description, the first oxide film 4a is distinguished from the second oxide film 4b. Note however that the first oxide film 4a and the second oxide film 4b are formed in oxidizing solutions of different concentrations and as such have different atomic densities (detailed later). As described above, the gate oxide film 4 has a consistent composition, but variable atomic density. In other words, the gate oxide film 4 contains the first oxide film 4a with a relatively low atomic density and the second oxide film 4b with a relatively high atomic density. The second oxide film 4b with a relatively high atomic density is formed closer to the process-target substrate 2. The second oxide film 4b is laminated on the semiconductor layer 5 to form an interface to the semiconductor layer 5.

The semiconductor layer 5 preferably contains silicon, such as monocrystal silicon, polycrystalline silicon, amorphous silicon, continuous grain silicon, silicon carbide, or silicon germanium.

Especially, with polycrystalline silicon TFTs in which the semiconductor layer 5 is made of polycrystalline silicon, driver and other peripheral circuits can be integrated on the process-target substrate 2. Therefore, the semiconductor layer 5 is preferably made of polycrystalline silicon.

Now, a manufacturing method for the thin film transistor 1 thus structured will be described in reference to the manufacturing step drawings in FIG. 2. In the following, a manufacturing method for a polycrystalline silicon TFT in which the semiconductor layer 5 in the thin film transistor 1 is polycrystalline silicon will be described. The present manufacturing method has features in the step of forming the gate oxide film 4 (oxide film forming step; see FIGS. 2(c) and 2(d)).

First, ITO (Indium Tin Oxide) and other films are formed on the process-target substrate 2 by sputtering. The ITO film is subjected to photolithography and wet etched in an etching solution (hydrochloric acid+nitric acid) to form the source electrode 6, the drain electrode 7, and a pixel electrode 8 simultaneously. See FIG. 2(a). The process-target substrate 2 only needs to be insulating; the substrate 2 may be a glass substrate, quartz, or a silicon substrate, as well as a flexible plastic substrate.

Subsequently, polycrystalline silicon (semiconductor material) 51 is deposited by CVD. See FIG. 2(b). If natural oxide film has formed on the surface of the deposited polycrystalline silicon 51, it is preferable to wash with a well-known RCA washing method, in other words, in an aqueous solution of primarily ammonia and hydrogen peroxide, and subsequently immerse in a dilute solution of hydrofluoric acid (concentration: 0.5% in volume ratio, or vol.) for about 5 minutes, The wash and immersion completely removes the natural oxide film, making the polycrystalline silicon surface clean. The quality of subsequent chemical oxide films will also improve.

Next, the process-target substrate 2 on which polycrystalline silicon has been deposited is immersed in an oxidizing solution. In this step, the polycrystalline silicon is directly oxidized using an oxidizing species generated from the oxidizing solution to form a thin silicon dioxide film 41. See FIG. 2(c). In a case like this, the process-target substrate 2 on which polycrystalline silicon has been deposited is the substrate on which chemical oxide films are to be formed. Direct oxidation refers, for example, to the oxidation of the polycrystalline silicon 51 per se using an oxidizing species of the oxidizing solution to form a chemical oxide film. Unlike CVD, direct oxidation does not form an oxide film through deposition.

Subsequently, the polycrystalline silicon 51 is oxidized using an oxidizing species so that the silicon dioxide film 42 can grow toward the process-target substrate 2. See FIG. 2(d). In FIG. 2(d), different numerals are assigned to the silicon dioxide film 41, which is formed first, and the silicon dioxide film 42, which is grown, to distinguish between the two.

Subsequently, a film of a gate electrode material, which will be the gate electrode 3, is formed by sputtering. On that film, a resist is formed in a gate pattern by photolithography. Thereafter, the resist is patterned to the gate electrode 3, the gate insulating film 4, and the semiconductor film 5. See FIG. 2(e). The gate electrode material is, for example, polycrystalline silicon, amorphous silicon, continuous grain silicon (CG silicon), or a metal (Al, Ti, Ta, etc.).

Finally, a silicon nitride thin film is formed by P-CVD. Those portions of the silicon nitride thin film which sit over the pixel electrode 8 and a terminal pad (not shown) are removed by photolithography and dry etching to form the protection film 9, which completes the fabrication of the thin film transistor 1. See FIG. 2(f).

In this manufacturing method, the gate oxide film 4 is formed by immersing the process-target substrate 2 in an oxidizing solution. Therefore, even if the substrate has an irregular or curved surface, the oxidizing solution can reach the substrate surface uniformly. Accordingly, the formed silicon dioxide films 41, 42 are uniform in thickness across all the regions in which the silicon dioxide films 41, 42 are to be formed. Further, the silicon dioxide film 42 grows toward the process-target substrate 2. Therefore, the interface between the silicon dioxide film 42 and the polycrystalline silicon 51 (gate oxide film 4 and semiconductor layer 5) can be cleaned by forming the chemical oxide film while the interface is constantly changing. The interface between the gate oxide film 4 and the semiconductor layer 5 has its properties improved. Therefore, the gate oxide film 4 exhibits excellent insulation tolerance and other properties, is highly reliable, and has high quality. Thus, the gate oxide film 4 can be thinned down, and so can the thin film transistor 1.

Further, the manufacturing method is capable of fabricating a high quality gate oxide film 4 at temperatures as low as 200° C. or even lower. In addition, the chemical oxide films can be formed simply by immersing the process-target substrate 2 in an oxidizing solution. Therefore, there is no need for a vacuum machine or any large scale equipment as with CVD.

As described in the foregoing, in the present manufacturing method, the oxide film forming step forms the gate oxide film 4 with uniform thickness across all the regions in which the gate oxide film 4 is to be formed. Therefore, the gate oxide film 4 is high reliable and has high quality. Also, the oxide film forming step can be carried out at temperatures as low as 200° C. or even lower. Therefore, thin film plastic transistors with low threshold can be fabricated on a plastic substrate. Further, the thin film transistor 1 boasts high performance and high reliability because the gate oxide film 4 has a uniform thickness and high quality.

Figure 20:
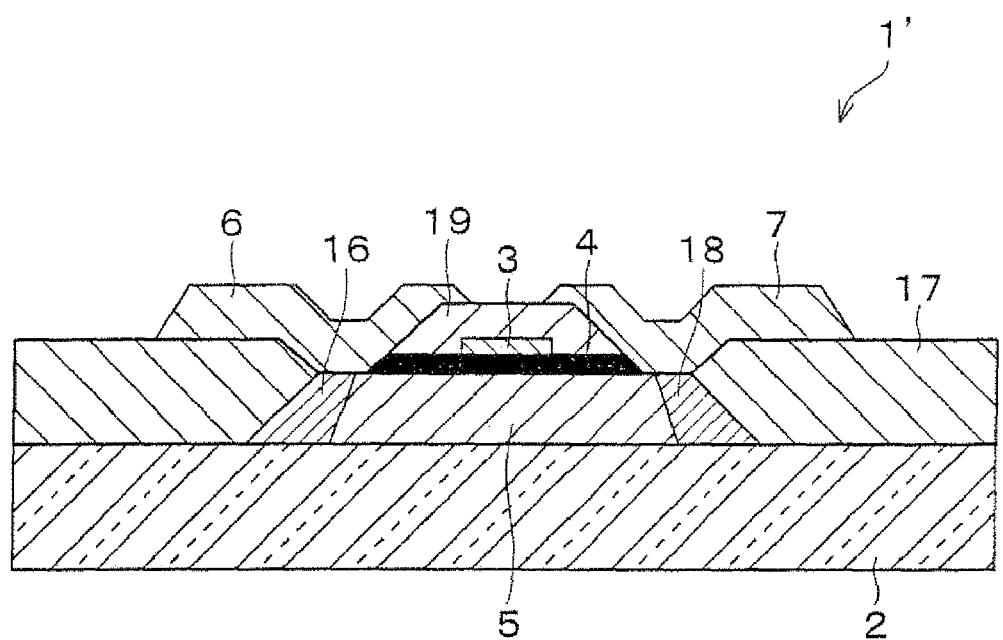
FIG. 20 is a cross-sectional view of another thin film transistor in accordance with an embodiment of the present invention.

Apart from the correctly staggered thin film transistor 1 shown in FIG. 1, the present thin film transistor may be arranged, for example, like the thin film transistor 1' shown in FIG. 20. The thin film transistor 1' is another staggered (correctly staggered) thin film transistor. In the thin film transistor 1 in FIG. 1, the source electrode 6 and the drain electrode 7 are formed on the process-target substrate 2. In contrast, in the thin film transistor 1' in FIG. 20, the electrodes 6, 7 are formed on an insulating film 17 which separates the device. The electrodes 6, 7 are formed at positions at a distance from the semiconductor layer 5. Although not shown in FIG. 1, impurity-doped regions of the semiconductor, that is, the source region 16 and the drain region 18 (for example, $n^+$ polycrystalline silicon, or $n^+$ p-Si), are shown in FIG. 20 on either end of the semiconductor layer 5. In addition, in the thin film transistor 1', the gate insulating film 4 between the semiconductor layer 5 and the gate electrode 3 is the only high performance chemical oxide film prepared by direct oxidation of the semiconductor layer 5. On the gate insulating film 4 is there provided a $SiO_2$ film 19 deposited by CVD or a like method. Conventionally, those portions of the gate oxide film 4 and the $SiO_2$ deposited film 19 are formed by CVD. The gate oxide film 4 therefore has low quality and reliability. In contrast, as is the case with the thin film transistor 1', the gate oxide film 4 has improved quality and reliability when the gate oxide film 4 is a chemical oxide film prepared by direct oxidation illustrated in FIG. 2(c) and FIG. 2(d).

In addition, the staggered thin film transistor was described in the foregoing. The description holds true with a reverse staggered type.

Next, the fabrication of the gate oxide film 4 (oxide film forming step; see FIG. 2(*c*) and FIG. 2(*d*)), which is the feature of the present manufacturing method, will be described in detail.

In the present manufacturing method, the oxide film forming step may be implemented in two ways.

One of them is to form the gate oxide film in two stages (2-stage oxidation scheme).

The other is to form the gate oxide film through voltage application (voltage application scheme).

The scheme will be described next.

2-Stage Oxidation Scheme

The 2-stage oxidation scheme first forms the first oxide film 4*a* (step 1) and then the second oxide film 4*b* (step 2), by immersing the process-target substrate 2 on which the gate oxide film 4 is to be formed, in a solution containing active oxidizing species of different concentrations. The gate insulating films are formed in stages.

Figure 9:
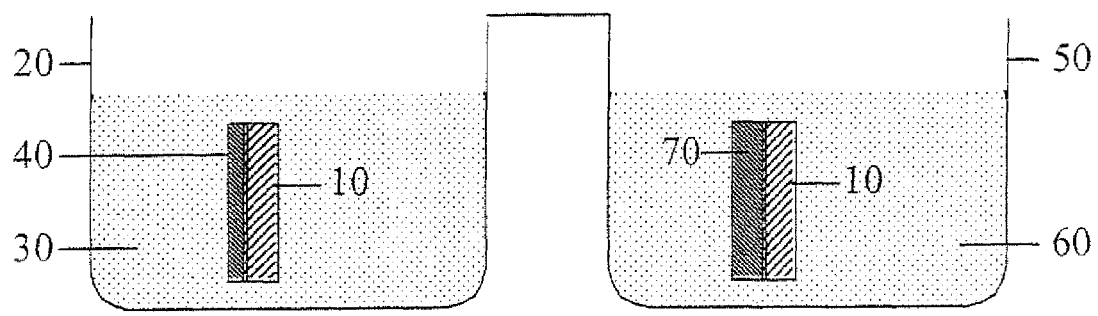
FIG. 9 is a schematic cross-sectional view of a major part of a manufacturing apparatus used in a 2-stage oxidation scheme.

The 2-stage oxidation scheme can be carried out, for example, by the apparatus shown in FIG. 9. FIG. 9 is a schematic cross-sectional view of an apparatus which implements the 2-stage oxidation scheme. The schematic figure shows the apparatus which fabricates a silicon dioxide film as a chemical oxide film on a silicon substrate 10 which acts as the process-target substrate 2. The process-target silicon substrate 10 (process-target substrate 2 in FIG. 2) is immersed in a low-concentration oxidizing solution 30 in a first processing container 20 in order to form the first oxide film 40 (an equivalent to the first oxide film 4*a* in FIG. 1 and FIG. 2(*f*)) on the surface of the silicon substrate 10. After that, the process-target silicon substrate 10 on which the first oxide film 40 has been formed is immersed in an oxidizing solution of a high concentration (high-concentration oxidizing solution) 60 in the second processing container 50 in order to form the second oxide film (not shown in FIG. 9; indicated by "4*b*" in FIG. 1) in the first oxide film 40. This completes the formation of the silicon dioxide film 70 (equivalent to the gate insulating film 4 in FIG. 1) by the 2-stage oxidation scheme. In other words, the manufacturing apparatus is a part of an oxide film forming section which performs the oxide film forming step by the 2-stage oxidation scheme which will be detailed below.

Step 1 of the 2-stage oxidation scheme immerses a silicon substrate as the process-target substrate 2 on which the gate oxide film 4 is to be formed (FIG. 1 and FIG. 2) in a solution containing a relatively low-concentration oxidizing solution in order to form the first, porous (low atomic density) oxide film 4*a*.

In contrast, step 2 immerses the silicon substrate on which the first oxide film 4*a* has been formed in a solution containing an active oxidizing species of a higher concentration than in step 1 (high-concentration oxidizing solution) in order to form the second, thicker oxide film 4*b* than the first oxide film 4*a*.

Immersing the process-target substrate 2 in oxidizing solutions of different concentrations (in the order of low concentration to high concentration) as described above first forms the first, porous (low atomic density) oxide film 4*a* through oxidation in the oxidizing solution of a low concentration. Subsequently, in oxidation in the oxidizing solution of a high concentration, the catalytic action of the first, porous oxide film 4*a* accelerates the formation of the second oxide film 4*b*. Hence, the resultant gate oxide film 4 is uniform.

In the oxide film forming step of the 2-stage oxidation scheme, it is preferable if the concentration of the low-concentration oxidizing solution is below azeotropic concentration, and the concentration of the high-concentration oxidizing solution is equal to azeotropic concentration. At azeotropic concentration, the composition of the solution does not change. Therefore, the first, porous oxide film 4*a* is formed in the low-concentration oxidizing solution whose concentration is below azeotropic concentration. After that, the second oxide film 4*b* is formed in the high-concentration oxidizing solution whose concentration is equal to azeotropic concentration, to form the uniform gate insulating film 4.

In the oxide film forming step of the 2-stage oxidation scheme, the low-concentration oxidizing solution may be heated to prepare the high-concentration oxidizing solution. In the FIG. 9 arrangement, the first processing container 20 and the second processing container 50 are provided for the low-concentration oxidizing solution 30 and the high-concentration oxidizing solution 60 respectively. In contrast, if the low-concentration oxidizing solution 30 is heated until the solution 30 reaches the concentration of the high-concentration oxidizing solution 60, the second processing container 50 is no longer needed. This arrangement simplifies the arrangement of the oxide film forming section which performs the oxide film forming step of the 2-stage oxidation scheme.

Now, the 2-stage oxidation scheme will be described in more detail by means of concrete examples. In the 2-stage oxidation scheme, after the step in FIG. 2(*b*), the process-target substrate 2 (silicon substrate 10) is rinsed (washed) in ultrapure water for 5 minutes. Then, the process-target substrate 2 is immersed in the low-concentration oxidizing solution 30 in the first processing container 20 as shown in FIG. 9. This process forms the silicon dioxide film 41 (first oxide film, or first chemical oxide film) as shown in FIG. 2(*c*). The substrate 2 is immersed for 10 minutes. Cleaning the surface of the process-target substrate 2 followed by immersion in the low-concentration oxidizing solution 30 for 10 minutes as described above forms the silicon dioxide film 41 shown in FIG. 2(*c*). The silicon dioxide film 41 is a chemical oxide film formed by the oxidation of the polycrystalline silicon 51 using the oxidizing species.

The low-concentration oxidizing solution 30 is a solution of a low concentration, but with strong oxidation effect (oxidizing solution). Here, the oxidizing solution is a 40% (in weight ratio, or "wt.") aqueous solution of nitric acid. The thickness of the first oxide film 4*a* is 1.1 nm.

Subsequently, in FIG. 2(*d*), the process-target substrate 2 on which the silicon dioxide film 41 has been formed in the FIG. 2(*c*) step is placed in the second processing container 50 shown in FIG. 9 filled with the high-concentration oxidizing solution 60. The oxidation reaction of the polycrystalline silicon 51 proceeds further to form the silicon dioxide film 42 as shown in FIG. 2(*d*). That is, with the progress of the oxidation reaction, a new interface is constantly formed between the polycrystalline silicon 51 and the silicon dioxide film 42. In other words, the interface between the silicon dioxide film 42 and the polycrystalline silicon 51 is always clean. These silicon dioxide films 41, 42 will be the first oxide film 4*a* and the second oxide film 4*b*, finally providing the gate oxide film 4. In other words, for descriptive purposes, the silicon dioxide films 41, 42 can be said to be made of the first oxide film 4*a* and the second oxide film 4*b*. Actually, however, since both films are made of silicon dioxide formed by oxidation of the polycrystalline silicon 51, the films form a silicon dioxide film (gate oxide film 4) of a single continuous layer. Here, the substrate 2 is immersed for 10 minutes. As described above, the process-target substrate 2 on which the first oxide film 4*a* has been formed is immersed in the high-concentration oxidizing solution 60 for 10 minutes to form the silicon dioxide films 41, 42 shown in FIG. 2(*d*) uniformly. The silicon dioxide films 41, 42 have a combined thickness of 10 nm.

The high-concentration oxidizing solution 60 is a solution of a high concentration, but with strong oxidation effect (oxidizing solution). Here, the high-concentration oxidizing solution is azeotropic nitric acid of 68% (wt.) concentration.

Subsequently, predetermined wash and dry steps are carried out. After that, a film of a gate electrode material is formed on the silicon dioxide film 41. As the gate electrode material, an aluminum alloy containing 1 wt. % silicon is deposited to about 200 nm by well-known resistance heating vapor deposition (hereinafter, a metal film electrode like this one will be simply referred to as an Al electrode). The gate electrode material is by no means limited to the Al electrode. For example, a polycrystalline silicon electrode (material) may be deposited for use in place of such a gate electrode material.

Thereafter, as shown in FIG. 2(e), the gate electrode material is patterned to desired geometry on which a resist is disposed according to the gate pattern.

Finally, a silicon nitride thin film is formed by P-CVD. Those portions of the silicon nitride thin film which sit over the pixel electrode 8 and a terminal pad (not shown) are removed by photolithography and dry etching to form the protection film 9, which completes the fabrication of the thin film transistor 1. See FIG. 2(f). The thin film transistor manufactured as above is a MOS transistor.

Figure 3:
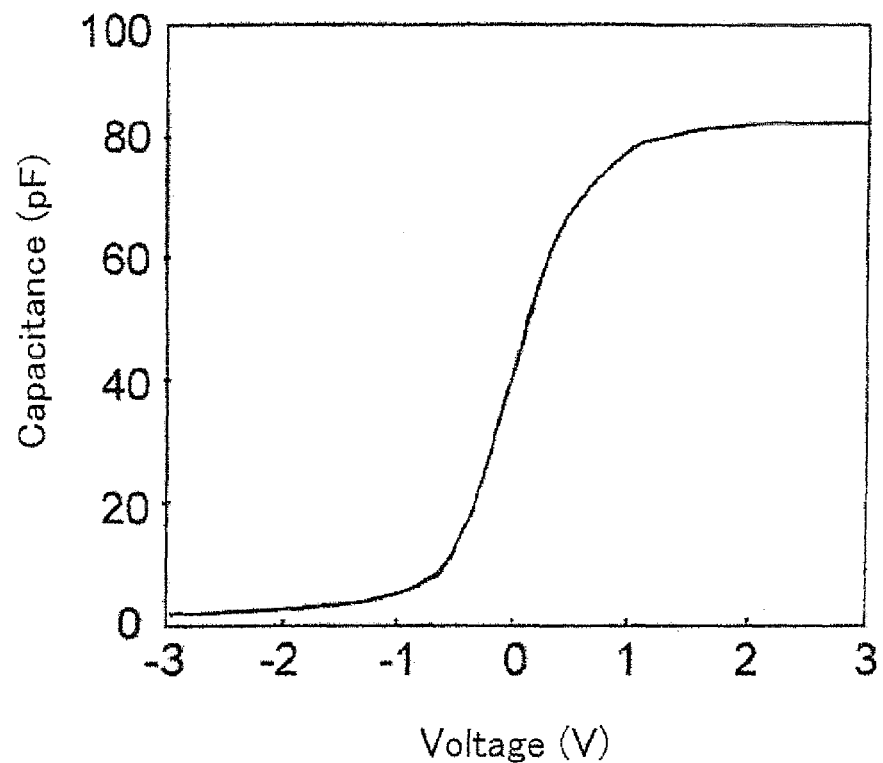
FIG. 3 is a representation of the capacitance (C) vs. voltage (V) property of a thin film transistor manufactured by 2-stage oxidation.

The thin film transistor, as shown in FIG. 3, possesses stable capacitance (electrostatic capacitance). FIG. 3 is the relationship between electrostatic capacitance (C) and applied voltage (V), or a so-called representation of C-V property, of the thin film transistor produced in accordance with the present embodiment. As observable from the property diagram, applying a positive voltage to the gate electrode 3 induces an inverted layer at the interface between the semiconductor layer 5 and the gate oxide film 4, thereby providing stable capacitance (electrostatic capacitance).

As described above, in this example, the process-target substrate 2 is immersed in aqueous solutions of nitric acid of different concentrations to form the silicon dioxide films 41, 42 on the process-target substrate 2 through two stages. In other words, the silicon dioxide films 41, 42 which constitute the gate oxide film 4 in the thin film transistor are formed by the step of bringing the process-target substrate 2 in contact with a 40% (wt.) aqueous solution of nitric acid (oxidizing solution of a low concentration) to form the first oxide film 4a (first chemical oxide film) on the surface of the polycrystalline silicon 51 (semiconductor layer 5) on the process-target substrate 2 and the step of bringing the side of the first oxide film 4a which faces the process-target substrate 2 in contact with an aqueous solution of nitric acid of a high concentration which is more than or equal to 40% (wt.), the concentration used to form the first oxide film 4a ("high-concentration oxidizing solution"; in the foregoing, 68% (wt.) aqueous solution of nitric acid), in order to form the second oxide film 4b.

The thin film transistor thus formed, as can be seen from the C-V property diagram in FIG. 3, has the same or less level of leak current density than the MOS capacitor containing as an insulating film a silicon dioxide film formed by an ordinary high temperature thermal oxidation method. The performance has certainly improved.

In this manufacturing example, the silicon dioxide films 41, 42 are 10 nm thick. The thickness is not limited in any particular manner. Adjusting the durations for which the process-target substrate 2 is immersed in the low-concentration oxidizing solution 30 and the high-concentration oxidizing solution 60 causes changes in thicknesses of the first oxide film 4a, the second oxide film 4b, and the gate oxide film 4. In other words, the process-target substrate 2 can be immersed in an oxidizing solution for durations specified in accordance with a desired film thickness. The concentration of the oxidizing solution is another factor determining a rate of formation for each chemical oxide film. Therefore, the immersion duration only needs to be specified in accordance with the type and concentration of the oxidizing solution and the thickness of an oxide film to be formed; the duration is not limited in any particular manner.

In this example, the oxidizing solution or oxidizing gas of a low concentration is a 40% (wt.) aqueous solution of nitric acid. This may be replaced with at least one aqueous solution selected from the group consisting of perchloric acid, sulfuric acid, ozone-dissolving water, aqueous hydrogen peroxide, a mixed solution of hydrochloric acid and aqueous hydrogen peroxide, a mixed solution of sulfuric acid and aqueous hydrogen peroxide, a mixed solution of aqueous ammonia and aqueous hydrogen peroxide, a mixed solution of sulfuric acid and nitric acid and, and aqua regia. A further alternative is boiling water, which has oxidation effect.

The nitric acid, since containing no halogen, does not produce chlorine, etc. which could damage the transistor in the course of manufacture. Therefore, the oxidizing solution is preferably nitric acid. It is further preferable if the nitric acid is highly pure. Use of highly pure nitric acid enables fabrication of better chemical oxide films. The highly pure nitric acid may be, for example, nitric acid with sufficiently low impurity (e.g. metal) concentration. For example, the impurity concentration is 10 ppb or less, preferably 5 ppb or less, more preferably 1 ppb or less.

In the present embodiment, the oxidizing solution or oxidizing gas of a high concentration is a 68% (wt.) aqueous solution of nitric acid ("azeotropic nitric acid"). This may be replaced with at least one aqueous solution selected from the group consisting of azeotropic perchloric acid, azeotropic sulfuric acid, and aqua regia.

If an azeotropic mixture with water is used as the oxidizing solution of a high concentration, its solution and vapor (that is, gas) have a constant concentration while a chemical oxide film is being formed on the semiconductor layer (polycrystalline silicon 51). Thus, the growth of the chemical oxide films can be controlled with time. Therefore, it is preferable if the oxidizing solution of a high concentration is an azeotropic mixture.

As will detailed later, it is preferable if the first chemical oxide film (first oxide film 4a) formed in an oxidizing solution of a low concentration has pores. In other words, it is preferable if the first chemical oxide film has a relatively low atomic density. When this is the case, the formation of the second chemical oxide film in the oxidizing solution of a high concentration proceeds smoothly. This is because the oxidizing solution acts (contacts) in the pores in the first chemical oxide film to form the second chemical oxide film. That is, the porous, low-atomic density, first chemical oxide film acts as a catalyst, enabling the oxidation reaction (formation of the second chemical oxide film) to proceed gradually. The resultant chemical oxide film is of higher quality.

In the foregoing description, the chemical oxide films are formed in the low-concentration oxidizing solution 30 and the high-concentration oxidizing solution 60 (oxidizing solutions of two concentrations) which respectively fill the first processing container 20 and the second processing container 50, as shown in FIG. 9. However, the method of forming the chemical oxide films is by no means limited to this. For example, the oxidizing solution may be altered gradually to high concentration, from low concentration to high concentration in many stages (oxidizing solutions of two or more concentrations or gases thereof are prepared).

The concentration of the oxidizing solution may be increased continuously from low concentration to high concentration. That is, a low concentration solution may be concentrated to prepare a continuously high concentration solution. For example, if the oxidizing solution below azeotropic concentration (oxidizing solution of a low concentration) is heated and concentrated until azeotropic concentration is reached, and maintained in that heated state, the oxidizing solution having reached azeotropic concentration and its vapor show an invariable composition. Accordingly, the growth of the chemical oxide films can be controlled with time. Therefore, the formation (thickness, quality, etc.) of the chemical oxide films can be controlled with higher accuracy.

In other words, when the concentration of the oxidizing solution is continuously raised from low concentration to high concentration, the oxide film forming step may be described as a method involving the step of immersing a substrate in an oxidizing solution below azeotropic concentration to form the first oxide film and the step of concentrating the oxidizing solution below azeotropic concentration up to azeotropic concentration with the substrate being immersed in the oxidizing solution below azeotropic concentration to form the second oxide film on the first oxide film.

According to the method, first, the first oxide film is formed in an oxidizing solution below azeotropic concentration. Next, the oxidizing solution is concentrated up to azeotropic concentration with the substrate left immersed in the oxidizing solution. Accordingly, after the formation of the first oxide film, the second oxide film is formed while the concentration of the oxidizing solution is continuously increased. Each oxide film is formed in a oxidizing solution of a different concentration and hence has a different atomic density. That is, the first oxide film, formed in the oxidizing solution of a low concentration (below azeotropic concentration) has a lower atomic density than the second oxide film formed in the oxidizing solution of a high concentration (of azeotropic concentration). Therefore, the chemical oxide films has nonuniform atomic density distribution.

As will be detailed later, when the concentration of the oxidizing solution is continuously raised from low concentration to high concentration, with the substrate being immersed in the oxidizing solution, to form the chemical oxide films, thick chemical oxide films can be formed more quickly than when individual oxidizing solutions of different concentrations are provided.

It is preferable if the oxidizing solution of a low concentration and that of a high concentration are oxidizing species with strong oxidation effect (for example, oxygen ions, such as oxygen ions, water oxide ions, and peroxide ions, or radicals). When this is the case, the chemical oxide films can be formed at temperatures as low as 200° C. or even lower. Therefore, the present embodiment is suited for application to the formation of TFTs in the manufacture of a flexible liquid crystal display which requires the chemical oxide films to be formed at temperatures as low as 200° C. or even lower.

In the present embodiment, it is also possible to form, in the aforementioned silicon dioxide films 41, 42, (i) a silicon nitride-containing silicon dioxide film of which the surface is partially nitrided (silicon nitride) in a nitrogen-containing gas, especially by plasma, and (ii) a thick insulating film of $SiO_2$ or another material atop the silicon nitride-containing film after the nitriding by CVD, etc.

The nitrided chemical oxide film generally shows intermediate properties between the oxide film and the nitride film depending on the composition. For example, the diffusion coefficient of impurities is slower in a nitride film than in an oxide film (thermal nitriding). A nitrided chemical oxide film provides excellent prevention of the impurity with which the gate electrode is doped, especially, boron, from diffusing into the Si substrate. Therefore, the nitrided chemical oxide film is applicable to thin film transistors in which an ultrathin gate insulating film (for example, 4 nm or less) is needed.

As described above, the nitriding is one way of improving the performance of the transistor. The nitriding further improves the quality of the chemical oxide film, which in turn allows for thinner chemical oxide films.

"Nitriding" means that the fabricated silicon dioxide films 41, 42 (chemical oxide films) are at least partially nitrided. The nitriding involves heating a chemical oxide film formed through oxidation of a semiconductor surface in an atmosphere containing a nitriding species for nitriding at least part of the chemical oxide film.

Examples of nitriding include ammonia ($NH_3$) nitriding, nitrous acid ($N_2O$) nitriding, and nitrogen monoxide (NO) nitriding. In these methods, ammonia, nitrous acid, and nitrogen monoxide are the nitriding species. Properties of a nitrided chemical oxide film obtained through NO nitriding do not degrade; the film, when used as a gate insulating film, shows excellent insulation breakdown tolerance and hot carrier tolerance over time.

As another example of the present embodiment, a high dielectric film, such as hafnium oxide or aluminum oxide, is laminated on the aforementioned silicon dioxide ($SiO_2$) films 41, 42 to form a composite film. The composite film can be used as the gate insulating film in a MOS transistor. Transistor properties improve (less leak current, higher mobility due to lowered interface energy level, etc.) with such a composite film when compared with the use of a high dielectric film alone. The silicon dioxide film under the high dielectric film may be ultrathin: for example, 1 nm or even less. A silicon dioxide film formed by ordinary thermal oxidation is not applicable in practical use where there is large leak current or high interface energy level, if the film is about 1 nm thick. The silicon dioxide ($SiO_2$) films 41, 42 of the present embodiment are suitable for use in the composite film of layered structure when the films 41, 42 are topped by a thick insulating film. The oxide film of the present embodiment is also applicable to a layered ferroelectric film structure, as well as to the high dielectric film.

In the foregoing description, the gate electrode 3 is made of aluminum. Examples of films containing metal atoms include films containing metal atoms selected from the group consisting of aluminum, magnesium, nickel, chromium, platinum, palladium, tungsten, titanium, and tantalum. Preferable films containing metal atoms are those containing active metal atoms: for example, metal films of aluminum, magnesium, and nickel and alloy films of silicon-containing aluminum. The film containing metal atoms may be a compound, such as titanium nitride or tantalum nitride. Further, a silicide electrode using nickel, etc. may be used.

The steps of the present embodiment are suited for use with polycrystalline (inclusive of fine crystals) silicon or amorphous silicon on a glass or PET substrate in the manufacture of thin film transistors (TFTs). In other words, it is preferable if the process-target substrate contains silicon and the chemical oxide film to be formed is a silicon dioxide film.

The process-target substrate is not necessarily planar. The substrate may have three-dimensional, spherical, curved, or otherwise irregular geometry. The silicon dioxide film or other insulating film explained in the present embodiment can be uniformly formed on the irregular or curved parts of the surface at low temperature so that those parts can serve as transistor channels.

Further, the steps are applicable not only to the manufacture of thin film transistors, but also to, for example, the manufacture of a capacitive insulating film in a large scale integrated circuit (LSI), e.g., flash memory, and to MOS capacitors. In the foregoing description, the chemical oxide film is a silicon dioxide film. The chemical oxide film may alter depending on the kind of material for the semiconductor layer 5 which will be oxidized. The chemical oxide film is by no means limited to the silicon dioxide film.

In the foregoing description, no voltage is applied to the process-target substrate 2. By forming the silicon dioxide film through voltage application, however, the progress of the oxidation reaction can be accelerated (the formation rate of the silicon dioxide film can be increased).

In the 2-stage oxidation scheme, the process-target substrate is immersed in the low-concentration and high-concentration oxidizing solutions 30, 60. Therefore, the oxide film can be formed using a very simple arrangement. However, the silicon substrate 11 is not necessarily immersed. It is sufficient if the oxidizing solution can react with the process-target substrate. For example, the substrate may be exposed to low-concentration or high-concentration vapor (oxidizing gas) of the oxidizing solution. In a case like this, it is sufficient if vapor of the aforementioned oxidizing solution is used.

The following will describe the present invention in more detail by way of manufacturing examples, which is by no means limiting the present invention.

Manufacturing Example 1

The formation of a 3.5-nm thick $SiO_2$ film by a chemical oxide film forming method involving 2-stage solution oxidation will be explained.

First, to form the first chemical oxide film (silicon dioxide film 41), the process-target substrate 2 was immersed in a 40% (wt.) aqueous solution of nitric acid without applying voltage. The porous $SiO_2$ film (first oxide film 4a; chemical oxide film) 41 with an atomic density of $2.22 \times 10^{22}$ atom/cm$^3$ was formed to a thickness of 1.1 nm.

Subsequently, to form the second chemical oxide film, the 40% (wt.) aqueous solution of nitric acid (boiling point 120.7° C.) was heated until the concentration reached the azeotropic concentration of 68% (wt.), with the substrate on which the silicon dioxide film 41 had been formed being left immersed in the aqueous solution. Thus, the $SiO_2$ film 42 with an atomic density of $2.34 \times 10^{22}$ atom/cm$^3$ was formed which was thicker than the first chemical oxide film (measuring 3.5 nm in total thickness).

In the first and second oxidation processes (the formation steps for the first and second chemical oxide films), the pores in the $SiO_2$ film (first chemical oxide film) formed in the first, 40% (wt.) aqueous solution of nitric acid provided sites where the nitric acid would decompose. That is, the porous $SiO_2$ film 41 of low atomic density presumably acted as a catalyst to promote the oxidation of the nitric acid, forming the $SiO_2$ film 42 (second chemical oxide film).

Figure 4:
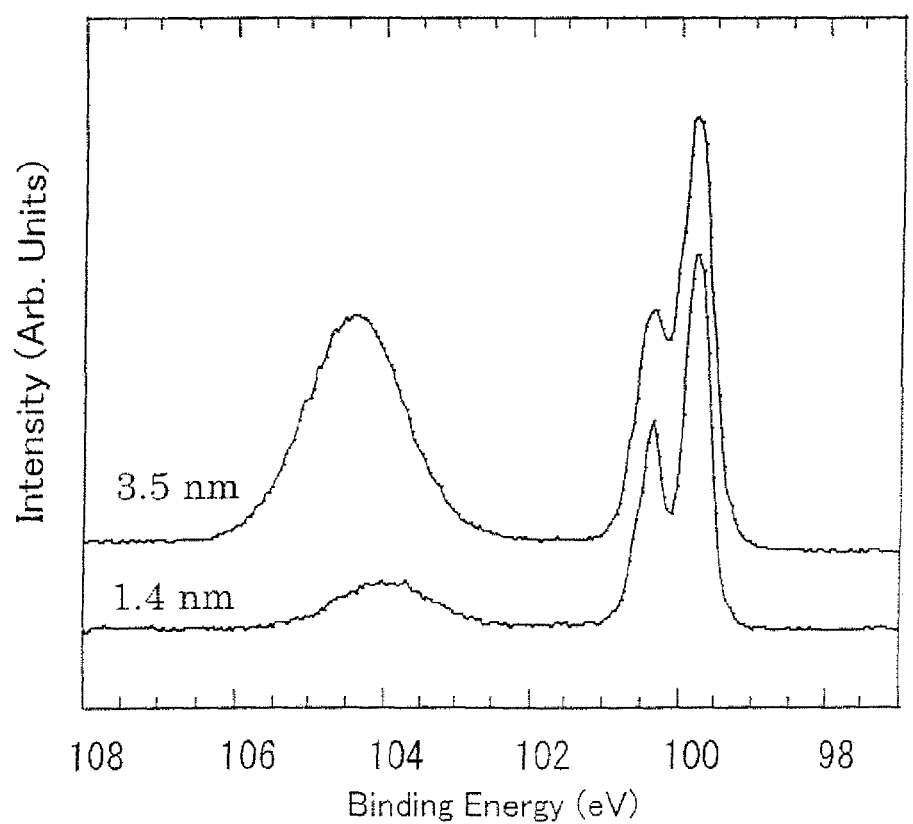
FIG. 4 is a representation of XPS spectrum for a gate oxide film ($SiO_2$ film) in a thin film transistor manufactured by 2-stage oxidation.

FIG. 4 is an XPS spectrum property diagram for the $SiO_2$ films 41, 42 (chemical oxide films) formed by the 2-stage nitric acid oxidation process. The two sharp peaks are attributed to photoelectrons released from the Si(2p) orbit of the silicon substrate. The wider peak is attributed to photoelectrons released from the $SiO_2$ films 41, 42. From these peaks' area/intensity ratios, the combined thickness of the $SiO_2$ films 41, 42 was calculated to be 3.5 nm.

In contrast to this, if no first chemical oxide film was formed, and if the silicon substrate was from the beginning immersed in the azeotropic aqueous solution of nitric acid (concentration: 68% (wt.)), i.e., under the same conditions as for the formation of the second chemical oxide film, a pore-less $SiO_2$ film with a high atomic density was formed. The thickness was as small as 1.4 nm.

Figure 5:
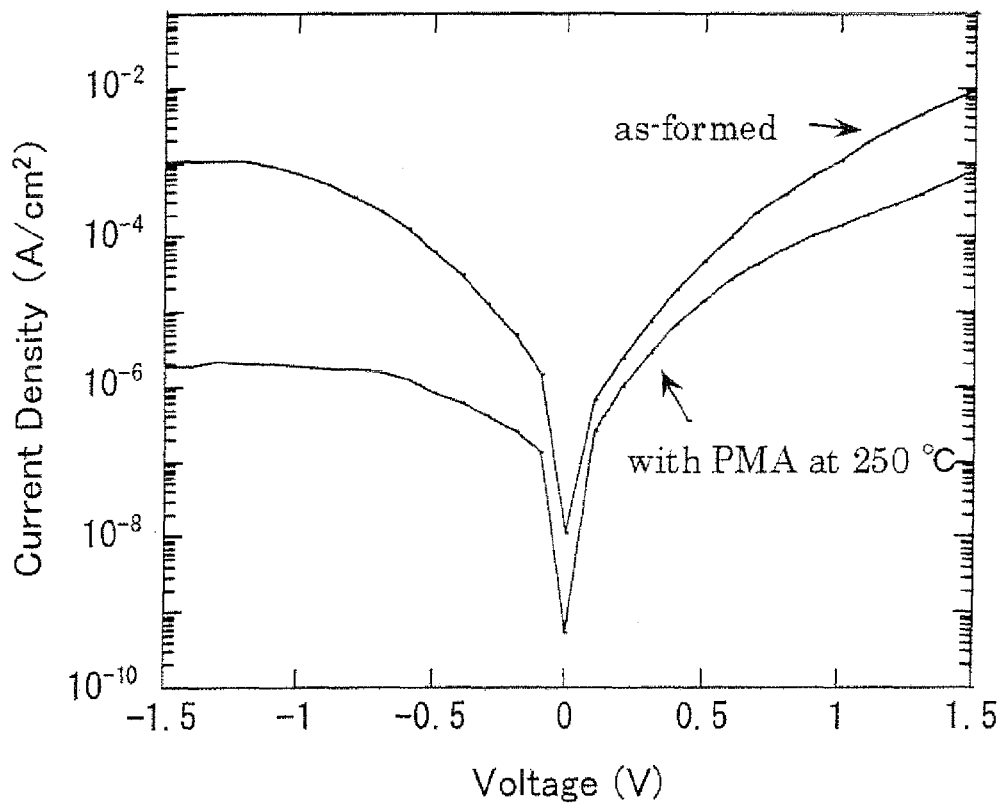
FIG. 5 is a representation of the I-V property of a thin film transistor containing a $SiO_2$ film as a gate oxide film manufactured by 2-stage oxidation.

FIG. 5 is a representation of I-V property for a MOS-structure diode containing the 3.5-nm thick $SiO_2$ films 41, 42 obtained by the 2-stage nitric acid oxidation process before and after a PMA process. The diagram shows that after a MOS-structure diode was subjected to a PMA process in a hydrogen atmosphere at 250° C., the leak current density was $1 \times 10^{-4}$ A/cm$^2$ and $2 \times 10^{-6}$ A/cm$^2$ for a 1-volt forward bias and a 1-volt reverse bias respectively. The leak current density had certainly decreased in comparison with the pre-PMA process values: $1 \times 10^{-3}$ A/cm$^2$ and $7 \times 10^{-4}$ A/cm$^2$ respectively.

Figure 6:
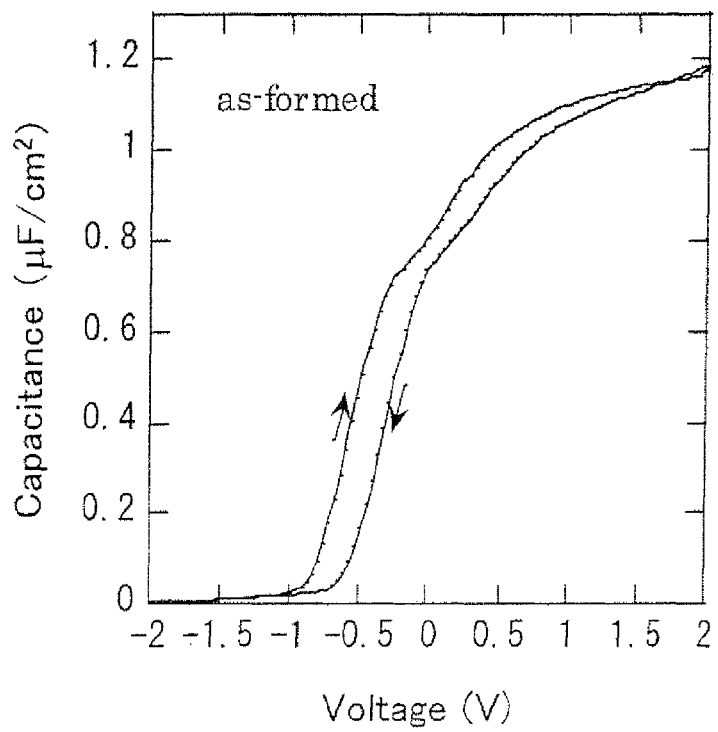
FIG. 6 is a representation of the C-V property of a thin film transistor manufactured by 2-stage oxidation.
Figure 7:
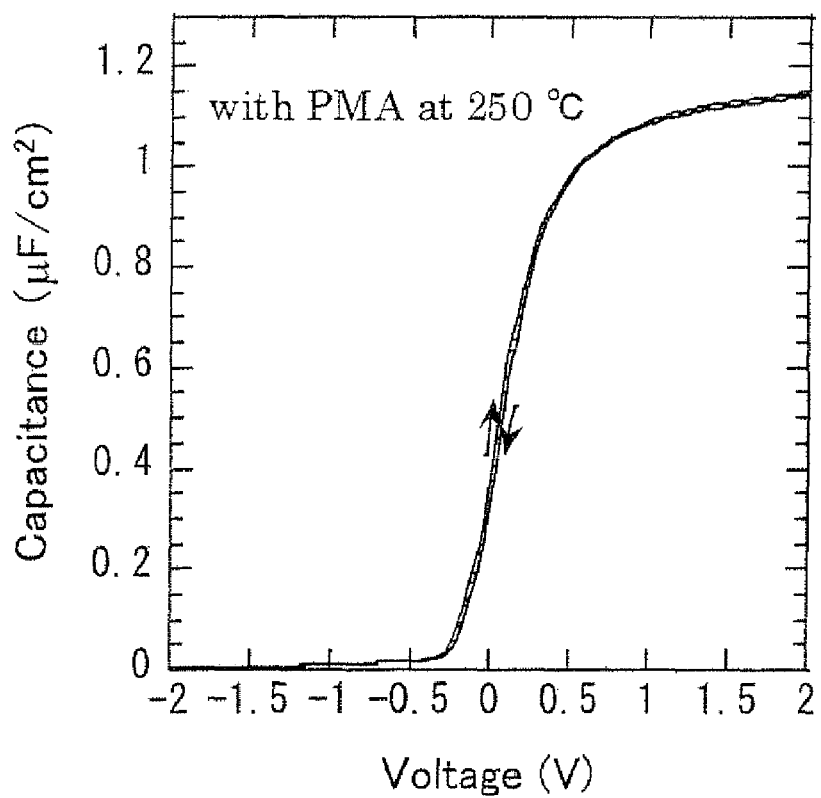
FIG. 7 is a representation of the C-V property of a thin film transistor manufactured by 2-stage oxidation.

FIG. 6 is a representation of C-V property for a MOS-structure diode containing the 3.5-nm thick $SiO_2$ films 41, 42 obtained by the 2-stage nitric acid oxidation process before a PMA process. The C-V property diagram shows a swell (of properties) due to interface energy levels and also hysteresis. A so-called PMA process in which the diode was heated as it was in an hydrogen atmosphere at 250° C. eliminated the swell completely and most of the hysteresis (FIG. 7).

In this example, the gate electrode 3 was formed on the 3.5-nm thick $SiO_2$ films 41, 42. The subsequent PMA process in which the sample was heated in a hydrogen atmosphere at 250° C. eliminated interface energy level and gap level in $SiO_2$. The band gap of the $SiO_2$ films 41, 42 then increased, which in turn markedly reduced leak current density. These phenomena improved the performance of the insulating film. This is not the only possibility. Experience tells that immersion in an aqueous solution of nitric acid for an extended period of time makes it possible to form the $SiO_2$ films 41, 42 with thickness in excess of this, up to a few tens of nanometers. In addition, performing the aforementioned PMA process at appropriately chosen temperature of a few hundred degrees Celsius (for example, 450° C.) improved the electrical properties of the MOS structure, especially, eliminated hysteresis, lowered leak current density, and improved insulation breakdown voltage tolerance.

Figure 8:
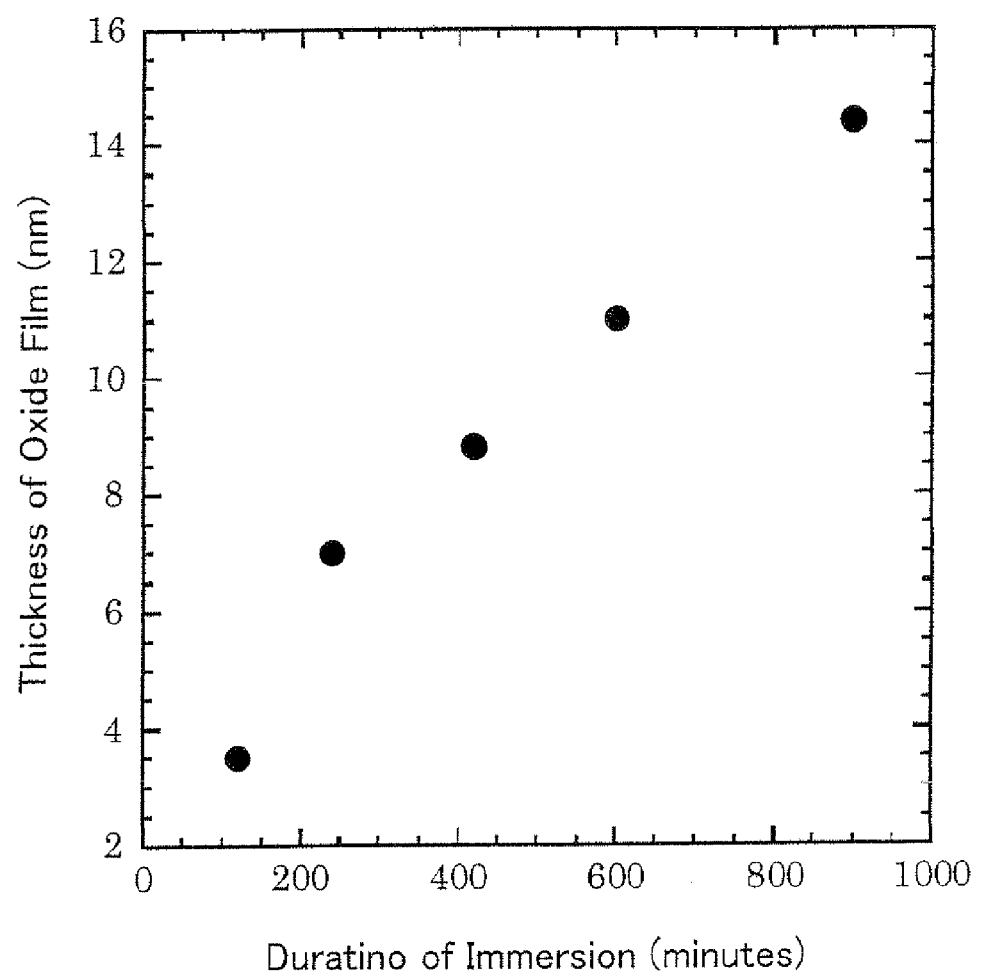
FIG. 8 is a representation of the growth in film thickness vs. time property of a gate oxide film ($SiO_2$ film) in a thin film transistor manufactured by 2-stage oxidation.

FIG. 8 is relationship between the duration of immersion in azeotropic nitric acid and the thickness of the $SiO_2$ films 41, 42. The first chemical oxide film was formed by immersing the silicon substrate 11 in a 40% (wt.) aqueous solution of nitric acid with no voltage being applied, to form the porous $SiO_2$ film (first chemical oxide film) 41 of a relatively low atomic density ($2.22 \times 10^{22}$ atom/cm$^3$) up to a thickness of 1.1 nm. Subsequently, the second chemical oxide film was formed by immersing the substrate 11 in an azeotropic aqueous solution of nitric acid (boiling point 120.7° C.; concentration 68% (wt.)) to form the $SiO_2$ films 41, 42. The thickness of the $SiO_2$ films 41, 42 increased substantially linearly with the immersion duration. The figure also shows that the $SiO_2$ films 41, 42 could be formed up to a thickness of 10 nm or beyond.

In addition, besides 2-stage change from low concentration to high concentration, the 2-stage nitric acid oxidation process mentioned above may be implemented in the following manner without departing from the scope of the present invention. The concentration may be increased gradually from low to high in many stages. The concentration may be increased continuously from low to high. For example, the substrate 11 may be immersed in a 40% (wt.) aqueous solution of nitric acid and heated so that it keeps boiling until it becomes an 68% (wt.), azeotropic aqueous solution of nitric acid (boiling point 120.7° C.).

Manufacturing Example 2

A second manufacturing example will be described in accordance with the present invention. To form TFTs from polycrystalline silicon on a substrate, a laminated silicon dioxide ($SiO_2$) film was used for the gate insulating film. Accordingly, similarly to that, a silicon dioxide film was formed on polycrystalline silicon on a substrate in the example (manufacturing example 2) (in other words, the silicon substrate 11 was a polycrystalline silicon substrate). The film was then used to fabricate a MOS capacitor (its capacitive insulating film).

In a case like this, it is suitable to form a silicon dioxide ($SiO_2$) film with a 2-stage nitric acid oxidation process on the surface of polycrystalline silicon on the substrate.

Figure 2:
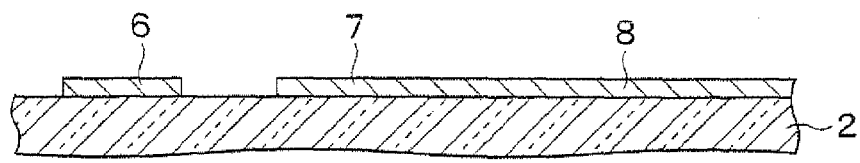
FIG. 2(a) is a cross-sectional view illustrating a manufacturing step for the thin film transistor in FIG. 1.
FIG. 2(b) is a cross-sectional view illustrating a manufacturing step for the thin film transistor in FIG. 1.
FIG. 2(c) is a cross-sectional view illustrating a manufacturing step for the thin film transistor in FIG. 1.
FIG. 2(d) is a cross-sectional view illustrating a manufacturing step for the thin film transistor in FIG. 1.
FIG. 2(e) is a cross-sectional view illustrating a manufacturing step for the thin film transistor in FIG. 1.
FIG. 2(f) is a cross-sectional view illustrating a manufacturing step for the thin film transistor in FIG. 1.
Figure 2:
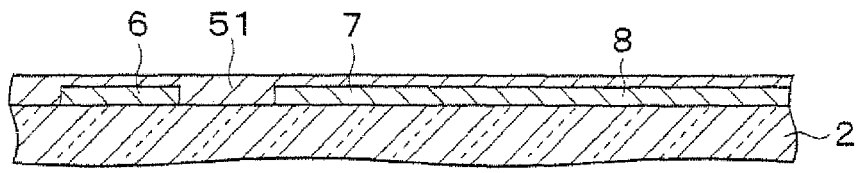
Figure 2:
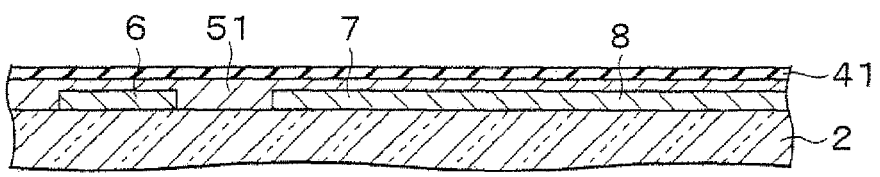
Figure 2:
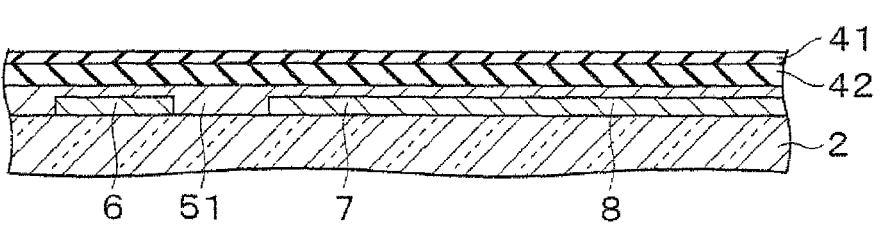
Figure 2:
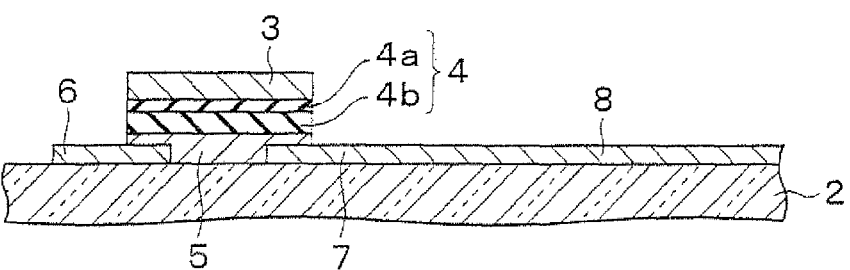
Figure 2:
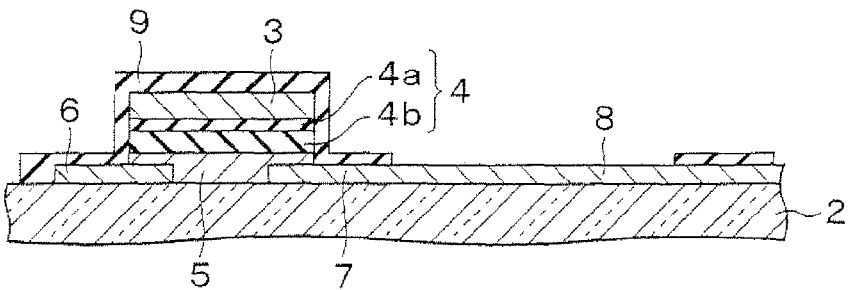

Similarly to manufacturing example 1 above (see FIG. 2($a$) to FIG. 2($f$)), first, as the formation of the first chemical oxide film, the polycrystalline silicon layer on the substrate was immersed (brought into contact with) in a 40% (wt.) aqueous solution of nitric acid with no voltage being applied, to form the $SiO_2$ film (chemical oxide film) 41 up to a thickness of 1.1 nm (FIG. 2($c$)).

Subsequently, as the formation of the second chemical oxide film, a polycrystalline silicon layer on the substrate carrying the first chemical oxide film ($SiO_2$ film 41) was immersed in (brought into contact with) a boiling azeotropic aqueous solution of nitric acid (concentration 68% (wt.); boiling point 120.7° C.) with no voltage being applied, to fabricate the second, thick chemical oxide film ($SiO_2$). The $SiO_2$ films 41, 42 (chemical oxide films) having a combined thickness of about 25 nm were thus formed uniformly (FIG. 2($d$)).

In a case like this, again, similarly to manufacturing example 1, throughout the oxidation processes in which the first and second chemical oxide films above were formed, the pores in the $SiO_2$ film (first chemical oxide film) formed in the first, 40% (wt.) aqueous solution of nitric acid provided sites where the nitric acid would decompose. That is, the porous $SiO_2$ film 41 (first chemical oxide film) of relatively low atomic density (the atomic density was about $2.22 \times 10^{22}$ atom/$cm^3$) acted as a catalyst to promote the oxidation of the nitric acid, forming the second chemical oxide film 42. As a result, the second chemical oxide film ($SiO_2$ film 42) was produced which had a little higher density (atomic density: about $2.34 \times 10^{22}$ atom/$cm^3$) than the first chemical oxide film and which was thicker than first chemical oxide film.

Subsequently, a film of material for the gate electrode 3 was provided on the silicon dioxide film (chemically oxidized $SiO_2$ film). Thereafter, the film was patterned into desired geometry to form the gate electrode 3. A MOS capacitor was thus manufactured (FIG. 2($f$)).

Each major property of the MOS capacitor obtained in manufacturing example 2 shows, similarly to manufacturing example 1, high performance and stability.

The oxidizing solution, as already mentioned in the example using an aqueous solution of nitric acid, may be at least one aqueous solution selected from the group consisting of an aqueous solution of perchloric acid which is a mixture of water and perchloric acid, an aqueous solution of sulfuric acid which is a mixture of water and sulfuric acid and, aqua regia, mixed solutions of these (including azeotropic mixtures).

In manufacturing example 2, the silicon dioxide films 41, 42 above (chemical oxide films; $SiO_2$ films) may be partly nitrided to a silicon nitride film of a thickness of 0.3 to 0.5 nm through nitriding, so that the resultant composite film may be used.

Manufacturing example 2 involved a MOS capacitor as an example. To form a gate insulating film for a MOS transistor, the gate insulating film in which the silicon dioxide film or nitrided silicon film obtained by nitriding the silicon dioxide film was used provided a high performance insulating film in which there were only relatively few interface energy levels, and could be used in, for example, large scale integrated circuits (LSIs) and charge coupling devices (CCDs). In addition, that gate insulating film can be used as an interlayer insulating film in a multilayer wiring structure formed using polycrystalline silicon electrode material, etc. as wiring. The gate insulating film can also be used as a capacitive insulating film in a memory such as a flash memory. Use in these fields is well expected.

Manufacturing example 2 is focused on an example in which the monocrystal silicon substrate is used as a process-target substrate to manufacture a MOS capacitor. The steps involved are also suited for use with polycrystalline (inclusive of fine crystal) silicon, amorphous silicon, or CG silicon (continuous grain silicon) on a glass or PET substrate in the manufacture of thin film transistors (TFTs). Especially, in manufacturing example 2 also, the formation of the chemical oxide film at temperatures as low as 200° C. or even lower is possible; therefore, the steps are suitable for use in the formation of TFTs in the manufacture of a flexible liquid crystal display.

The present embodiment has described the manufacture of a MOS capacitor using a polycrystalline silicon substrate as the silicon substrate 111 as an example. The steps explained there are of course applicable to monocrystal silicon substrates. They are also applicable to the thin film transistors (TFT) based on polycrystalline (inclusive of fine crystal) silicon or amorphous silicon on a glass or PET substrate. Especially, in the present embodiment, chemical oxide films can be formed at temperatures as low as 200° C. or even lower. The steps are therefore suited for use in the TFT formation in the manufacture of a flexible liquid crystal display.

In manufacturing example 2, in addition to the formation of the aforementioned silicon dioxide film 41, 42, a silicon nitride-containing film can be formed on the surface of the silicon dioxide film 15 by subjecting the surface to a silicon nitride-containing film formation process or nitriding in nitrogen plasma. It is also possible to form an insulating film such as a thick $SiO_2$ covering the silicon dioxide film 15 or the silicon nitride-containing film by CVD.

(2) Voltage Application Scheme

Voltage application is a method of applying voltage to the process-target substrate 2 (or polycrystalline silicon 51 (semiconductor)) on which the gate oxide film 4 is to be formed and immersing the substrate in a solution containing an active oxidizing species, to form the gate oxide film 4.

Figure 10:
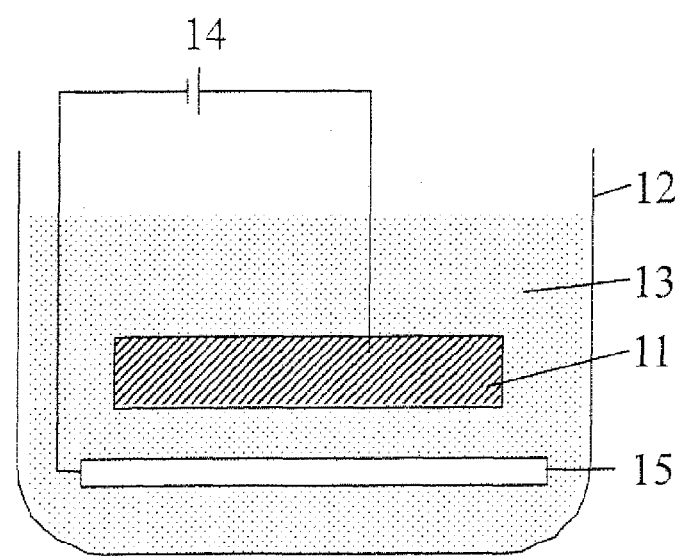
FIG. 10 is a schematic cross-sectional view of the structure of a major part of a manufacturing apparatus used in a voltage application scheme in accordance with an embodiment of the present invention.

Voltage application can be carried out in, for example, the device shown in FIG. 10. FIG. 10 is a cross-sectional view of the apparatus with which voltage application is implemented and here schematically depicts a apparatus in which a silicon dioxide film is formed as a chemical oxide film on the silicon substrate 11 which is the process-target substrate 2. The apparatus is arranged so that when the silicon substrate 11 is connected to the power supply 14 with the process-target silicon substrate 11 being immersed in an oxidizing solution 13 in the processing container 12, a predetermined voltage is applied across the silicon substrate 11 and an opposite electrode 15 disposed in the processing container 12. In other words, the manufacturing apparatus has an oxide film forming section which implements a formation method performing an oxide film forming step through voltage application explained below.

The oxide film forming steps of a voltage application scheme is carried out by applying voltage to the process-target substrate 2 in FIG. 1 and FIG. 2 on which the gate insulating film 4 is to be formed. For example, if the process-target substrate 2 is electrically insulating, voltage is applied to the semiconductor layer 5. If the process-target substrate 2 is electrically conductive, voltage is applied to the process-target substrate 2. Hence, the gate oxide film 4 is formed on the surface of the gate electrode 3. If the process-target substrate 2 is electrically conductive, the conductive substance is made of a substance which forms an oxide in an oxidizing solution, the gate oxide film 4 is formed also on the surface of the process-target substrate 2.

Now, the voltage application scheme will be described in more detail by way of concrete examples. In the voltage application scheme, the process-target substrate 2 (silicon substrate 11) processed in the FIG. 2(b) step is rinsed (washed) for 5 minutes in ultrapure water. After that, the silicon substrate 11 is immersed a solution (oxidizing solution) which has strong oxidation effect even at low concentrations. The solution fills a processing container 12 shown in FIG. 10. The power supply 14 applies a 10-volt positive voltage across the silicon substrate 11 and the opposite electrode 15 disposed in the processing container 12 at room temperature for about 10 minutes. Here, as the oxidizing solution, a 1-mole (mol./l) aqueous solution of nitric acid is used. As shown in FIGS. 2(c) and 2(d), The silicon dioxide films 41, 42 of a thickness of about 10 nm are formed uniformly across the polycrystalline silicon 51. Here, due to the voltage application to the process-target substrate 2, the source electrode 6, the drain electrode 7, and the polycrystalline silicon 51 also receives voltage.

Conditions in applying voltage to the process-target substrate 2 are chosen considering the temperature when the heating temperature is set to 200° C. or below. As an example, the conditions may be chosen so that the process-target substrate 2 is placed at a positive few tens of volts (100 volts DC) in an electrode layout with which a uniform electric field is produced across the surface of the process-target substrate 2, for example, between the process-target substrate 2 and an opposite electrode parallel to the substrate 2. In the case of the 1-mole (mol./l) aqueous solution of nitric acid, the conditions may be suitably specified in a range of DC 5 to 20 V. With such voltage application, even if O⁻, OH⁻, and other negative ions or radicals of an active oxidizing species are attracted into the surface of the polycrystalline silicon 51 to form a silicon dioxide film 41, the ions or radicals pass through it and accelerate the oxidation reaction uniformly across the surface of the polycrystalline silicon 51. Thus, the silicon dioxide film 42 is produced on the surface of the polycrystalline silicon 51.

The conditions in applying voltage to the process-target substrate 2, by applying a negative potential to this, can prevent the oxidizing species from being attracted into the surface of the polycrystalline silicon 51. When no voltage is being applied to the process-target substrate 2 (that is, the application voltage value is 0), a suitable negative voltage should be again applied to stop the growth of a chemical oxide film on the surface of the polycrystalline silicon 51, because the oxidizing species diffused onto the surface of the polycrystalline silicon 51 causes the silicon dioxide film 42 to grow on the surface of the polycrystalline silicon 51. This will be effectively work if performed when the process-target substrate 2 is pulled (cut off) out of the oxidizing solution 13 in the processing container 12 after the growth of the silicon dioxide film 42 on the surface of the polycrystalline silicon 51 is finished.

Subsequently, a film of a gate electrode material is formed on the silicon dioxide film 41. Here, as the gate electrode material, an aluminum alloy containing 1 wt. % silicon is deposited to a thickness of about 200 nm by well-known resistance heating vapor deposition (hereinafter, this kind of metal film electrode will be simply referred to as an Al electrode). The gate electrode material is by no means limited to an Al electrode. For example, this gate electrode material may be replaced with a deposited polycrystalline silicon electrode (material).

Thereafter, as in FIG. 2(e), the gate electrode material is patterned to desired geometry to form a resist in a gate pattern.

Finally, a silicon nitride thin film is formed by P-CVD. Those portions of the silicon nitride thin film which sit over the pixel electrode 8 and a terminal pad (not shown) are removed by photolithography and dry etching to form the protection film 9, which completes the fabrication of the thin film transistor 1. See FIG. 2(f). The thin film transistor manufactured as above is a MOS transistor.

Next, the properties of the MOS transistor manufactured as above will be described.

Figure 11:
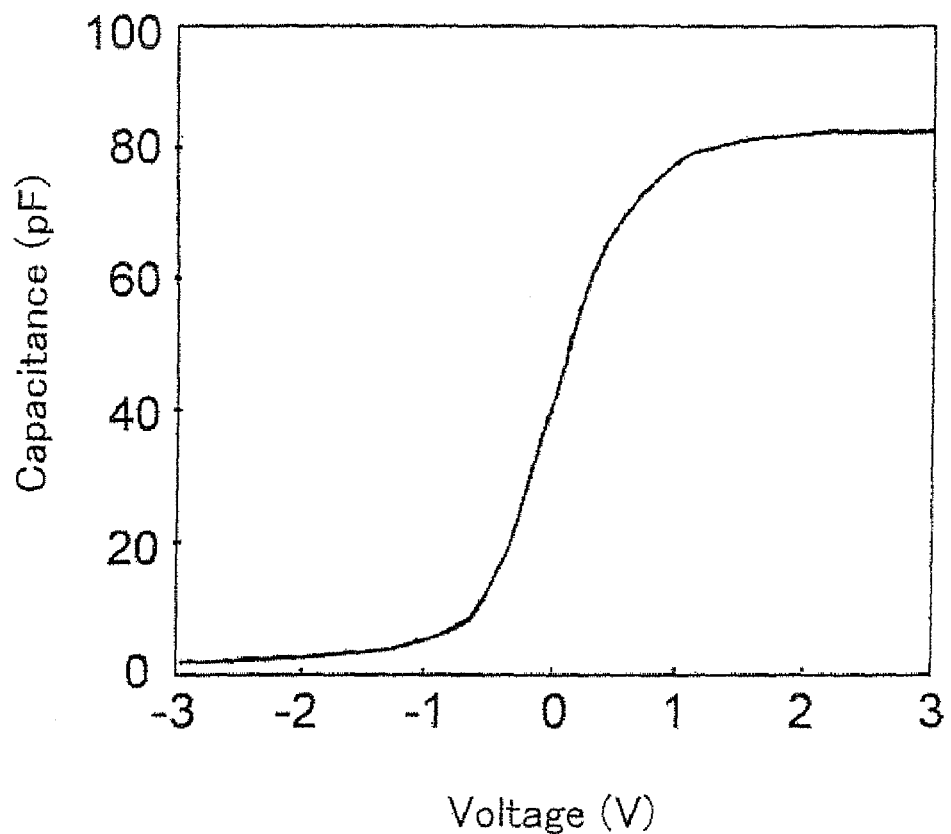
FIG. 11 is a graphical representation of the relationship between capacitance (C) and voltage (V) in a thin film transistor manufactured by a voltage application scheme.

FIG. 11 shows a relationship between electrostatic capacitance (C) and applied voltage (V), or a so-called representation of C-V property, for a MOS transistor obtained by a voltage application scheme. As observable from the property diagram, applying a positive voltage to the gate electrode 3 induces an inverted layer at the interface between the chemical oxide film and the semiconductor layer, thereby providing stable capacitance (electrostatic capacitance).

The MOS capacitor thus formed, as can be seen from the C-V property diagram in FIG. 11, has the same or less level of leak current density than the MOS capacitor containing as a gate insulating film the silicon dioxide film formed by an ordinary high temperature thermal oxidation method. The performance has certainly improved.

In the foregoing description, the oxidizing solution or oxidizing gas was a 1-mole aqueous solution of nitric acid as an example. The solution may be replaced with nitric acid at least one solution selected from the group consisting of perchloric acid, sulfuric acid, ozone-dissolving water, aqueous hydrogen peroxide, a mixed solution of hydrochloric acid and aqueous hydrogen peroxide, a mixed solution of sulfuric acid and aqueous hydrogen peroxide, a mixed solution of aqueous ammonia and aqueous hydrogen peroxide, and a mixed solution of aqua regia of sulfuric acid and nitric acid, all of a given concentration, and boiling water with oxidation effect; a gas thereof; or a mixture thereof. In other words, these oxidizing solutions and oxidizing gases may be used alone or as a mixture. The oxidizing solutions and oxidizing gases are generate a oxidizing species with strong oxidation effect: for example, ions of oxygen, such as oxygen ions, water oxide ions, and peroxide ions, and radicals. Therefore, by designating as the anode the process-target substrate 2 on which the silicon dioxide films 41, 42 are to be formed, these oxidizing species can be introduced to the surface of the polycrystalline silicon 51 (interface between the polycrystalline silicon 51 and the silicon dioxide film 42) even after the silicon dioxide film 41 is formed.

It is preferable if an aqueous solution of nitric acid is used as the oxidizing solution. Even if the concentration of the nitric acid is as low as from 1 to 65% (weight ratio; hereinafter, "wt."), the oxidizing solution has strong oxidation effect on silicon. Even with no voltage being applied to the silicon substrate 11, the solution is suitable in forming the aforementioned silicon dioxide films 41, 42.

In addition, the oxidizing solution of a high concentration, especially, an aqueous solution of nitric acid of a higher concentration than 65% (wt.), for example, 68% (wt.) or more (azeotropic concentration), has extremely strong oxidation effect on silicon. Even with no voltage applied to the process-target substrate 2, the uniform silicon dioxide films 41, 42 are formed. In this aqueous solution of nitric acid, if the heating temperature is kept at 120.7° C. (so-called azeotropic temperature or above), the nitric acid and water shows azeotropy. The solution and vapor (that is, gas) have a constant concentration. The growth of the silicon dioxide films 41, 42 can be controlled with time.

They have strong oxidation effect in vapor form (in other words, oxidizing gas). Even if the vapor is reacted with no voltage being applied to the silicon substrate 11, the silicon dioxide films 41, 42 can be formed on the surface of the process-target substrate 2 (to be more specific, the surface of the polycrystalline silicon 51). In a case like this, the temperature of the process-target substrate 2 can be suitably chosen. However, the rate of formation of the silicon dioxide films 41, 42 can be increased by applying voltage to the process-target substrate 2 to form the silicon dioxide films 41, 42.

Among the oxidizing solutions or gases thereof, if the oxidizing solution of a high concentration or oxidizing gas is at least one selected from the group consisting of azeotropic nitric acid which is an azeotropic mixture of nitric acid and water, azeotropic sulfuric acid which is an azeotropic mixture of sulfuric acid and water, and azeotropic perchloric acid which is an azeotropic mixture of perchloric acid and water, all used in the present embodiment, the solution or gas has especially strong oxidation effect and especially suitable for forming an oxide in the present invention. With these azeotropic mixtures, even if the applied voltage to the process-target substrate 2 is low (even if the applied voltage is zero), the oxide film forming step and the performance of the obtained silicon dioxide films 41, 42 are both stable.

As described above, in the voltage application scheme, it is preferable if the oxidizing solution or a gas thereof is an azeotropic mixture of azeotropic concentration. It is more preferable if the solution or a gas is an azeotropic mixture with water. It is even more preferable if the solution or a gas is at least one solution or a gas thereof selected from the group consisting of azeotropic nitric acid which is an azeotropic mixture with water, azeotropic sulfuric acid which is an azeotropic mixture with water, and azeotropic perchloric acid which is an azeotropic mixture with water. Further, it is especially preferable if the oxidizing solutions of these azeotropic mixtures or gases thereof are heated to or beyond azeotropic temperature before reacting with the semiconductor.

In the foregoing description, in the oxide film forming step of the voltage application scheme, the silicon dioxide films 41, 42 are formed using an aqueous solution of nitric acid of one concentration. Oxidizing solutions, such as nitric acid, of different concentrations, or gases thereof may be applied. In a case like this, it is preferable if the oxidizing solutions or gases are azeotropic mixtures.

In other words, step 1 of reacting an oxidizing solution below azeotropic concentration or a gas thereof with the polycrystalline silicon 51 to form the first silicon dioxide film (first chemical oxide film) 41 on the surface of the polycrystalline silicon 51 and step 2 of reacting an oxidizing solution of azeotropic concentration or a gas thereof with the first silicon dioxide film 41 to form the second, thicker silicon dioxide film (second chemical oxide film) 42 than the first silicon dioxide film 41 may be implemented, where at least one of steps 1 and 2 is the foregoing oxide film forming step of the voltage application scheme (in other words, the first or second chemical oxide film is formed on the silicon substrate surface by reacting the oxidizing solution or a gas thereof with the silicon substrate while voltage is being applied to the silicon substrate). In other words, at least one of steps 1 and 2 of the 2-stage oxidation may be implemented by way of an oxide film forming step of a voltage application scheme.

Accordingly, similarly to the oxide film forming step of the aforementioned 2-stage oxidation scheme, a high quality chemical oxide film of a desired thickness can be formed uniformly across the silicon substrate surface at low temperature and low voltage. In other words, the quality of the silicon dioxide films 41, 42 can be improved. The leak current density, high quality silicon dioxide films 41, 42 can be formed. Therefore, for example, even if the silicon dioxide film is used as the gate insulating film 4, the silicon dioxide film functions as a high quality insulating film. It is thus possible to thin down the present insulating film (for example, to a few nanometers or less).

Further, especially, since step 1 involves an oxidizing solution below azeotropic concentration or a gas thereof, and step 2 involves an oxidizing solution of azeotropic concentration or a gas thereof, the first silicon dioxide film is a chemical oxide film with a lower atomic density than the second silicon dioxide film. In other words, in step 1, the porous, first silicon dioxide film 41 is formed. In step 2, the second silicon dioxide film 42 is formed by an oxidizing solution or a gas thereof reacting in the pores in the first silicon dioxide film 41 formed in step 1. That is, the porous, low-atomic density, first silicon dioxide film 41 acts as catalyst, enabling the oxidation reaction (formation of the second silicon dioxide film 42) to proceed gradually. Accordingly, the higher quality silicon dioxide films 41, 42 can be formed.

In steps 1 and 2, two types of oxidizing solutions or gases thereof, one with low concentration (preferably, below azeotropic concentration) and another with high concentration (preferably, of azeotropic concentration), may be prepared to form the first and second silicon dioxide films. Alternatively, the concentration may be gradually changed from low concentration to high concentration in many stages (oxidizing solutions or gases thereof of two or more concentrations may be prepare). Alternatively, the concentration may be continuously increased from low concentration to high concentration. For example, if an oxidizing solution below azeotropic concentration is heated until it reaches the azeotropic concentration, and maintained in that heated state, the oxidizing solution and its vapor show an invariable composition. Accordingly, the growth of the chemical oxide film can be controlled with time. Therefore, the formation of the silicon dioxide film (thickness, quality, etc.) can be controlled more precisely.

In the voltage application scheme, the voltage application to the silicon substrate 11 contributes to the increasing of the rate of formation of the silicon dioxide film 41, 42 on the silicon substrate 11 and the increasing the film thickness. By applying voltage to the process-target substrate 2, $O^-$, $OH^-$, and other anions or radicals which are the oxidizing species in the solution are attracted to the surface of the polycrystalline silicon 51. After the formation of the silicon dioxide film 41, those anions and radicals readily pass through the silicon dioxide film 41 to reach the surface of the polycrystalline silicon 51. Thus, the voltage application increases the oxidation reaction rate, and the silicon dioxide film 42 becomes thick.

It is preferable in the voltage application scheme also if the silicon dioxide films 41, 42 are subjected to a nitriding step where they are nitrided. An example of the nitriding step is to form a silicon nitride-containing silicon dioxide film (nitrided chemical oxide film) in a nitrogen-containing gas, especially by plasma nitriding, by nitriding a part of the surface of the silicon dioxide film 41,42 to silicon nitride. Another example is to form a thick insulating film of $SiO_2$ or another material (oxide film) atop the silicon nitride-containing film by CVD after the aforementioned nitriding. Accordingly, the silicon dioxide films 41, 42 are films of silicon nitride and silicon dioxide (nitrided chemical oxide film). This nitriding improves insulation breakdown and electric charge trap properties of the chemical oxide films.

In the voltage application scheme, a high dielectric film, such as, hafnium oxide or aluminum oxide, may be laminated on the aforementioned silicon dioxide ($SiO_2$) film 41 to form a composite film which is suitable for use as the gate insulating film 4 in the MOS transistor. Transistor properties improve (less leak current, higher mobility due to lowered interface energy level, etc.) with such a composite film when compared with the use of a high dielectric film alone. The silicon dioxide films 41, 42 under the high dielectric film (on the side of the process-target substrate 2) may be ultrathin: for example, 1 nm or even less. Also, the films 41, 42 may be formed without voltage application. If the silicon dioxide film 41, 42 formed by ordinary thermal oxidation is about 1 nm thick, the film 15 is not applicable in practical use where there is large leak current or high interface energy level, because of its the film quality.

In contrast, the silicon dioxide ($SiO_2$) films 41, 42 of the present embodiment are of high quality. The silicon dioxide films 41, 42 are suitable for use in the composite film of layered structure when the films 41, 42 are topped by a thick insulating film. In other words, the films 41, 42 are suitable for use as the gate insulating film 4 in MOS transistors. Further, the silicon dioxide films 41, 42 of the present embodiment is similarly applicable to a gate insulating film formed by laminating ferroelectric films, as well as to high dielectric films.

The voltage application scheme is described in the above by way of an example where the process-target substrate 2 on which the silicon dioxide films 41, 42 are formed is the monocrystal silicon substrate 11 to manufacture a MOS capacitor. The steps are applicable to cases where thin film transistors (TFTs) are formed using polycrystalline (inclusive of fine crystal) silicon, amorphous silicon, or CG silicon (continuous grain silicon) on a glass or PET substrate.

Further, in the present embodiment, since the silicon dioxide films 41, 42 are uniform, the process-target substrate 2 and the polycrystalline silicon 51 (semiconductor layer 5) are not necessarily planar. The substrate 2 and silicon 51 may have three-dimensional, spherical, curved, or otherwise irregular geometry. Those irregular or curved parts may be used as transistor channels. In other words, according to the method, high quality insulating films, such as the silicon dioxide films 41, 42 formed, can be uniformly formed in accordance with the irregular or curved surface of the process-target substrate 2 or the polycrystalline silicon at low temperature.

Further, the steps are by no means limited to cases where thin film transistors are manufactured as semiconductor devices. In the present embodiment, thin film transistors are taken as an example. When a gate insulating film is formed for thin film transistors (TFTs), the laminated silicon dioxide film or the laminated silicon dioxide film with a silicon nitride-containing film in the middle of it provides a high performance insulating film with low interface energy level and hence high performance TFTs. Those laminated silicon dioxide films are applicable to large scale integrated circuits (LSIs) and charge coupling devices (CCDs). The films can also be used as an interlayer insulating film in a multilayer wiring structure formed using polycrystalline silicon electrode material, etc. as wiring. The films can also be used as a capacitive insulating film in a memory, such as a flash memory. Use in these fields is well expected.

The present embodiment is focused on an example in which monocrystal silicon substrate is used as a process-target substrate to manufacture thin film transistors. The steps involved are also suited for use with polycrystalline (inclusive of fine crystal) silicon, amorphous silicon, CG silicon (continuous grain silicon), silicon carbide, or silicon germanium on a glass or PET substrate in the manufacture of thin film transistors (TFTs). Especially, silicon carbide is highly useful, because it offers fast switching speed and suitable for use in TFTs.

In the present embodiment. DC voltage is applied to the process-target substrate 2. AC voltage may be applied instead. When this is the case, a silicon dioxide film can be formed similarly to the case of DC voltage by pulse control. Pulse control also makes it possible to control the thickness of the silicon dioxide film to be formed.

In the foregoing description, the gate electrode material is made of aluminum. Examples of films containing metal atoms include films containing metal atoms selected from the group consisting of aluminum, magnesium, nickel, chromium, platinum, palladium, tungsten, titanium, and tantalum. Preferable films containing metal atoms are those containing active metal atoms: for example, metal films of aluminum, magnesium, and nickel and alloy films of silicon-containing aluminum, The film containing metal atoms may be a compound, such as titanium nitride or tantalum nitride.

The voltage application scheme differs from conventional anodization as follows:

Conventionally, anodization is carried out as a method to form an oxide film on a semiconductor surface while voltage is being applied to the semiconductor. Anodization is a method of forming an oxide film on a semiconductor surface by the electric field accelerating the movement of ions of semiconductor components in an electrolyte which does not dissolve the oxide film.

For example, to form a $SiO_2$ film on a Si substrate by anodization, voltage is applied to the Si substrate to introduce $Si^+$ ions from the Si substrate surface to the $SiO_2$ film. Then, the $Si^+$ ions are released from the Si substrate and transmitted through the $SiO_2$ film formed, so as to introduce the released $Si^+$ ions to the $SiO_2$ film surface. Then, the $Si^+$ ions on the $SiO_2$ film surface are oxidized to form a $SiO_2$ film on the $SiO_2$ film surface. That is, in anodization, the growth of the $SiO_2$ film occurs on the $SiO_2$ film surface. In other words, in anodization, oxidation reaction occurs on the $SiO_2$ film surface by introducing $Si^+$ ions to the $SiO_2$ film surface.

In contrast, in the method of forming an oxide in accordance with the present invention (the present forming method), in cases where an oxidizing solution or a gas thereof with strong oxidation effect (high oxidizing solution or gas thereof) is used to form, for example, a $SiO_2$ film on a Si substrate, voltage is applied to the Si substrate to enable the oxidizing solution to generate active species (oxidizing species), such as dissociated oxygen ions ($O^-$) and oxygen atoms, on the Si substrate surface. The active species move to the $SiO_2$/Si substrate interface and react with the Si substrate at the interface to form a $SiO_2$ film. As described above, in the present forming method, oxidizing species, such as $O^-$ ions and oxygen atoms, are introduced to the Si substrate surface (interface between the Si substrate and the $SiO_2$ film) by applying voltage to the Si substrate. Therefore, after the formation of the $SiO_2$ film, the ions or radicals of the oxidizing species oxidize Si on the Si substrate surface (the interface between the Si substrate and the $SiO_2$ film) to form a $SiO_2$ film. That is, the growth of the $SiO_2$ film occurs at the Si substrate surface (interface between the Si substrate and the $SiO_2$ film), not on the $SiO_2$ film surface. In other words, in the present forming method, oxidation reaction occurs at the Si substrate surface (interface between the Si substrate and the $SiO_2$ film) by introducing the ions or radicals of the oxidizing species to the Si substrate surface (interface between the Si substrate and $SiO_2$ film).

As described above, in the present forming method, oxidation reaction occurs at the semiconductor surface (interface between the semiconductor and the chemical oxide film). In anodization, oxidation reaction occurs at the oxide film surface. Therefore, the present forming method differs from anodization in the site of growth of the chemical oxide film. In other words, in anodization, the oxide film is formed at the interface in the direction going away from the substrate. In the present forming method, the chemical oxide film is formed at the interface toward the substrate. That is, the interface between the Si substrate and the silicon dioxide film, as oxidation reaction proceeds, moves toward the bulk silicon and hence is always clean. Therefore, in the present forming method, good interface properties are obtained.

In anodization, ions of semiconductor components to be oxidized need to be released from the semiconductor surface. Further, the semiconductor component ions need to be introduced to the oxide film surface. To this end, high voltage is needed. In contrast, in the present forming method, a chemical oxide film grows at the semiconductor surface (interface between the semiconductor and the chemical oxide film). There is no need for the semiconductor surface to release ions of semiconductor components to be oxidized. Therefore, the present forming method can form a chemical oxide film at lower voltage than anodization.

In Tokukaihei 3-6826, to form an oxide film on the silicon substrate surface at low voltage, an oxide film is formed after forming a porous oxide film. In other words, in Tokukaihei 3-6826, it is essential to form a porous oxide film. In addition, the quality of the formed oxide film is insufficient.

In contrast, in the present forming method, a chemical oxide film can be formed on the semiconductor surface without forming such a porous oxide film.

In addition, in conventional anodization, a porous silicon substrate is used to let oxidation reaction proceed at low voltage.

In contrast, in the present forming method, a porous processing substrate (for example, a porous silicon substrate) is not necessarily used because an oxidizing solution or vapor thereof with strong oxidation effect is used.

The following will further describe the voltage application scheme in detail by way of a manufacturing example. This is by no means limiting the present invention.

Manufacturing Example 3

Next, an example will be shown where the silicon dioxide films 41, 42 are formed on the silicon substrate 11 by a voltage application scheme using nitric acid as the oxidizing solution.

An n-type, (100) silicon wafer was washed by a well-known RCA washing method. The wafer had a resistivity of about 10 Ωcm. After that, an ohmic contact electrode was provided on a part of the wafer surface. The wafer was immersed in a 1-mole (mol./l) aqueous solution of nitric acid ($HNO_3$) at room temperature (25° C.). A voltage between 5 V to 20 V was applied from the variable power supply 14 across the wafer and a platinum reference electrode of the opposite electrode 15 to form the silicon dioxide ($SiO_2$) films 41, 42 on the wafer surface.

Figure 12:
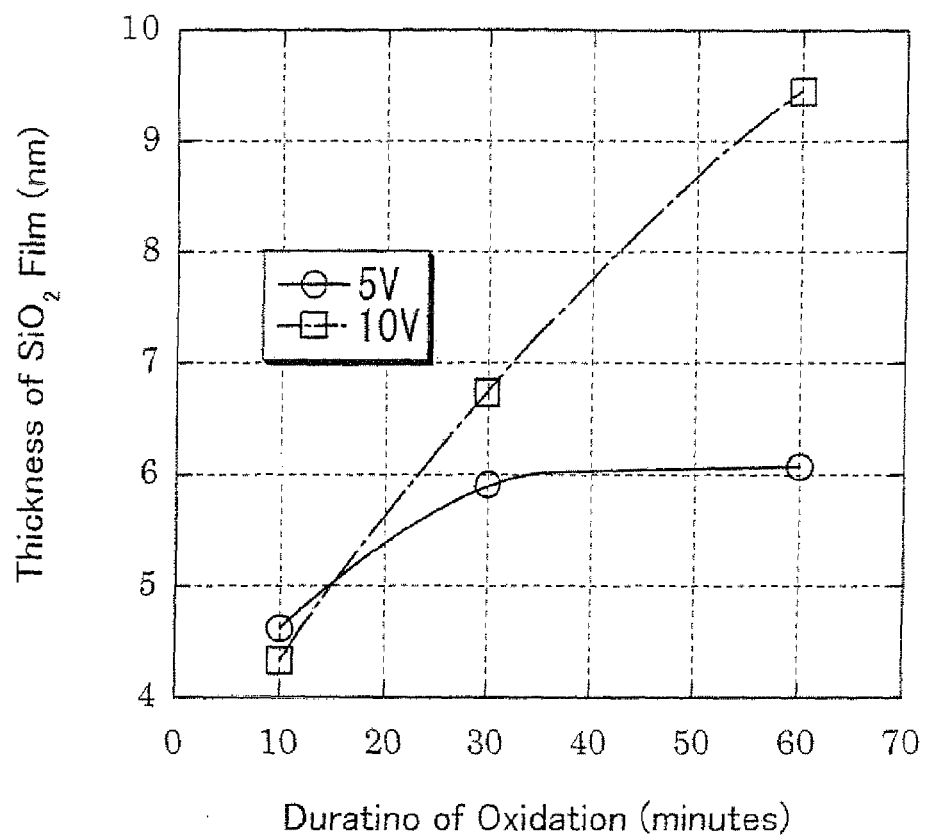
FIG. 12 is a graphical representation of the relationship between growth in film thickness and time for a gate oxide film ($SiO_2$ film) in a thin film transistor manufactured by a voltage application scheme.

FIG. 12 is a representation of growth in film thickness vs. time property for the $SiO_2$ films 41, 42 showing a relationship between the process duration (minutes) and the thickness (nm) of the $SiO_2$ films 41, 42 with the applied voltage as a parameter. When the applied voltage was 5 V, the $SiO_2$ film thickness grew parabolically with the process duration. This demonstrates that the diffusion of $O^-$, $OH^-$, and other anions or radicals, which were oxidizing species, was the limiting factor for the growth of the $SiO_2$ film 41, 42. When the applied voltage was 10 V, the thickness of the $SiO_2$ films 41, 42 grew linearly with process duration. This demonstrates that the reaction was the limiting factor. In other words, when the applied voltage was high, $O^-$, $OH^-$, and other anions or radicals, which were oxidizing species, were induced to move to the $SiO_2$/Si interface (interface between the silicon dioxide films 41, 42 and the polycrystalline silicon 51). As a result, the oxidation reaction at the interface limited the growth. In either case, the $SiO_2$ film 42 was a chemical oxide film grown by oxidation reaction at the $SiO_2$/Si interface (surface of the polycrystalline silicon 51).

According to this manufacturing example, when the applied voltage to the process-target substrate 2 is set to 10 V, the relationship between the thickness of the $SiO_2$ films 41, 42 and the duration is substantially linear. It is also substantially possible to form the $SiO_2$ films 41, 42 up to a thickness of 20 nm to 30 nm by extending the duration.

Figure 13:
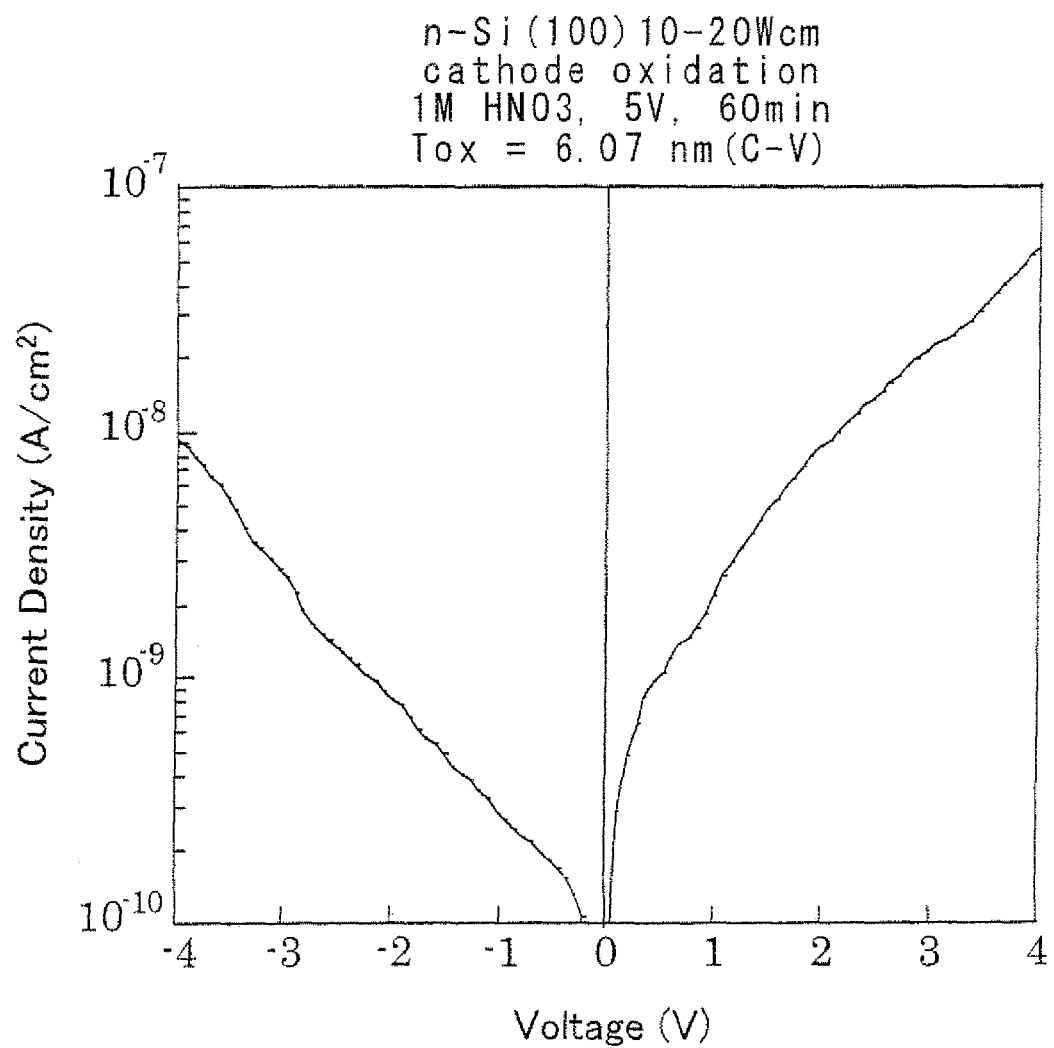
FIG. 13 is a graphical representation of the relationship between current and voltage in a thin film transistor manufactured by a voltage application scheme.

FIG. 13 is a current-voltage (I-V) property illustration for a MOS diode in a case of a $SiO_2$ film obtained as a thin film transistor (MOS diode (capacitor)) having a Al/$SiO_2$/Si (100) structure with a 5-V voltage applied for 60 minutes (process duration) after an aluminum electrode (gate electrode 3) measuring 0.3 mm in diameter was formed on the $SiO_2$ films 41, 42. The thickness of the $SiO_2$ films 41, 42 was measured by a capacitance-voltage (C-V) scheme, assuming that the $SiO_2$ films 41, 42 had a dielectric constant of 3.9. The measurement was about 6.1 nm. If voltages of 4 V and −4 V were applied to the gate electrode on the $SiO_2$ films 41, 42, the leak current densities were $8\times10^{-8}$ $A/cm^2$ and $9\times10^{-9}$ $A/cm^2$ respectively. These figures were relatively low, considering the fact that the $SiO_2$ films 41, 42 were formed at room temperature.

Figure 14:
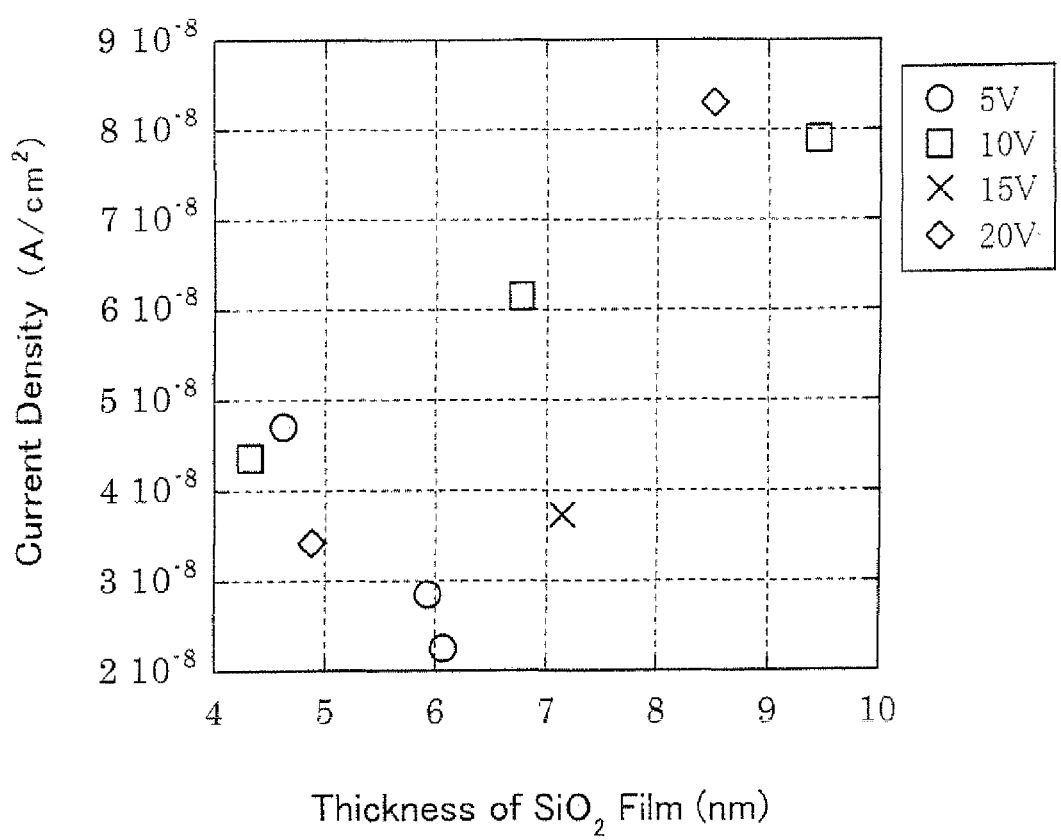
FIG. 14 is a graphical representation of the correlation between leak current density and $SiO_2$ film thickness in a thin film transistor manufactured by a voltage application scheme.

FIG. 14 is a correlation diagram obtained by randomly plotting relationship between leak current density and $SiO_2$ film thickness for a thin film transistor with respect to the $SiO_2$ films formed with respective applied voltages of 5 V, 10 V, 15 V, and 20 V. The electric field strength in the $SiO_2$ films were set to 5 MV/cm. Throughout the entire range of the observed film thickness, the leak current density was $1\times10^{-7}$ $A/cm^2$ or less.

Figure 15:
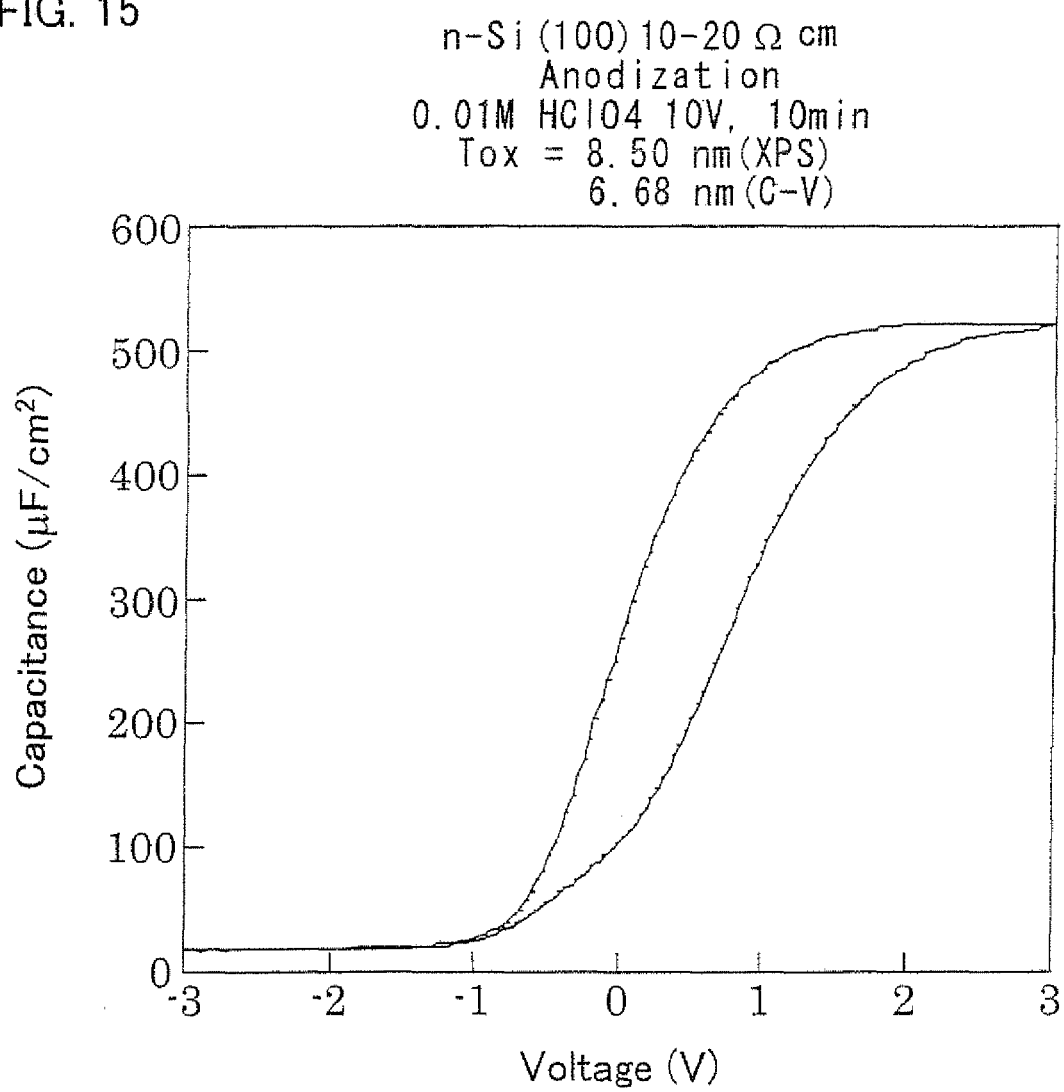
FIG. 15 is a graphical representation of the relationship between current and voltage and the relationship between capacitance and voltage, in a thin film transistor manufactured by a voltage application scheme.

FIG. 15 is a representation of I-V and C-V properties for a thin film transistor including the $SiO_2$ films 41, 42 formed by applying 10-V voltage to the process-target substrate 2 for 10 minutes in a 0.01-mole aqueous solution of perchloric acid ($HClO_4$). If voltages of 3 V and −3 V were applied to the gate electrode on the $SiO_2$ films 41, 42, the leak current densities were $7\times10^{-8}$ $A/cm^2$ and $8\times10^{-9}$ to $8\times10^{-8}$ $A/cm^2$ respectively. The C-V property shows hysteresis of about 0.9 V. The $SiO_2$ film thickness was 8.5 nm as measured by X-ray photoelectron spectrum (XPS) and 6.7 nm as measured from the C-V property.

The foregoing is results when no annealing or other post-processing was carried out on the $SiO_2$ films 41, 42 formed in an aqueous solution of $HNO_3$ or an aqueous solution of $HCl_4$. After the formation of the $SiO_2$ films 41, 42, the films 41, 42 were heated in nitrogen ("post-oxidation annealing;" hereinafter, "POA process"). The resultant films 41, 42 showed improved electrical properties as below.

Figure 16:
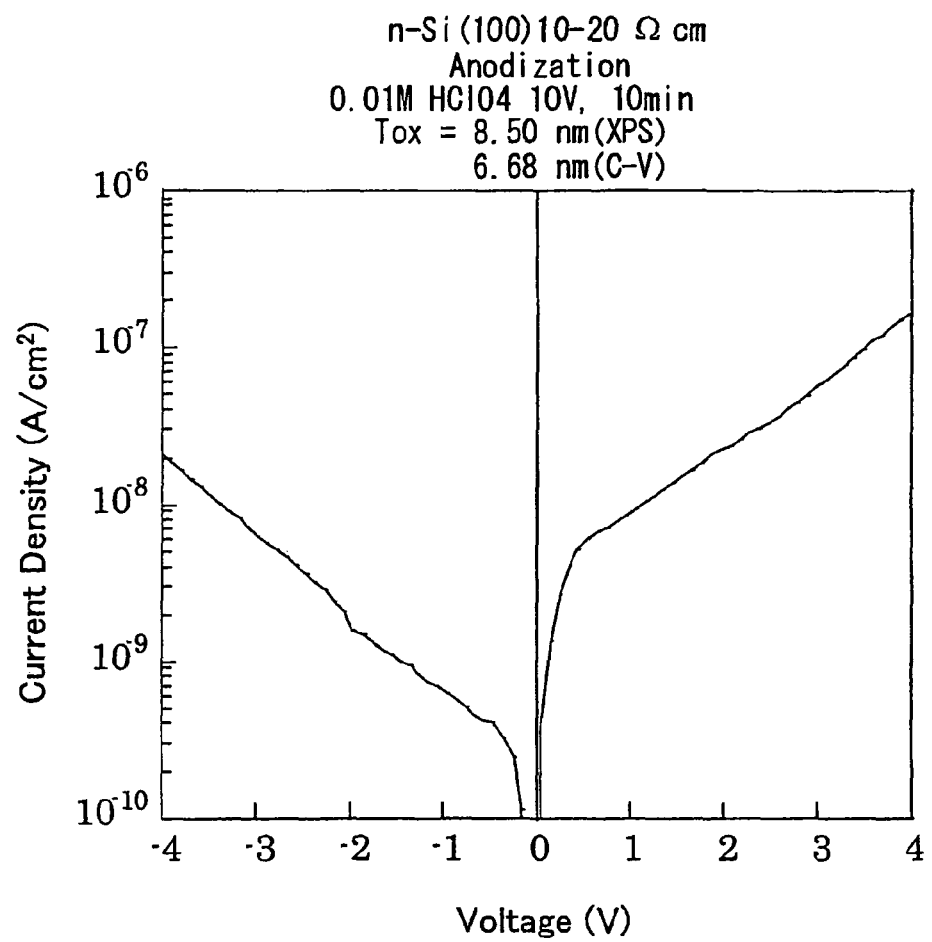
FIG. 16 is a graphical representation of the relationship between current and voltage in the thin film transistor in FIG. 15 in which an electrode is formed after heating the gate oxide film at 200° C.
Figure 17:
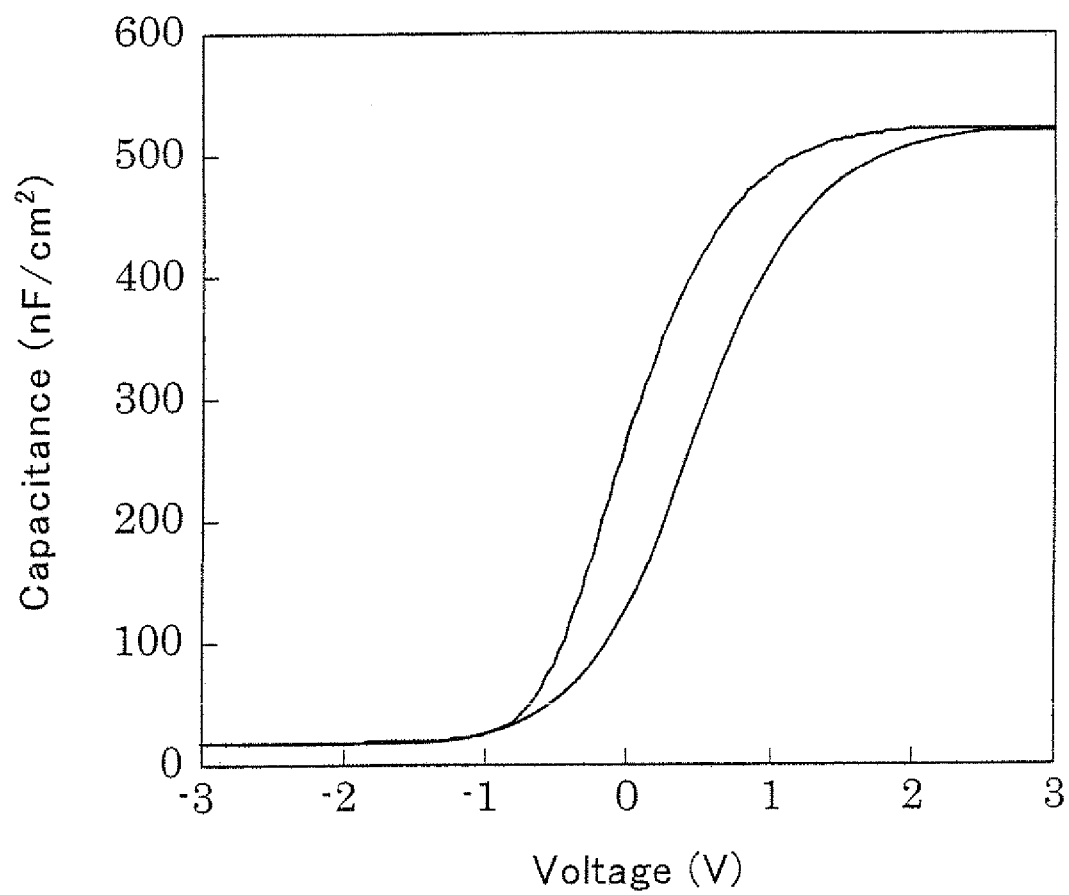
FIG. 17 is a graphical representation of the relationship between capacitance and voltage in the thin film transistor in FIG. 6.

FIG. 16 and FIG. 17 are representations of I-V and C-V properties for a thin film transistor including the $SiO_2$ films 41, 42 (shown in FIG. 15) formed by applying 10-V voltage to the process-target substrate 2 for 10 minutes in the aforementioned 0.01-mole aqueous solution of perchloric acid ($HClO_4$). The films 41, 42, after formation, were heated (POA processed) at 200° C. in nitrogen for 30 minutes, and subsequently, an aluminum electrode was formed. The figures demonstrate that if voltages of about 1V and 3V, and about −1V and −3V were applied to the gate electrode on the $SiO_2$ films 41, 42, the leak current densities were 1 to $8\times10^{-8}$ $A/cm^2$ and 1 to $8\times10^{-9}$ $A/cm^2$ respectively. The heating (POA process) reduced the leak current density to 1/5 to 1/10 times that of unprocessed films. The heating (POA process) also reduced hysteresis in the C-V property to about 0.4 V, which had been about half that of unprocessed films.

Further, a Fourier transform of infrared absorption (FT-IR) spectrum revealed that the 200° C. heating had caused desorption of water molecules in the $SiO_2$ films 41, 42. This suggests that the aforementioned improvement of the electrical properties presumably resulted from the desorption of water molecules functioning as a trap energy level.

The thickness of the $SiO_2$ film as measured by XPS measurement was 8.5 nm, which did not change from pre-heating. The thickness of the $SiO_2$ film obtained from the C-V property was 7.6 nm, which was a little thicker than pre-heating. This is presumably because the water molecule desorption due to the heating lowered permittivity. In other words, comparing the dielectric constant of the $SiO_2$ films 41, 42 obtained from the C-V property and XPS measurement before heating to that after heating, the dielectric constant was 4.9 (prior to processing) and 4.4 (post-processing). This is presumably because the dielectric constant was relatively high before the processing due to the presence of $H_2O$ (water molecules) and OH ions which had strong polarity in the films and relatively low after the processing due to the desorption of $H_2O$.

Figure 18:
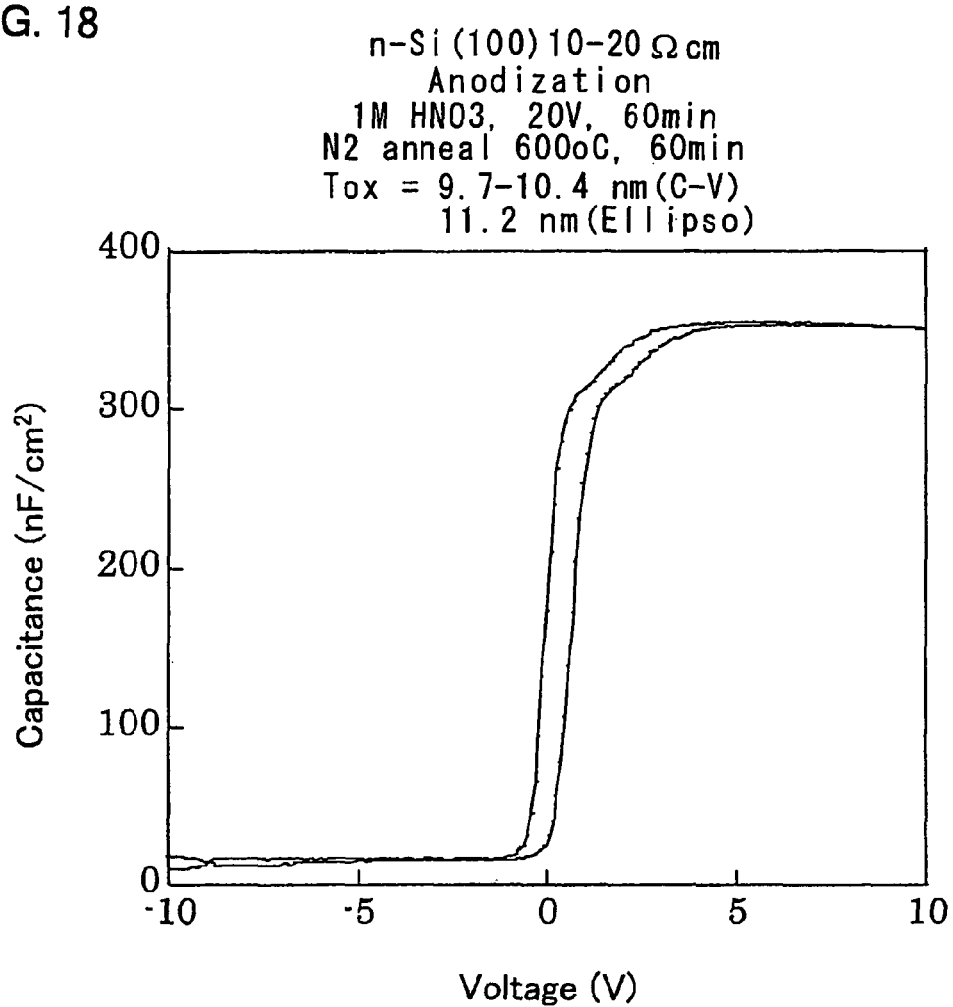
FIG. 18 is a graphical representation of the relationship between capacitance and voltage in the thin film transistor in FIG. 15 in which an electrode is formed after heating the gate oxide film at 600° C.
Figure 19:
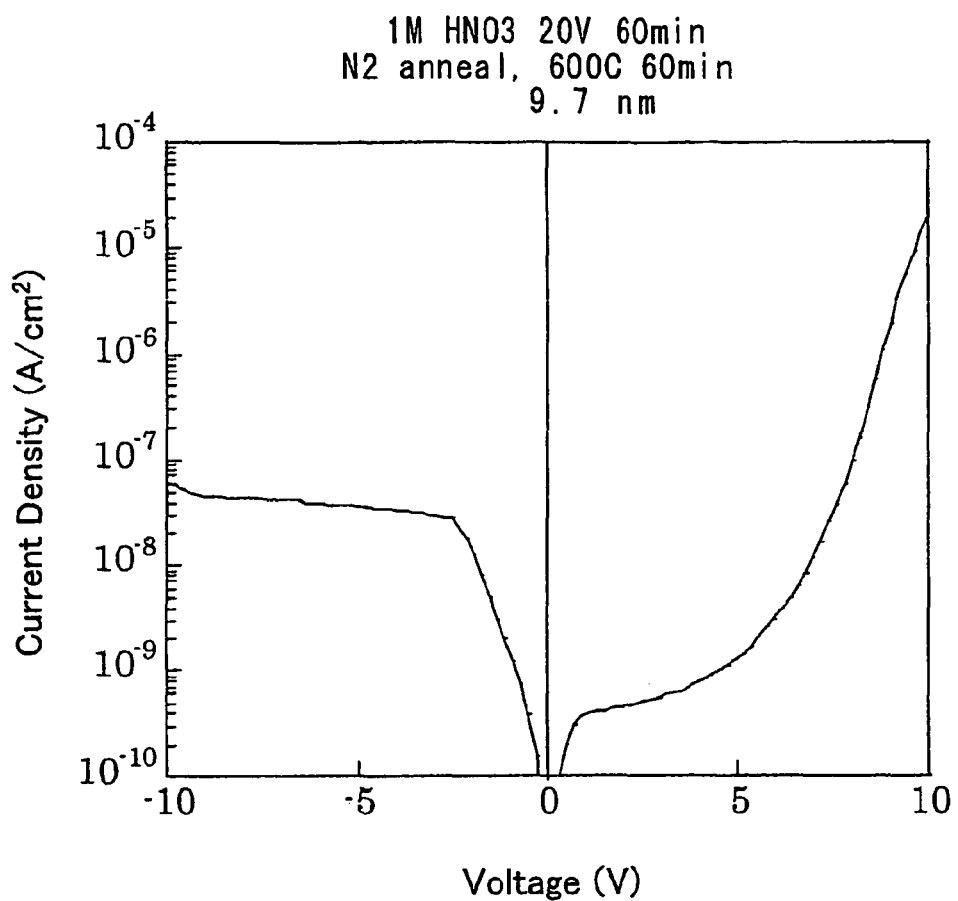
FIG. 19 is a graphical representation of the relationship between current and voltage in the thin film transistor in FIG. 8.

FIG. 18 and FIG. 19 are representations of C-V and I-V properties obtained by heating, at 600° C. in nitrogen, the $SiO_2$ film 41, 42 formed in a 1-mole aqueous solution of nitric acid ($HNO_3$) under application voltage of 20 V, and forming a MOS diode to this. According to the figures, the hysteresis in the C-V property was greatly reduced. The I-V property shows that with 10 V and −10 V being applied to the electrode, the leak current densities were about $1\times10^{-5}$ $A/cm^2$ and $6\times10^{-8}$ $A/cm^2$ respectively. The heating at 200° C. in nitrogen removed $H_2O$ in the $SiO_2$ films 41, 42. Few OH ions were removed unless heated at 500° C. Therefore, the improvement of electrical properties through 600° C. heating result from the removal of OH ions.

In contrast, it is confirmed that OH ions were removed in a POA process at 200° C. in a hydrogen atmosphere or heating after the formation of the gate electrode (post-metalization annealing; hereinafter, "PMA process"). It is therefore understood that performing the foregoing heating at 200° C. in a hydrogen atmosphere effectively removed water molecules and OH ions.

The voltage application scheme and 2-stage oxidation scheme described above may be combined to form the gate oxide film 4. For example, at least one step in the 2-stage oxidation scheme may be carried out while applying voltage.

As described in the foregoing, in the oxide film forming step (voltage application scheme and 2-stage oxidation scheme), the process-target substrate 2 is immersed in an oxidizing solution to form the gate oxide film 4 (chemical oxide film). Therefore, even if the surface has an irregular or curved surface, the oxidizing solution reaches the surface of the process-target substrate 2 uniformly. Accordingly, the gate oxide film 4 formed is uniform in thickness across all the regions where the gate oxide film 4 should be formed. Therefore, thin film transistors can be manufactured which include the high reliability, high quality gate oxide film 4.

In the thin film transistor, the quality of the gate oxide film 4 is a major factor in determining the electrical properties and reliability of the thin film transistor. In other words, the gate oxide film 4, which is required to be completely insulating in the thin film transistor, directly impact the performance (reliability and properties) of various devices which includes the thin film transistor. Therefore, especially high quality and reliability is required with the film 4. Therefore, the gate oxide film 4 formed has excellent insulation tolerance and other properties, high reliability, and high quality since the film 4 is formed by the oxide film forming step. Therefore, it is possible to thin down the gate oxide film 4. As a result, it is possible to manufacture thinner thin film transistors than conventional ones.

With the foregoing arrangement, an active oxidizing species with strong oxidation effect is prepared by heating or electrolyzing an oxidizing solution. The oxidizing species is then used to form a chemical oxide film. Therefore, the chemical oxide film can be formed, for example, at 200° C. or lower temperatures. Therefore, thin film transistors can be manufactured which are applicable to the manufacture of liquid crystal displays built on a flexible substrate (for example, plastic; polyethylene terephthalate (PET)). Accordingly, low threshold, thin film plastic transistors can be manufactured even on a plastic substrate.

Here, the "active oxidizing species" refers to oxygen that is more likely to cause chemical reaction than ordinary oxygen ($O_2$). Examples are oxygen in an atomic state, dissociated oxygen ions ($O^-$), oxygen in a metastable state (for example, singlet oxygen generated by excitation of ordinary triplet oxygen), peroxide ions ($O_2^{2-}$), superoxide ions (superoxo ions; $O_2^-$), ozonide ions ($O_3^-$), water oxide ions ($OH^-$), perhydroxy ions ($OOH^-$), and their radicals.

The "oxidizing solution containing an active oxidizing species" refers to a solution containing the aforementioned active oxidizing species and is not limited in any particular manner so long as the solution generates at least one of the active oxidizing species. It is preferable if the solution is at least one solution selected from the group consisting of oxidizing solution, strong acids, such as nitric acid, perchloric acid, and sulfuric acid, ozone-dissolving water, aqueous hydrogen peroxide, a mixed solution of hydrochloric acid and aqueous hydrogen peroxide, a mixed solution of sulfuric acid and aqueous hydrogen peroxide, a mixed solution of aqueous ammonia and aqueous hydrogen peroxide, a mixed solution of sulfuric acid and nitric acid, aqua regia, and boiling water; or a mixture thereof. It is preferable if the oxidizing solution does not contain halogen or any metal. Halogen and metal are difficult to remove from the chemical oxide film and can be a cause for poor film quality. For this reason, the especially preferred oxidizing solution is nitric acid.

The oxidizing solution may have any concentration so long as the chemical oxide film can be formed on the substrate. The concentration can vary depending on how easy/difficult to form the chemical oxide film (oxidize the silicon). When it is difficult to form the chemical oxide film (difficult to oxidize the silicon), an oxidizing solution of a high concentration is used, because the higher the concentration, the stronger the oxidation effect.

In the present manufacturing method, it is preferable if the substrate on which a chemical oxide film should be formed carries, on the surface, at least one silicon compound selected from the group consisting of monocrystal silicon, polycrystalline silicon, amorphous silicon, continuous grain silicon, silicon carbide, and silicon germanium, and the silicon oxide film (silicon dioxide film) is formed by directly oxidizing the silicon compound. The silicon dioxide film is used as the gate oxide film and insulating oxide film for various purposes. Therefore, by carrying out the oxide film forming step, thin film transistors can be formed which include as the chemical oxide film a high reliability, and high quality silicon dioxide film with excellent insulation tolerance and other properties.

Polycrystalline silicon (polysilicon) is an excellent gate electrode material because it can be used in self-aligning processes. Therefore, it is thus preferred to utilize polycrystalline silicon as a gate electrode. However, polycrystalline silicon on the substrate is formed by deposition (CVD); it is however difficult to form a uniform oxide film with CVD. Therefore, the intended oxide film properties (for example, low leak current) cannot be achieved unless the oxide film is sufficiently thick. Therefore, the thin film transistor cannot thinned down further unless the oxide film is formed with high quality. Especially, increasingly more polycrystalline silicon (polysilicon) is being used in place of monocrystal silicon for lamination on the substrate. However, polycrystalline silicon is formed on the substrate by deposition (CVD). Therefore, the polycrystalline silicon formed has an irregular surface.

In addition, the thin film transistor is a high performance thin film transistor which includes a high reliability, high quality gate oxide film. The thin film transistor is applicable to, for example, switching elements and capacitors in memory cells. It is applicable, for example, to pixel capacitors. Therefore, displays with stable capacitance and pixels are provided by applying the thin film transistor to various displays, such as liquid crystal displays, organic EL displays, and flat panel displays.

The oxide film forming step in the present manufacturing method is useable as, for example, a method of modifying an oxide film. Specifically, conventionally, the gate oxide film has been formed by deposition (CVD) or thermal oxidation. However, these methods are short of uniformly forming a high quality gate oxide film. In other words, the conventional gate oxide film is a non-uniform oxide film.

Accordingly, it is preferred to apply a voltage application scheme and/or a 2-stage oxidation scheme on such a non-uniform gate oxide film. It is preferred to, after a gate oxide film is formed by, for example, CVD, subject the gate oxide film at least either one of the voltage application scheme and the 2-stage oxidation scheme. Accordingly, it becomes possible make uniform the non-uniform gate oxide film formed by CVD, etc. In other words, the voltage application scheme and the 2-stage oxidation scheme can be used as a method of modifying a gate oxide film which improves the quality of the non-uniform gate oxide film.

As described above, for example, the thickness of the non-uniform oxide film formed by CVD, etc. can be made uniform by performing the oxide film forming step of the present manufacturing method on the non-uniform oxide film. Therefore, the non-uniform oxide film can be modified into a high reliability oxide film.

In other words, typically, the oxide film in TFT and other transistors (for example, gate oxide film) is formed by CVD. Nevertheless, CVD is a method to deposit an oxide film on a substrate; thus, a uniform oxide film cannot be formed, especially, on a substrate with an irregular shape. Therefore, the quality of the conventionally used oxide film is insufficient.

Accordingly, the substrate on which such an insufficient oxide film is formed is immersed in a solution containing an active oxidizing species by carrying out the oxide film forming step. Accordingly, the substrate is directly oxidized in a highly oxidizing solution with strong oxidation effect. As a result, the thickness of the oxide film can be made uniform. A high reliability oxide film can be formed.

The foregoing description is focused on a gate oxide film, or a chemical oxide film, which is required to exhibit high quality and high reliability, especially, to obtain electrical insulation. The chemical oxide film is by no means limited to such a type. The invention is applicable to oxide films of any use so long as the oxide is formed in an oxidizing solution.

In the oxide film forming step, the thickness of the chemical oxide film is also controllable by adjusting the magnitude of the applied voltage, the concentration of the oxidizing solution, the process duration in the step, etc. in the voltage application scheme and the 2-stage oxidation scheme. As mentioned above, a high quality chemical oxide film can be formed in the oxide film forming step; therefore, the chemical oxide film can be thinned down. Therefore, thin film transistors including the thinned chemical oxide film can be driven at lower voltage than conventional ones.

Manufacturing Example 4

Here, a comparison was made as to two cases as in manufacturing example 1. In one of them, the first chemical oxide film (silicon dioxide film 41) was formed on the substrate. After that, the silicon dioxide film 41 was formed. The substrate was then immersed in a 40% (wt.) aqueous solution of nitric acid. The solution, along with the substrate left immersed therein, was heated (concentrated) until the concentration reaches azeotropy, so as to form the second chemical oxide film (silicon dioxide film 42). (This is continuous oxidation.) In the other, a 40% (wt.) aqueous solution of nitric acid and an azeotropic aqueous solution of nitric acid were individually provided. The first chemical oxide film (silicon dioxide film 41) was formed in the 40% (wt.) solution. After that, the substrate, now carrying the silicon dioxide film 41 thereon, was immersed in the azeotropic solution, so as to form the second chemical oxide film (silicon dioxide film 42). (This is noncontinuous oxidation.)

Specifically, in the continuous oxidation, first, the substrate washed in RCA was immersed in 40 wt. % nitric acid for 10 minutes. Thereafter, the solution, along with the substrate left immersed therein, was heated until the nitric acid reached azeotropy. Then, after the nitric acid had reached azeotropy, the substrate was immersed for another 2 hours.

In contrast, in the non-continuous oxidation, first, the substrate washed in RCA was immersed in 40 wt. % nitric acid for 10 minutes. Next, the substrate was removed from the 40 wt. % nitric acid. After washing, the substrate was immersed in azeotropic nitric acid for 2 hours.

Figure 30:
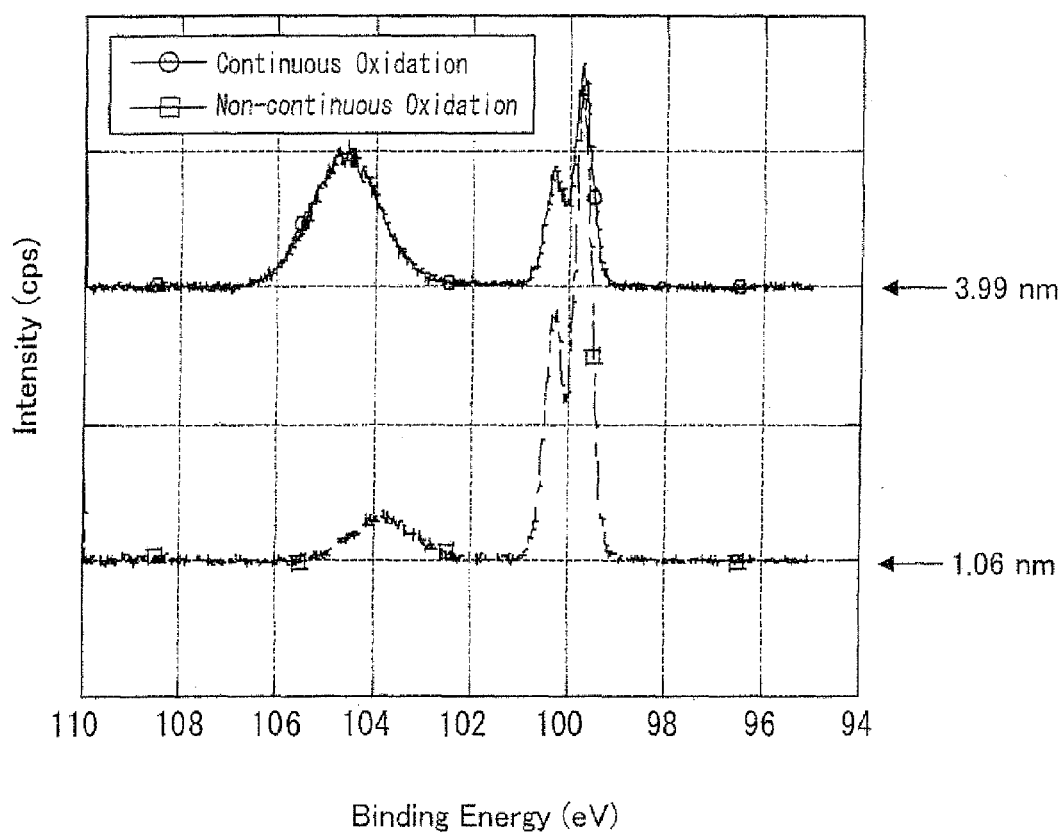
FIG. 30 is a representation of XPS spectrum for a gate oxide film ($SiO_2$ film) in a thin film transistor manufactured by continuous oxidation or non-continuous oxidation.

As shown in FIG. 30, a comparison of the silicon dioxide films formed as described above shows that the continuous oxidation formed an about 4-nm silicon dioxide film which was relatively thick and that the non-continuous oxidation formed an only about 1-nm silicon dioxide film.

Figure 29:
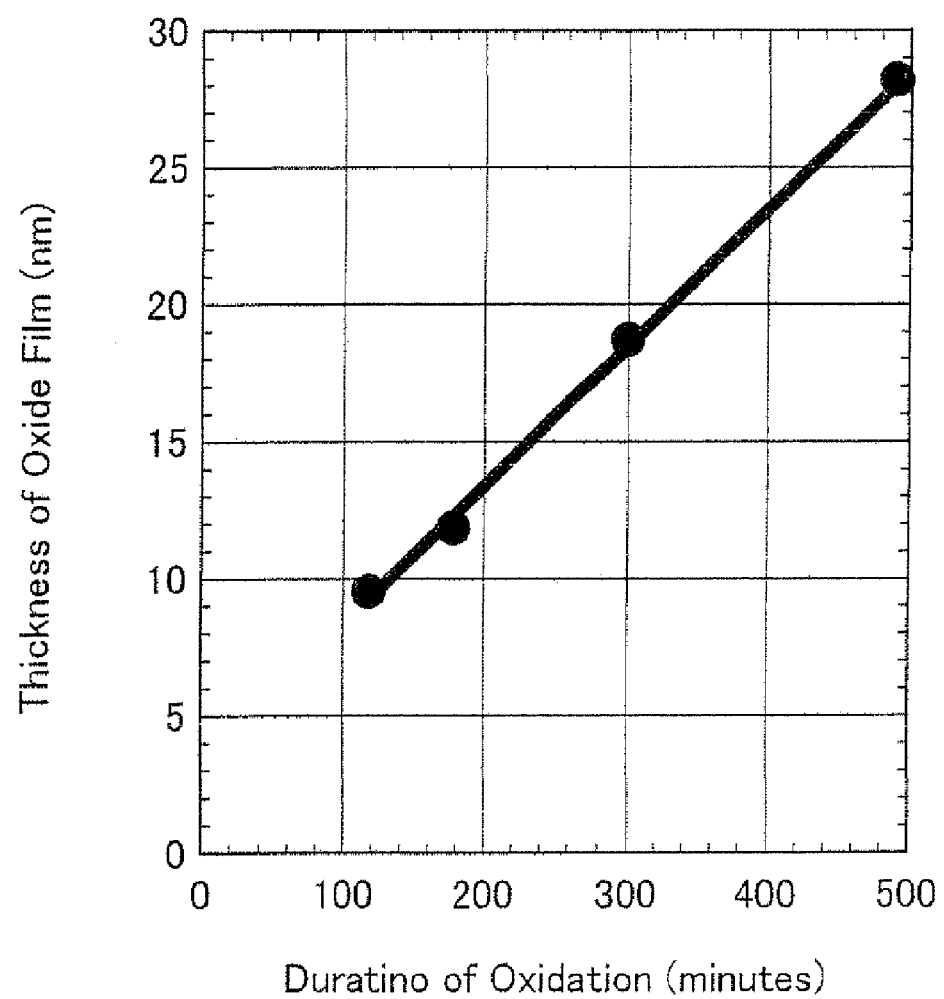
FIG. 29 is a graphical representation of the relationship between oxidation time and film thickness of a gate oxide film ($SiO_2$ film) in a thin film transistor manufactured by continuous oxidation.

In addition, as shown in FIG. 29, the TFT polycrystalline thin film was oxidized more quickly in the continuous oxidation than in the non-continuous oxidation, to form a thick chemical oxide film.

The present invention is not limited to the description of the embodiments above, but may be altered by a skilled person within the scope of the claims. An embodiment based on a proper combination of technical means disclosed in different embodiments is encompassed in the technical scope of the present invention.

Embodiment 2

The following will describe an embodiment in accordance with the present invention in reference to FIG. 21 through FIG. 28. An example will be taken to illustrate a method of manufacturing a MOS capacitor in which a silicon dioxide film and a electrode are formed on a silicon substrate. The present invention is by no means limited to this.

The method of manufacturing a MOS capacitor (semiconductor device) of the present embodiment is a method characterized by the inclusion of an oxide film forming step whereby the semiconductor surface is brought in contact with oxidizing solutions of different concentrations to form chemical oxide films on the semiconductor surface in stages. Now, the oxide film forming step, which is the feature of the present invention, and a semiconductor manufacturing apparatus which performs the step will be described.

Figure 21:
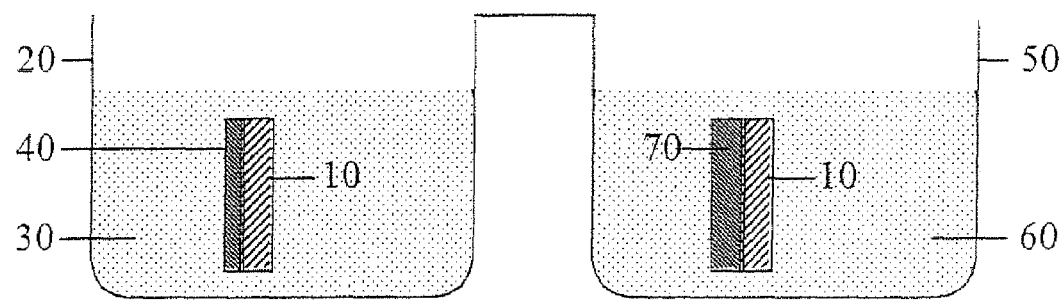
FIG. 21 is a schematic cross-sectional view of a major part of a manufacturing apparatus used in accordance with an embodiment of the present invention.
Figure 22:
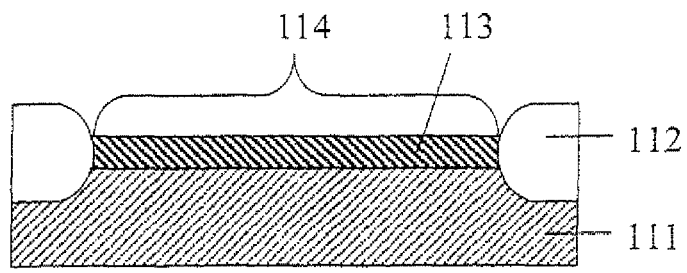
FIG. 22(a) is a cross-sectional flow view of a MOS capacitor manufacturing step in accordance with an embodiment of the present invention.
FIG. 22(b) is a cross-sectional flow view of a MOS capacitor manufacturing step in accordance with an embodiment of the present invention.
FIG. 22(c) is a cross-sectional flow view of a MOS capacitor manufacturing step in accordance with an embodiment of the present invention.
FIG. 22(d) is a cross-sectional flow view of a MOS capacitor manufacturing step in accordance with an embodiment of the present invention.
FIG. 22(e) is a cross-sectional flow view of a MOS capacitor manufacturing step in accordance with an embodiment of the present invention.
FIG. 22(f) is a cross-sectional flow view of a MOS capacitor manufacturing step in accordance with an embodiment of the present invention.
Figure 22:
Figure 22:
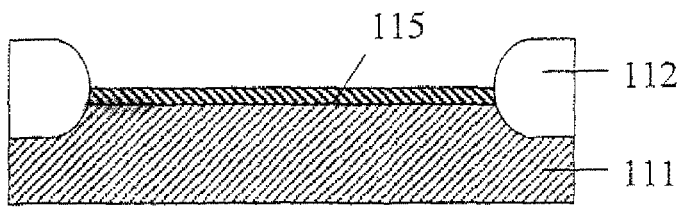
Figure 22:
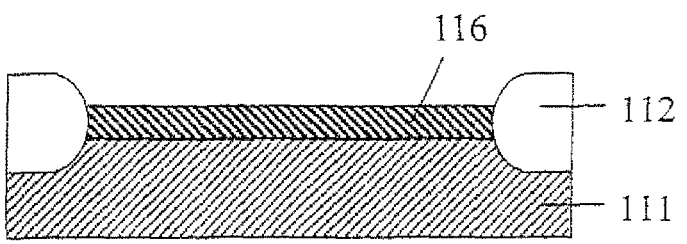
Figure 22:
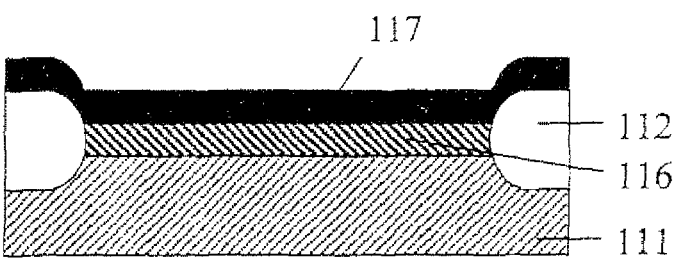
Figure 22:
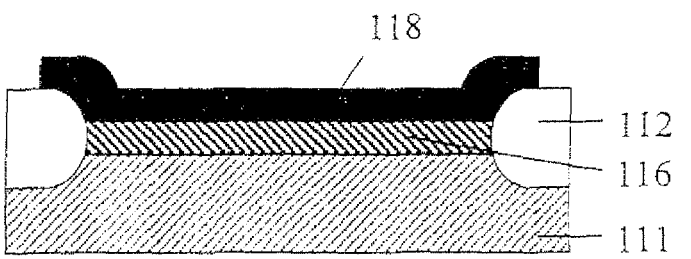

FIG. 21 is a schematic cross-sectional view of a major part of the manufacturing apparatus used in the method of forming silicon dioxide films on a silicon substrate (semiconductor) as the second embodiment in accordance with the present invention. The process-target silicon substrate 10 is immersed in the low-concentration oxidizing solution 30 in the first processing container 20. This process forms the first oxide film (first chemical oxide film) 40 on the surface of the silicon substrate 10. After that, the process-target silicon substrate 10 on which the first oxide film 40 is formed is immersed in the oxidizing solution of a high concentration 60 in the second processing container 50 to form the second oxide film (second chemical oxide film; not shown) on the first oxide film 40. Thus, the silicon dioxide film 70 contains the first oxide film 40 and the second oxide film. In other words, the manufacturing apparatus contains an oxide film forming section which performs a method of forming an oxide film in accordance with the present invention as below.

FIG. 22(a) to FIG. 22(f) are cross-sectional step flow views disclosing a method of manufacturing a MOS capacitor. The manufacturing apparatus shown in FIG. 21 is used to form the silicon dioxide film 117 and the electrode 118 on the silicon substrate 111. The following will describe a method of an embodiment in accordance with the present invention.

First, as shown in FIG. 22(a), separation regions 112 are formed in advance on the silicon substrate 111. Here, the silicon substrate 111 is a p-type, (100) substrate with a resistivity from 10 Ωcm to 15 Ωcm. Then, the silicon substrate 111 is then injected with boron (B) as a channel stopper. After that, a silicon dioxide film about 500 nm thick is formed as the separation regions 112 on one surface of the silicon substrate 111 by LOCOS (local oxidation of silicon) technology. The separation regions 112 is not necessarily formed by LOCOS; for example, an embedded silicon dioxide film may be formed in the silicon substrate. The silicon substrate 111 is by no means limited to the foregoing properties. Referring to FIG. 22(a), the region in which the natural oxide film 113 is formed is the region in which the silicon dioxide film 116 should be formed by the step detailed below. The region is indicated as an active region 114. In addition, the silicon substrate 10 in FIG. 21 is a schematic representation of the entirety including the separation region (LOCOS oxide film) formed on the silicon substrate 111 like the one shown in FIG. 22(b).

As shown in FIG. 22(a), if the natural oxide film 113 is formed on the surface of the silicon substrate 111 at this stage, the natural oxide film 113 is completely removed as in FIG. 22(b) by washing the substrate 111 with a well-known RCA washing method, in other words, in an aqueous solution of primarily ammonia and hydrogen peroxide and then immersing in a 0.5% (volume ratio; hereinafter vol.") dilute solution of hydrofluoric acid for about 5 minutes. The active region 114 of the silicon substrate 111 is thus exposed.

Next, the silicon substrate 111 is rinsed (washed) in ultrapure water for 5 minutes. After that, the silicon substrate 111 is immersed in the first processing container 20 filled with the low-concentration oxidizing solution 3 as shown in FIG. 21. Accordingly, as shown in FIG. 22(c), the first oxide film (first chemical oxide film) is formed on the active region 114. Here, the substrate 111 is immersed for 10 minutes. As described above, the silicon substrate 111 of which the surface is cleaned is immersed in the low-concentration oxidizing solution 30 for 10 minutes to form the first oxide film 115 shown in FIG. 22(c). The first oxide film 115 is a silicon dioxide film which is part of the silicon substrate 111 having been oxidized.

The low-concentration oxidizing solution 30 is a low concentration solution with strong oxidation effect (oxidizing solution). Here, the oxidizing solution is a 40% (weight ratio; hereinafter, "wt.") aqueous solution of nitric acid. In addition, the first oxide film 115 is 1.1 nm thick.

Subsequently, the silicon substrate 111 on which the first oxide film 115 is formed is immersed in the high-concentration oxidizing solution 60 which fills the second processing container 5 shown in FIG. 21. Accordingly, as shown in FIG. 22(d), oxidation reaction for the silicon substrate 11 proceeds further; the second oxide film (not shown) is formed on top of the first oxide film 115. The silicon dioxide film 116 is thus formed. That is, the silicon dioxide film 116 is made of the first oxide film 115 formed by the FIG. 22(c) step and the second oxide film (not shown) formed by the FIG. 22(d) step. In other words, for descriptive purposes, the silicon dioxide film 116 can be said to be made of the first oxide film 115 and the second oxide film. Actually, however, since both films are made of silicon dioxide, the films form the single-layer silicon dioxide film 116. Note that the substrate 111 is immersed in the solution 6 for 10 minutes. As described above, the silicon substrate 111 on which the first oxide film 115 is formed is immersed in the high-concentration oxidizing solution 6 for 10 minutes, to uniformly form the silicon dioxide film 116 as shown in FIG. 22(d). The silicon dioxide film 116 is 10 nm thick.

The high-concentration oxidizing solution 60 refers to a high-concentration solution with strong oxidation effect (oxidizing solution). The high-concentration oxidizing solution here is 68% (wt.), azeotropic nitric acid.

Subsequently, as shown in FIG. 22(e), the metal film (metal-containing film) 117 is formed on the silicon dioxide film 116 and the separation regions 112. Here, as the metal film 117, an aluminum alloy containing 1 wt. % silicon is deposited up to a thickness of about 200 nm by well-known resistance heating vapor deposition (hereinafter, this kind of metal film electrode will be simply called an Al electrode). The metal film 117 is by no means limited to the Al electrode. For example, a polysilicon electrode (material) may be deposited for use in place of the metal film 117.

Thereafter, as shown in FIG. 22(f), the metal film 117 is patterned to desired geometry to form the electrode 118. A MOS capacitor is hence manufactured.

Figure 23:
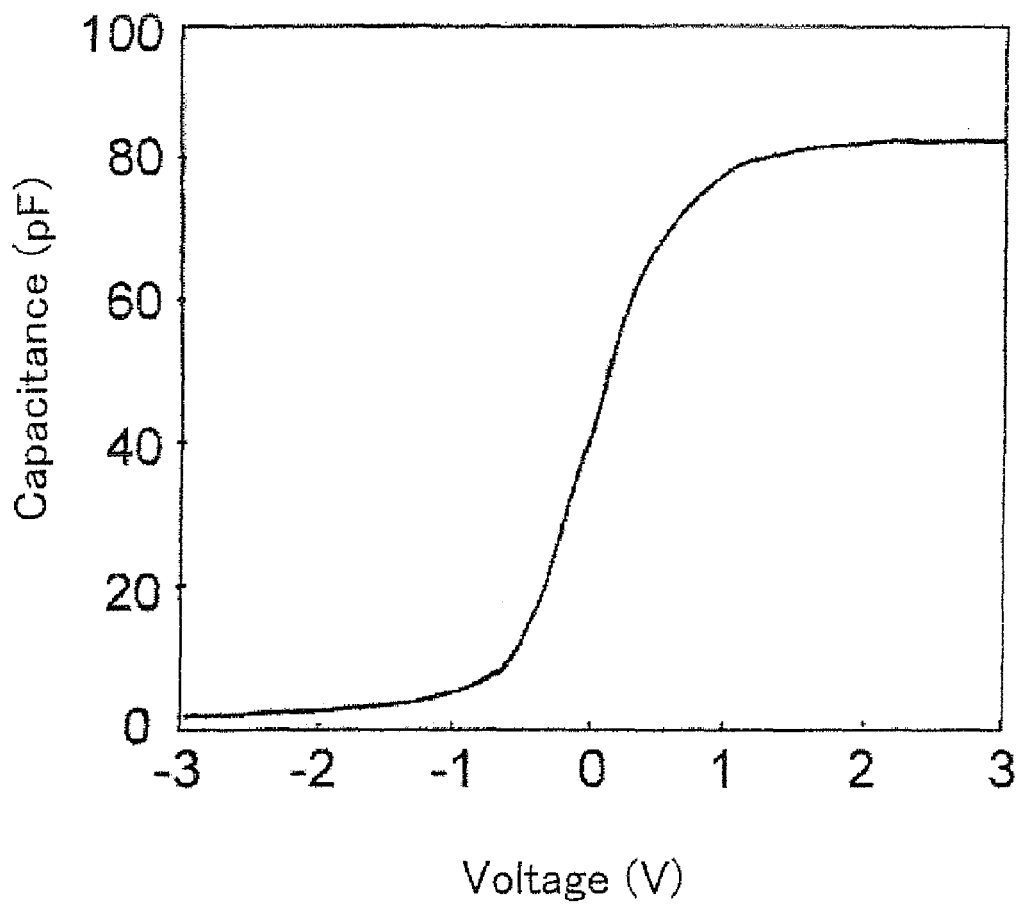
FIG. 23 is a representation of the capacitance (C) vs. voltage (V) property of a MOS capacitor obtained in accordance with an embodiment of the present invention.

The MOS capacitor (semiconductor device) manufactured as described above provides stable capacitance (electrostatic capacitance) as shown in FIG. 23. FIG. 23 is the relationship between electrostatic capacitance (C) and applied voltage (V), or a so-called representation of C-V property, of the MOS capacitor produced in accordance with the present embodiment. As observable from the property diagram, applying a positive voltage to the electrode 118 induces an inverted layer at the interface (silicon substrate surface) between the silicon substrate 111 and the silicon dioxide film (interface with the oxide film (semiconductor surface)), thereby providing stable capacitance (electrostatic capacitance).

As described above, in the present embodiment, the silicon substrate 111 is immersed in aqueous solutions of nitric acid of different concentrations to form the silicon dioxide film 116 on the silicon substrate 111 in two stages. In other words, the silicon dioxide film 116 which constitutes a MOS capacitor is formed by the step of bringing the silicon substrate (semiconductor) 111 in contact with a 40% (wt.) aqueous solution of nitric acid (oxidizing solution of a first concentration) to form a first oxide film (first chemical oxide film) 115 on the surface of the silicon substrate 111 and the step of bringing the first oxide film 115 in contact with a 40% (wt.) (the concentration used to form the first oxide film 115) or thicker aqueous solution of nitric acid (oxidizing solution of a second concentration; a 68% (wt.) aqueous solution of nitric acid in the foregoing) to form a second oxide film on the first oxide film 115.

In addition, as observable from the C-V property diagram in FIG. 23, the MOS capacitor formed as described above has the same or less level of leak current density than the MOS capacitor containing as an insulating film the silicon dioxide film formed by an ordinary high temperature thermal oxidation method. The performance has certainly improved.

In the foregoing manufacturing example, the silicon dioxide film 116 is 10 nm thick. The thickness is not limited in any particular manner. Adjusting the durations for which the silicon substrate 111 is immersed in the low-concentration oxidizing solution 30 and the high-concentration oxidizing solution 60 causes changes in thickness of the first oxide film 115 and the silicon dioxide film 116. In other words, the silicon substrate 111 can be immersed in an oxidizing solution for durations specified in accordance with a desired film thickness. The concentration of the oxidizing solution is another factor determining a rate of formation for oxide films, such as the first oxide film 115. Therefore, the immersion duration only needs to be specified in accordance with the type and concentration of the oxidizing solution and the thickness of an oxide film to be formed; the duration is not limited in any particular manner.

In the present embodiment, the oxidizing solution of a low concentration or an oxidizing gas thereof is a 40% (wt.) aqueous solution of nitric acid as an example. The solution may be replaced with at least one aqueous solution selected from the group consisting of perchloric acid, sulfuric acid, ozone-dissolving water, aqueous hydrogen peroxide, a mixed solution of hydrochloric acid and aqueous hydrogen peroxide, a mixed solution of sulfuric acid and aqueous hydrogen peroxide, a mixed solution of aqueous ammonia and aqueous hydrogen peroxide, a mixed solution of sulfuric acid and nitric acid, and aqua regia. Also, the solution may be replaced with boiling water with oxidation effect.

In the present embodiment, the oxidizing solution of a high concentration or an oxidizing gas thereof is a 68% (wt.) aqueous solution of nitric acid ("azeotropic nitric acid"). The solution may be replaced with at least one aqueous solution selected from the group consisting of azeotropic perchloric acid, azeotropic sulfuric acid, and aqua regia.

When the oxidizing solution of a high concentration is an azeotropic mixture with water, the solution and vapor (that is, gas) have a constant concentration while a chemical oxide film is being formed on the semiconductor. Thus, the growth of the chemical oxide film can be controlled with time. Therefore, it is preferable if the oxidizing solution of a high concentration is an azeotropic mixture.

As will be detailed later in an example, it is preferable if the first chemical oxide film (first oxide film 115) formed in an oxidizing solution of a low concentration has pores. In other words, it is preferable if the first chemical oxide film has a relatively low atomic density. When this is the case, the formation of the second chemical oxide film in the oxidizing solution of a high concentration proceeds smoothly. This is because the oxidizing solution acts (contacts) in the pores in the first chemical oxide film to form the second chemical oxide film. That is, the porous, low-atomic density, first chemical oxide film acts as a catalyst, enabling the oxidation reaction (formation of the second chemical oxide film) to proceed gradually. The resultant chemical oxide films is of higher quality.

In the foregoing description, the chemical oxide films are formed in the low-concentration oxidizing solution 30 and the high-concentration oxidizing solution 60 (oxidizing solutions of two concentrations) which respectively fill the first processing container 20 and the second processing container 50, as shown in FIG. 21. However, the method of forming the chemical oxide films is by no means limited to this. For example, the oxidizing solution may be altered gradually to high concentration, from low concentration to high concentration in many stages (oxidizing solutions of two or more concentrations or gases thereof are prepared). The concentration of the oxidizing solution may be increased continuously from low concentration to high concentration. That is, a low concentration solution may be concentrated to prepare a continuously high concentration solution. For example, if the oxidizing solution below azeotropic concentration (oxidizing solution of a low concentration) is heated and concentrated until azeotropic concentration is reached, and maintained in that heated state, the oxidizing solution having reached azeotropic concentration and its vapor show an invariable composition. Accordingly, the growth of the chemical oxide film can be controlled with time. Therefore, the formation (thickness, quality, etc.) of the chemical oxide films can be controlled with higher accuracy.

It is preferable if the oxidizing solutions of a low concentration and a high concentration are oxidizing species with strong oxidation effect (for example, oxygen ions, such as oxygen ions, water oxide ions, peroxide ions, or radicals). When this is the case, the chemical oxide films can be formed at temperatures as low as 200° C. or even lower. Therefore, the present embodiment is suited for application to the formation of TFTs in the manufacture of a flexible liquid crystal display which requires the chemical oxide film to be formed at temperatures as low as 200° C. or even lower.

In the present embodiment, it is also possible to form in the aforementioned silicon dioxide film 116, (i) a silicon nitride-containing silicon dioxide film of which the surface is partially nitrided (silicon nitride) in a nitrogen-containing gas, especially by plasma, and (ii) a thick insulating film of $SiO_2$ or another material atop the silicon nitride-containing film by CVD, etc. after the aforementioned nitriding.

The nitrided chemical oxide film generally shows intermediate properties between the oxide film and the nitride film depending on the composition. For example, the diffusion coefficient of impurities is slower in a nitride film than in an oxide film (thermal nitriding). A nitrided chemical oxide film provides excellent prevention of the impurity with which the gate electrode is doped, especially, boron, from diffusing into the Si substrate. Therefore, the nitrided chemical oxide film is applicable semiconductor devices in which an ultrathin gate insulating film (for example, 4 nm or less) is needed.

As described above, the nitriding is one way of improving the performance of the transistor. The nitriding further improves the quality of the chemical oxide film, which in turn allows for thinner chemical oxide films.

"Nitriding" means that the fabricated silicon dioxide film 116 (chemical oxide film) is at least partially nitrided. The nitriding involves heating a chemical oxide film formed through oxidation of a semiconductor surface in an atmosphere containing a nitriding species for nitriding at least part of the chemical oxide film.

Examples of nitriding include ammonia ($NH_3$) nitriding, nitrous acid ($N_2O$) nitriding, and nitrogen monoxide (NO) nitriding. In these methods, ammonia, nitrous acid, and nitrogen monoxide are the nitriding species. Properties of a nitrided chemical oxide film obtained through NO nitriding do not degrade; the film, when used as a gate insulating film, shows excellent insulation breakdown tolerance and hot carrier tolerance over time.

As another example of the present embodiment, a high dielectric film, such as hafnium oxide or aluminum oxide, is laminated on the aforementioned silicon dioxide ($SiO_2$) film 116 to form a composite film. The composite film can be used as the gate insulating film in a MOS transistor. Transistor properties improve (less leak current, higher mobility due to lowered interface energy level, etc.) with such a composite film when compared with the use of a high dielectric film alone. The silicon dioxide film under the high dielectric film may be ultrathin: for example, 1 nm or even less. A silicon dioxide film formed by ordinary thermal oxidation is not applicable in practical use where there is large leak current or high interface energy level, if the film is about 1 nm thick. The silicon dioxide ($SiO_2$) film 116 of the present embodiment is suitable for use in composite film of layered structure when the film 16 is topped by a thick insulating film. The oxide film of the present embodiment is also applicable to a layered ferroelectric film structure, as well as to the high dielectric film.

In the foregoing description, the metal film 117 (metal-containing film) is made of aluminum. Examples of films containing metal atoms include films containing metal atoms selected from the group consisting of aluminum, magnesium, nickel, chromium, platinum, palladium, tungsten, titanium, and tantalum. Preferable films containing metal atoms are those containing active metal atoms: for example, metal films of aluminum, magnesium, and nickel and alloy films of silicon-containing aluminum. The film containing metal atoms may be a compound, such as titanium nitride or tantalum nitride.

The present embodiment is focused on an example in which the monocrystal silicon substrate 111 is used as a process-target substrate to manufacture a MOS capacitor. The steps involved are also suited for use with polycrystalline (inclusive of fine crystals) silicon or amorphous silicon on a glass or PET substrate in the manufacture of thin film transistors (TFTs). In other words, it is preferable if the semiconductor on which a chemical oxide film should be formed contains silicon and the chemical oxide film to be formed is a silicon dioxide film.

The monocrystal silicon substrate is not necessarily planar. The substrate may have three-dimensional, spherical, curved, or otherwise irregular geometry. The silicon dioxide film or other insulating film explained in the present embodiment can be uniformly formed on the irregular or curved parts of the surface at low temperature so that those parts can serve as transistor channels.

Further, the steps are applicable not only to the manufacture of MOS capacitors, but also to, for example, the manufacture of MOS transistors containing the silicon dioxide film or like insulating film as the gate insulating film, and capacitive insulating films in large scale integrated circuits (LSIs), for example, flash memory and other memory.

In the foregoing description, the chemical oxide film is a silicon dioxide film. The chemical oxide film may alter depending on the kind of oxidized semiconductor. The chemical oxide film is by no means limited to the silicon dioxide film.

In the foregoing description, no voltage is applied to the silicon substrate 111. By forming the silicon dioxide film through voltage application, however, the progress of the oxidation reaction can be accelerated (the formation rate of the silicon dioxide can be increased).

In the foregoing description, the silicon substrate 111 is immersed in the low- and high-concentration oxidizing solutions 30, 60. Therefore, the oxide film can be formed using a very simple arrangement. However, the silicon substrate 111 is not necessarily immersed. It is sufficient if the oxidizing solution can react with the silicon substrate. For example, the substrate may be exposed to low-concentration or high-concentration vapor (oxidizing gas) of the oxidizing solution. In a case like this, it is sufficient if vapor of the aforementioned the oxidizing solution is used.

The following will describe the present invention in more detail by way of examples, which is by no means limiting the present invention.

Example 1

The formation of a 3.5-nm thick $SiO_2$ film by a chemical oxide film forming method involving 2-stage solution oxidation will be explained.

First, to form the first chemical oxide film (first oxide film 115), the silicon substrate 111 was immersed in a 40% (wt.) aqueous solution of nitric acid without applying voltage. The porous $SiO_2$ film (first oxide film 115; chemical oxide film) with an atomic density of $2.22 \times 10^{22}$ atom/cm$^3$, which was relatively low, was formed to a thickness of 1.1 nm.

Subsequently, to form the second chemical oxide film, the silicon substrate 111 was immersed in a 68% (wt.), azeotropic aqueous solution of nitric acid (boiling point 120.7° C.) to form a thicker $SiO_2$ film than the first chemical oxide film with an atomic density of $2.34 \times 10^{22}$ atom/cm$^3$ (combined thickness 3.5 nm).

In the first and second oxidation processes (the formation steps for the first and second chemical oxide films), the pores in the $SiO_2$ film (first chemical oxide film) formed in the first, 40% (wt.) aqueous solution of nitric acid provided sties where nitric acid would decompose. That is, the porous $SiO_2$ film (first oxide film 115) of low atomic density presumably acted as a catalyst to promote the oxidation of the nitric acid, forming the second chemical oxide film.

Figure 24:
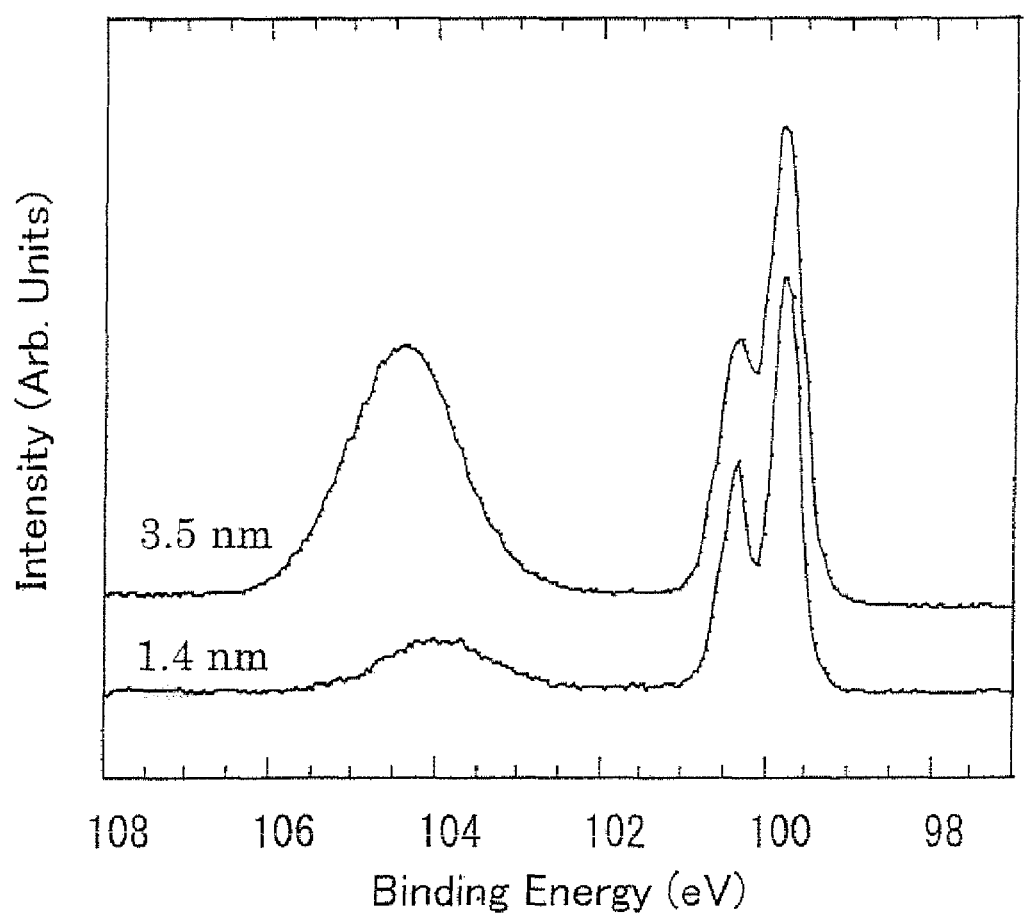
FIG. 24 is a representation of XPS spectrum for a $SiO_2$ film.

FIG. 24 is an XPS spectrum property diagram for the $SiO_2$ film 16 (chemical oxide film) formed by the 2-stage nitric acid oxidation process. The two sharp peaks are attributed to photoelectrons released from the Si(2p) orbit of the silicon substrate. The wider peak is attributed to photoelectrons released from the $SiO_2$ film 16. From these peaks' area/intensity ratios, the combined thickness of the $SiO_2$ film 16 was calculated to be 3.5 nm.

In contrast to this, if no first chemical oxide film was formed, and if the silicon substrate was from the beginning immersed in the azeotropic aqueous solution of nitric acid (concentration 68% (wt.)), i.e., under the same conditions as for the formation of the second chemical oxide film, a poreless $SiO_2$ film with a high atomic density was formed. The thickness was as small as 1.4 nm.

Figure 25:
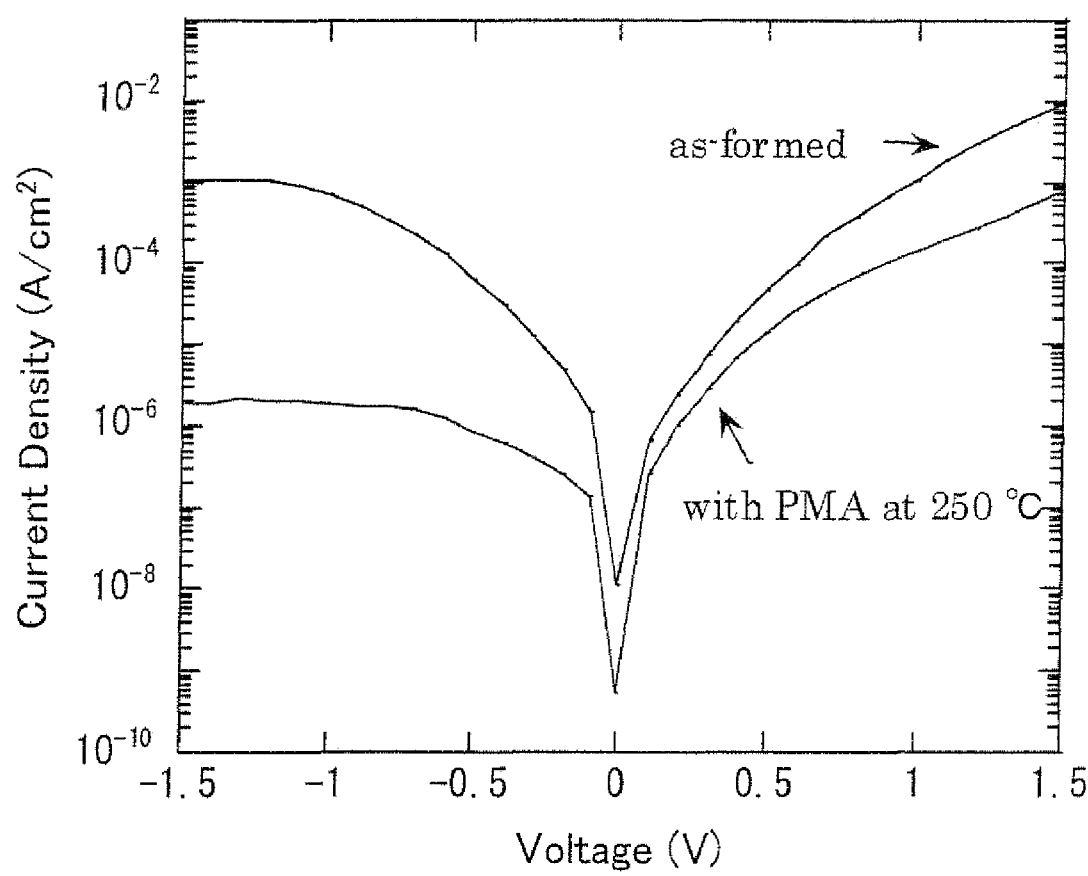
FIG. 25 is a representation of the I-V property of a MOS-structure diode containing a $SiO_2$ film.

FIG. 25 is a representation of I-V property for a MOS-structure diode containing the 3.5-nm thick $SiO_2$ film 16 obtained by the 2-stage nitric acid oxidation process before and after a PMA process. The diagram shows that after a MOS-structure diode was subjected to a PMA process in a hydrogen atmosphere at 250° C., the leak current density was $1\times10^{-4}$ A/cm$^2$ and $2\times10^{-6}$ A/cm$^2$ for a 1-volt forward bias and a 1 volt reverse bias respectively. The leak current density has certainly decreased in comparison with the pre-PMA process values: $1\times10^{-3}$ A/cm$^2$ and $7\times10^{-4}$ A/cm$^2$ respectively.

Figure 26:
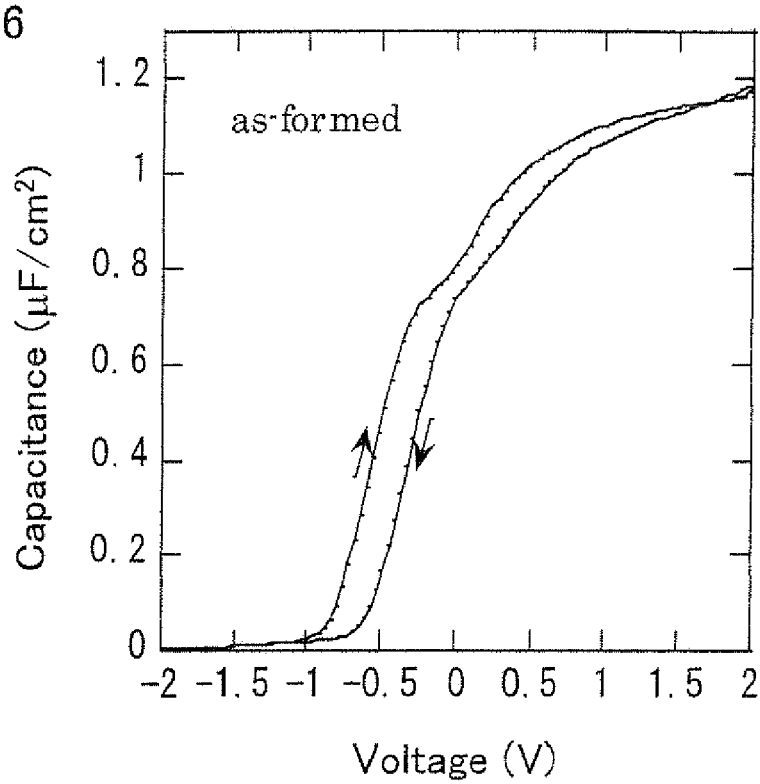
FIG. 26 is a representation of the C-V property of a MOS-structure diode.
Figure 27:
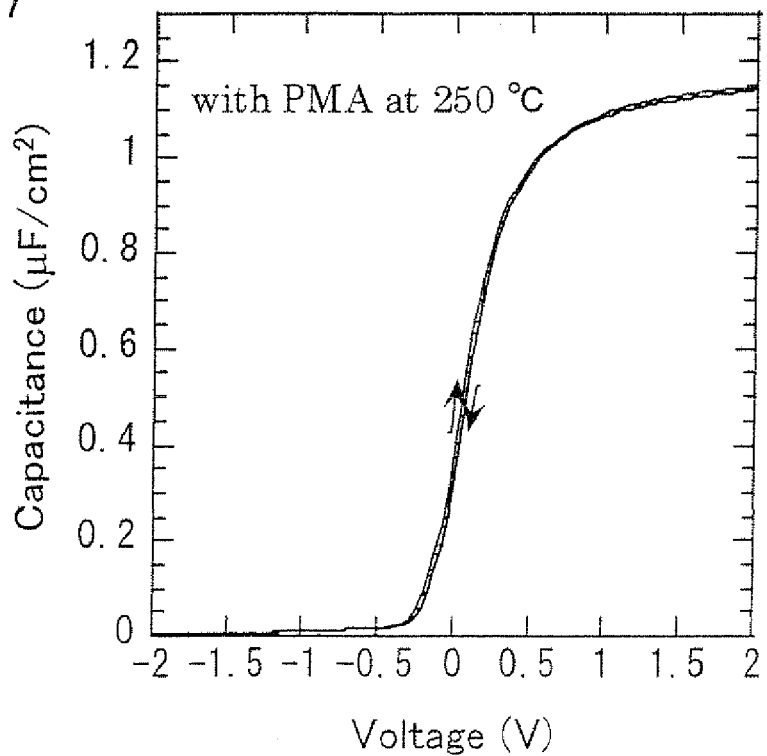
FIG. 27 is a representation of the C-V property of a MOS-structure diode.

FIG. 26 is a representation of C-V property for a MOS-structure diode containing 3.5-nm thick $SiO_2$ film 16 obtained by the 2-stage nitric acid oxidation process before a PMA process. The C-V property diagram shows a swell (of properties) due to interface energy levels and also hysteresis. A, so-called PMA process in which the diode was heated as it was in a hydrogen atmosphere at 250° C. eliminated the swell completely and most of the hysteresis (FIG. 27).

In this example, the Al electrode 117 was formed on the 3.5-nm thick $SiO_2$ film 16. The subsequent PMA process in which the sample was heated in a hydrogen atmosphere at 250° C. eliminated interface energy level and gap level in $SiO_2$. The band gap of the $SiO_2$ film 116 then increased, which in turn markedly reduced leak current density. These phenomena improved the performance of the insulating film. This is not the only possibility. Experience tells that immersion in an aqueous solution of nitric acid for an extended period of time makes it possible to form the $SiO_2$ film 116 with thickness in excess of this, up to a few tens of nanometers. In addition, performing the aforementioned PMA process at appropriately chosen temperature of a few hundred degrees Celsius (for example, 450° C.) improved the electrical properties of the MOS structure, especially, eliminated hysteresis. lowered leak current density, and improved insulation breakdown voltage tolerance.

Figure 28:
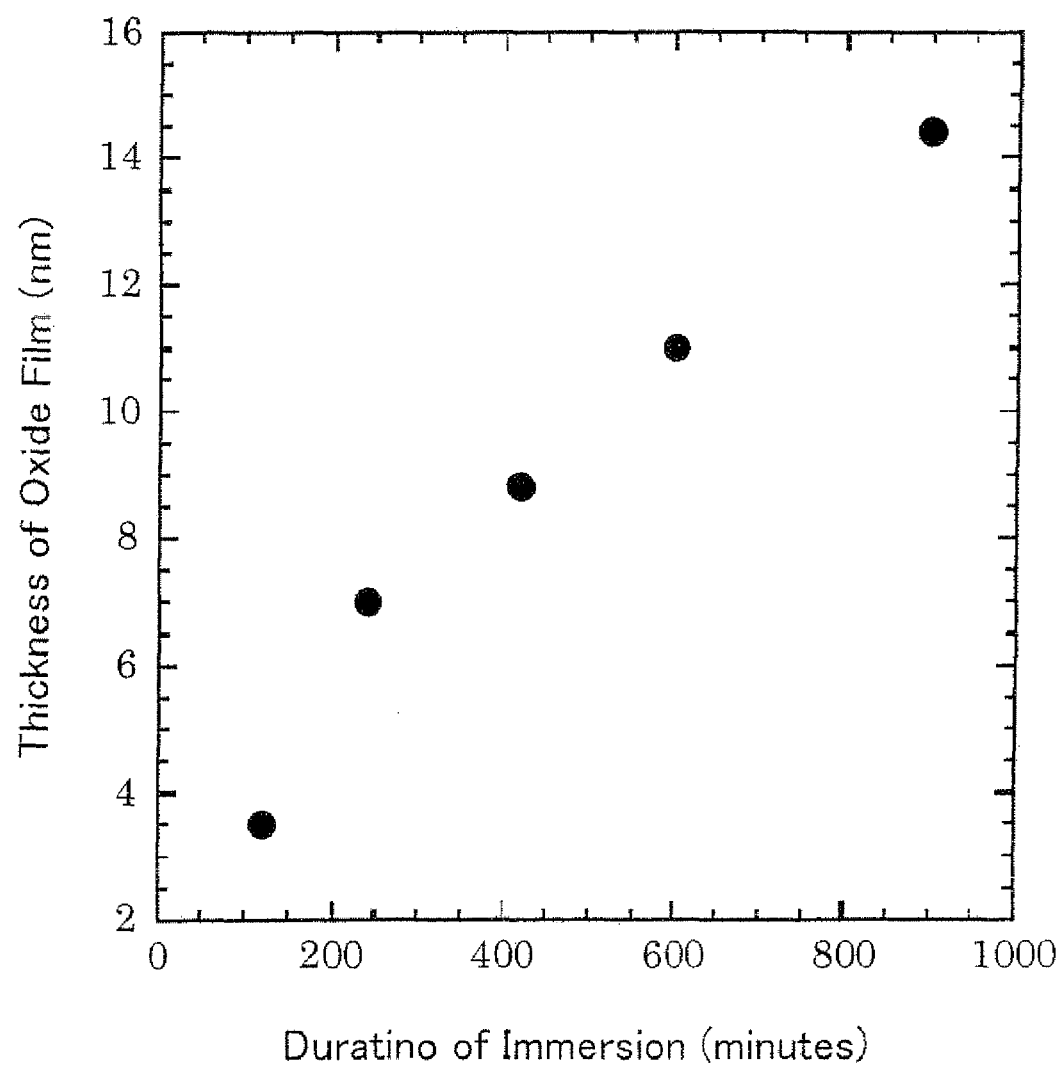
FIG. 28 is a representation of the growth in film thickness vs. time property of a $SiO_2$ film.

FIG. 28 is relationship between the duration of immersion in azeotropic nitric acid and the thickness of the $SiO_2$ film 116. The first chemical oxide film was formed by immersing the silicon substrate 111 in a 40% (wt.) aqueous solution of nitric acid with no voltage being applied, to form the porous $SiO_2$ film (first chemical oxide film) of a relatively low atomic density ($2.22\times10^{22}$ atom/cm$^3$) up to a thickness of 1.1 nm. Subsequently, the second chemical oxide film was formed by immersing the substrate 111 in an azeotropic aqueous solution of nitric acid (boiling point 120.7° C.; concentration 68% (wt.)) to form the $SiO_2$ film 116. The thickness of the $SiO_2$ film 116 increased substantially linearly with the immersion duration. The figure also shows that the $SiO_2$ film 116 could be formed up to a thickness of 10 nm beyond.

In addition, besides 2-stage change from low concentration to high concentration, the 2-stage nitric acid oxidation process mentioned above may be implemented in the following manner without departing from the scope of the present invention. The concentration may be increased gradually from low to high in many stages. The concentration may be increased continuously from low to high. For example, the substrate 111 may be immersed in a 40% (wt.) aqueous solution of nitric acid and heated so that it keeps boiling until it becomes an 68% (wt.), azeotropic aqueous solution of nitric acid (boiling point 120.7° C.). That is, the oxidation of the present embodiment may be continuous oxidation or non-continuous oxidation as in embodiment 1.

Embodiment 3

The following will describe a third embodiment in accordance with the present invention. To form TFTs from polycrystalline silicon on a substrate, a layered silicon dioxide ($SiO_2$) film is used as the gate insulating film. Accordingly, here, an example (example 2) fabricated similarly to that will be explained. The example is a MOS capacitor (its capacitive insulating film) based on a silicon dioxide film formed on polycrystalline silicon on a substrate (the silicon substrate 111 is a polycrystalline silicon substrate).

In a case like this, it is appropriate to form a silicon dioxide ($SiO_2$) film on the surface of the polycrystalline silicon on the substrate by a 2-stage nitric acid oxidation process.

Similarly (FIG. 22(a) to FIG. 22(f)) to the foregoing embodiment 2 (example 1), first, the first chemical oxide film was formed by immersing (brought into contact) the polycrystalline silicon layer on the substrate in a 40% (wt.) aqueous solution of nitric acid with no voltage being applied to form a $SiO_2$ film (chemical oxide film) up to a thickness of 1.1 nm (FIG. 22(c)).

Subsequently, the second chemical oxide film was formed by immersing (brought into contact) the polycrystalline silicon layer on the substrate carrying the first chemical oxide film ($SiO_2$ film) in a boiling azeotropic aqueous solution of nitric acid (boiling point 120.7° C.; concentration 68% (wt.)) with no voltage being applied, to form the second, thick chemical oxide film ($SiO_2$). Thus, the $SiO_2$ film 116 (chemical oxide film) was uniformly formed with a combined thickness of about 25 nm. See FIG. 22(d).

In a case like this, again similarly to embodiment 1 (example 1), the pores in the $SiO_2$ film (first chemical oxide film) formed in the first, 40% (wt.) aqueous solution of nitric acid provided sites where the nitric acid would decompose throughout the oxidation processes in which the first and second chemical oxide films are formed. That is, the porous $SiO_2$ film (first chemical oxide film) of relatively low atomic density (about $2.22\times10^{22}$ atom/cm$^3$) acted as a catalyst to promote the oxidation of the nitric acid forming the second chemical oxide film. The second, thicker chemical oxide film ($SiO_2$ film) with a little higher density than the first chemical oxide film was formed. The atomic density of the second chemical oxide film was about $2.34\times10^{22}$ atom/cm$^3$.

Subsequently, the metal film (Al electrode layer) 117 was formed on the silicon dioxide film (chemically oxidized $SiO_2$ film). The Al electrode layer 17 was formed by depositing aluminum containing 1% (wt.) silicon up to a thickness of about 200 nm by a well-known resistance heating vapor deposition. See FIG. 22(e). Instead of depositing the Al electrode layer, a polycrystalline silicon (polysilicon) electrode material may be deposited.

Thereafter, the Al electrode layer was patterned to a desired shape to form Al electrodes, and the MOS capacitor was completed. See FIG. 22(f).

The MOS capacitor obtained in the present embodiment had excellent and highly stable properties similarly to embodiment 1 (example 1) above.

The oxidizing solution was an aqueous solution of nitric acid as an example. This may be replaced by at least one aqueous solution selected from the group consisting of an aqueous solution of perchloric acid which is a mixtures of perchloric acid and water, an aqueous solution of sulfuric acid which is a mixtures of sulfuric acid and water, aqua regia, and mixed solutions of these liquids (including azeotropic mixtures).

In the present embodiment, a composite film may be used which is the silicon dioxide film 116 (chemical oxide film; $SiO_2$ film) which is nitrided partially (up to 0.3 to 0.5 nm).

The present embodiment has described a MOS capacitor as an example. The embodiment is also applicable to a gate insulating film in a thin film transistor (TFT). The laminated silicon dioxide film or the laminated silicon dioxide film containing a silicon nitride-containing film provides a high performance insulating film with low interface energy levels. The film can be used, for example, in large scale integrated circuits (LSIs) and charge coupling devices (CCDs). The film is also applicable to an interlayer insulating film, in multilayer wiring structures, in which wires are made of polycrystalline silicon electrode material, etc., and to a capacitive insulating film in flash memories and other memories. The film is expected to find sufficient utilities in these particular fields.

The present embodiment has described the manufacture of a MOS capacitor using a polycrystalline silicon substrate as the silicon substrate 111 as an example. The steps explained there are of course applicable to monocrystal silicon substrates. They are also applicable to the thin film transistors (TFT) based on polycrystalline (inclusive of fine crystal) silicon or amorphous silicon on a glass or PET substrate. Especially, in the present embodiment, chemical oxide films can be formed at temperatures as low as 200° C. or even lower. The steps are therefore suited for use in the TFT formation in the manufacture of a flexible liquid crystal display.

The steps are applicable not only to MOS capacitor manufacture, but also to gate insulating films and interlayer insulating films in MOS transistors, large scale integrated circuits (LSIs), charge coupling devices (CCDs), etc. which contain, as a gate insulating film, any one of the silicon dioxide film formed in the present embodiment, the laminated silicon dioxide film containing a $SiO_2$ film formed by CVD on the silicon dioxide film, or the multilayer film consisting of the laminated silicon dioxide film and a silicon nitride-containing film provided in the middle of the silicon nitride-containing film.

In the present embodiment, it is also possible, in addition to the formation of the silicon dioxide film 15, to form a silicon nitride-containing film on the surface of the silicon dioxide film 116 by a silicon nitride-containing film formation process on the surface or nitriding in nitrogen plasma. It is also possible to form a thick insulating film of, for example, $SiO_2$ by CVD, etc. on the silicon dioxide film 116 or the silicon nitride-containing film.

The present embodiment has described the manufacture of the MOS capacitor using the silicon substrate 111 made of polycrystalline silicon as the process-target substrate as an example. The steps explained there are of course applicable to monocrystal silicon substrates. They are also sufficiently applicable to the thin film transistors (TFTs) based on polycrystalline (inclusive of fine crystal) silicon, amorphous silicon, silicon carbide, or silicon germanium on a glass or PET substrate.

the present invention are by no means limited to the aforementioned embodiments. Various alterations are possible without departing from the scope of the claims. Technological means disclosed in different embodiments may be used together in a suitable combination as further embodiments, again without departing from the technical scope of the present invention. For example, the oxidation in embodiments 2, 3 may be either continuous oxidation or non-continuous oxidation as in embodiment 1.

The embodiments and examples described in Best Mode for Carrying Out the Invention are for illustrative purposes only and by no means limit the scope of the present invention. Variations are not to be regarded as a departure from the spirit and scope of the invention, and all such modifications as would be obvious to one skilled in the art are intended to be included within the scope of the claims below.

INDUSTRIAL APPLICABILITY

The method of manufacturing a thin film transistor in accordance with the present invention, as described in the foregoing, involves the oxide film forming step of immersing a substrate having a surface on which a chemical oxide film should be formed in an oxidizing solution containing an active oxidizing species, to form a chemical oxide film through direct oxidation of the substrate. Therefore, a thick, uniform chemical oxide film across all the regions in which a chemical oxide film should be formed. Therefore, thin film transistors can be manufactured which include a high reliability, high quality chemical oxide film.

Therefore, according to the present invention, for example, thin film transistors which include a high quality chemical oxide film, such as a gate oxide film, can be manufactured at temperatures as low as 200° C. or even lower. Thus, the invention is applicable to flexible liquid crystal displays and ICs containing a flexible substrate (for example, plastic; polyethylene terephthalate (PET)) which in turn contains a PET or other low-melting-point substrate. The invention can find a wide range of applications in the electrical device field.

In addition, according to the present invention, a high quality chemical oxide film can be formed on a desired thick coating film at low temperature. Further, semiconductor devices containing such a chemical oxide film can be manufactured. The invention can hence find a wide range of applications in the electrical devices field.

The invention claimed is:

1. A method of forming an oxide film, comprising the steps of:
   bringing a semiconductor in contact with an oxidizing solution below azeotropic concentration or a gas thereof to form a first, porous chemical oxide film on a surface of the semiconductor; and
   bringing the first, porous chemical oxide film on the surface of the semiconductor in contact with an oxidizing solution of or in excess of azeotropic concentration or a gas thereof to form a second chemical oxide film.

2. A method of forming an oxide film, comprising the steps of:
   reacting an oxidizing solution of a low concentration or a gas thereof with a surface of a semiconductor to form a first, porous chemical oxide film on the surface of the semiconductor; and
   reacting the first, porous chemical oxide film with an oxidizing solution of a high concentration or a gas thereof to form a second chemical oxide film on the first, porous chemical oxide film.

3. The method of claim 1, wherein
   the step of forming the second chemical oxide film is carried out while the oxidizing solution used to form the first chemical oxide film is being concentrated.

4. The method of claim 1, wherein
   the second chemical oxide film is formed so that the second chemical oxide film is thicker than the first chemical oxide film.

5. The method of claim 1, wherein
the step of forming the first chemical oxide film and the step of forming the second chemical oxide film are carried out with the semiconductor being immersed in the oxidizing solution.

6. The method of claim 1, wherein
the semiconductor contains at least one component selected from the group consisting of monocrystal silicon, polycrystalline silicon, amorphous silicon, silicon carbide, and silicon germanium.

7. The method of claim 2, wherein
the oxidizing solution of a high concentration or a gas thereof is an oxidizing solution of or in excess of azeotropic concentration or a gas thereof.

8. The method of claim 1, wherein
the oxidizing solution or the gas thereof contains: at least one solution selected from the group consisting of nitric acid, perchloric acid, sulfuric acid, ozone-dissolving water, aqueous hydrogen peroxide, a mixed solution of hydrochloric acid and aqueous hydrogen peroxide, a mixed solution of sulfuric acid and aqueous hydrogen peroxide, a mixed solution of aqueous ammonia and aqueous hydrogen peroxide, a mixed solution of sulfuric acid and nitric acid, aqua regia, and boiling water; a gas thereof; or a mixture thereof.

9. The method of claim 2, wherein:
the oxidizing solution of a low concentration or the gas thereof contains: at least one solution below azeotropic concentration selected from the group consisting of an aqueous solution of nitric acid, an aqueous solution of sulfuric acid, and an aqueous solution of perchloric acid; or a gas thereof; and
the oxidizing solution of a high concentration or the gas thereof contains: at least one solution of or in excess of azeotropic concentration selected from the group consisting of an aqueous solution of nitric acid, an aqueous solution of sulfuric acid, and an aqueous solution of perchloric acid; or a gas thereof.

10. The method of claim 1, further comprising, after forming the chemical oxide films on the surface of the semiconductor, the step of subjecting the chemical oxide films to nitriding.

11. A method of manufacturing a semiconductor device, comprising the oxide film forming step of
forming a chemical oxide film by the method of claim 1.

12. A method of manufacturing a semiconductor device, comprising the steps of:
reacting an oxidizing solution of a low concentration or a gas thereof with a surface of a semiconductor to form a first, porous chemical oxide film on the surface of the semiconductor; and
reacting the first, porous chemical oxide film with an oxidizing solution of a high concentration or a gas thereof to form a second chemical oxide film on the first, porous chemical oxide film.

* * * * *